(12) United States Patent
Barraud et al.

(10) Patent No.: US 11,532,670 B2
(45) Date of Patent: Dec. 20, 2022

(54) 3D MEMORY AND MANUFACTURING PROCESS

(71) Applicant: COMMISSARIAT A L'ENERGIE ATOMIQUE ET AUX ENERGIES ALTERNATIVES, Paris (FR)

(72) Inventors: Sylvain Barraud, Grenoble (FR); François Andrieu, Grenoble (FR)

(73) Assignee: COMMISSARIAT A LENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 80 days.

(21) Appl. No.: 17/130,006

(22) Filed: Dec. 22, 2020

(65) Prior Publication Data
US 2021/0193738 A1    Jun. 24, 2021

(30) Foreign Application Priority Data
Dec. 23, 2019    (FR) ...................................... 19 15473

(51) Int. Cl.
| | | |
|---|---|---|
| H01L 27/24 | (2006.01) | |
| G11C 5/06 | (2006.01) | |
| G11C 13/00 | (2006.01) | |
| H01L 21/822 | (2006.01) | |
| H01L 45/00 | (2006.01) | |

(52) U.S. Cl.
CPC ............ *H01L 27/2481* (2013.01); *G11C 5/06* (2013.01); *G11C 13/0007* (2013.01); *H01L 21/8221* (2013.01); *H01L 27/2436* (2013.01); *H01L 45/122* (2013.01); *H01L 45/145* (2013.01)

(58) Field of Classification Search
CPC ............ H01L 27/2481; H01L 21/8221; H01L 27/2436; H01L 45/122; H01L 45/145; H01L 29/0673; H01L 29/42392; H01L 29/66439; H01L 29/66545; H01L 29/78696; H01L 45/04; H01L 45/1226;
(Continued)

(56) References Cited

U.S. PATENT DOCUMENTS

| | | |
|---|---|---|
| 8,026,521 B1 | 9/2011 | Or-Bach et al. |
| 2009/0218558 A1 | 9/2009 | Park et al. |

(Continued)

OTHER PUBLICATIONS

French Preliminary Search Report dated Nov. 2, 2020 in French Application 19 15473 filed on Dec. 23, 2019 (with English Translation of Categories of Cited Documents & Written Opinion), citing documents AA-AF therein, 9 pages.

*Primary Examiner* — Allison Bernstein
(74) *Attorney, Agent, or Firm* — Oblon, McClelland, Maier & Neustadt, L.L.P.

(57) ABSTRACT

The invention provides a microelectronic device comprising at least two memory cells each comprising a so-called selection transistor and a memory element associated with said selection transistor, each transistor comprising a channel in the form of a wire extending in a first direction (x), a gate bordering said channel, a source extending in a second direction (y), and a drain connected to the memory element, said transistors being stacked in a third direction (z) and each occupying a given altitude level in the third direction (z), the microelectronic device wherein the source and the drain are entirely covered by spacers projecting in the third direction (z) in a plane (xy). The invention also provides a method for manufacturing such a device.

15 Claims, 47 Drawing Sheets

(58) Field of Classification Search
CPC ....... H01L 45/146; H01L 27/249; G11C 5/06; G11C 13/0007
See application file for complete search history.

(56) References Cited

U.S. PATENT DOCUMENTS

| | | |
|---|---|---|
| 2012/0086067 A1 | 4/2012 | Sekar et al. |
| 2012/0088355 A1 | 4/2012 | Sekar et al. |
| 2013/0070506 A1 | 3/2013 | Kajigaya |
| 2013/0153851 A1 | 6/2013 | Park |
| 2014/0054538 A1 | 2/2014 | Park |
| 2015/0123072 A1 | 5/2015 | Sekar et al. |
| 2017/0092541 A1 | 3/2017 | Or-Bach et al. |
| 2017/0271402 A1 | 9/2017 | Chen et al. |
| 2021/0296398 A1* | 9/2021 | Barraud .............. H01L 29/0673 |

* cited by examiner

Coupe EE'

3D MEMORY AND MANUFACTURING PROCESS

Cross-Reference to Related Application

The present application claims priority to French Patent Application No. 19 15473, filed on Dec. 23, 2019, the entire content of the foregoing is incorporated herein by reference.

TECHNICAL FIELD

The present invention relates to the field of microelectronics and memories and in particular the field of non-volatile resistive memories RRAMs or ReRAMs (standing for "resistive random-access memories").

PRIOR ART

RAM memories typically comprise a matrix of memory cells each capable of storing binary information (a bit), and an addressing system for reading or modifying each information bit of each memory cell.

Each memory cell thus comprises a switching element for changing from the value 0 to the value 1 of the bit. This switching element, also referred to as a memory element, is generally placed between two electrodes respectively connected to a data line known as a "bitline" and a command line known as a "wordline" of the addressing system. A selection transistor, controlled by the wordline and connected to a source line known as a "sourceline" of the addressing system, can also be added to the memory cell so as to optimise the switching of the memory element.

RRAM resistive memories have the common operating principle that the changes in state thereof are due to changes in resistivity of the memory element. FIG. 1 illustrates an example of an RRAM memory cell of the OxRAM type wherein the memory element is a dielectric oxide, normally insulating, which can be made conductive by creating filaments or a conduction path in this material after applying a sufficient voltage or current.

To increase the storage capacity of the memories while limiting the physical size thereof, one solution consists of increasing the density of memory cells in the memory. For this purpose, devices wherein memory cells are distributed over a plurality of superimposed levels have appeared.

The document US 2017/0092541 A1 describes for example a monolithic 3D resistive-memory architecture comprising memory cells stacked and insulated from one another. This architecture is produced from a multilayer silicon/silicon oxide Si/SiO$_2$ stack. This stack is structured and a gate is deposited so as to form transistors. The memory elements are formed on the drains of the transistors, and the various wordline, sourceline and bitline connection lines are respectively created at the gates and sources of the transistors, and memory elements.

The method for manufacturing this monolithic 3D architecture is however expensive and complex. The increase in density of memory cells in this architecture remains limited. The intensity of the electric current circulating in the transistors is furthermore relatively low. The electrostatic control of the selection transistors is not optimised.

The present invention aims to at least partly overcome the drawbacks mentioned above.

In particular, one object of the present invention is a 3D architecture of a microelectronic device having improved integration density.

Another object of the present invention is a 3D architecture of a microelectronic device configured to improve the electrostatic control of the transistors.

Another object of the present invention is a method for manufacturing such a 3D architecture of a microelectronic device, reducing the manufacturing cost.

SUMMARY

To achieve these objectives, the present invention proposes, according to a first aspect, a microelectronic device comprising at least two memory cells each comprising a so-called selection transistor and a memory element associated with said selection transistor, each transistor comprising a channel in the form of a wire extending longitudinally in a first direction x, a gate bordering said channel and extending mainly in a second direction y, a first region corresponding to one from a source or a drain, and a second region corresponding to the other one from the source or the drain, the second region being connected to the memory element, said transistors being stacked in a third direction z and each occupying a given altitude level $n_z$ ($z=1 \ldots 4$) in the third direction z.

According to an advantageous and optional example, for each transistor the first and second regions are preferably entirely covered by spacers projecting in the third direction z in a plane xy. Such spacers completely covering, at least in the direction z, the first and second regions, for example respectively the source and the drain, making it possible to reduce the physical size of the transistor in the first direction. Consequently the integration density of a 3D architecture comprising such microelectronic devices is increased. Such 3D architecture may in particular comprise, on each level, a plurality of transistors in the first and second directions, and a plurality of levels in the third direction.

According to one embodiment, which may be alternative to or combined with the features of the embodiment in the previous paragraph, for at least one selection transistor, the gate completely surrounds the channel. Such a gate completely surrounding the channel, also referred to as a GAA (the acronym for "gate all around"), improves the electrostatic control of said transistor. In particular, the intensity of the drain-source current can be increased while keeping good control of the on or off state of the transistor. This thus makes it possible to provide an effective solution faced with the problem consisting of improving the performance of the microelectronic devices comprising a plurality of memory cells. It should be noted that it is possible to exploit the features of the present paragraph independently of the features of the previous paragraph.

According to a second aspect, the invention also relates to a microelectronic system comprising a plurality of microelectronic devices according to the first aspect of the invention. These microelectronic devices are connected together so that the transistors of two adjacent microelectronic devices have a first region, for example a source, common for the same level and are associated with two distinct memory elements, so as to form a matrix of memory cells. Such a system is advantageously compact and compatible with a dense 3D integration.

According to a third aspect, the invention also relates to a method for manufacturing a microelectronic device comprising at least two memory cells each comprising a so-called selection transistor and a memory element associated with said selection transistor, each transistor comprising a channel in the form of a wire extending longitudinally in a first direction x, a gate bordering said channel and extending mainly in a second direction y, a first region corresponding to one from a source or a drain and a second region corresponding to the other one from the source or the drain connected to the memory element, said transistors being stacked mainly in a third direction z and each occupying a given altitude level $n_z$ (z=1 ... 4) for example in the third direction z.

The method comprises the following steps:
forming a stack, in the third direction (z), of alternating layers of a first semiconductor material and a second dielectric material,
forming, from this stack, openings defining transistor patterns each comprising a central part extending mainly in the first direction (x) and first and second peripheral parts, extending on either side of the central part, said central part being intended to form the channel of the transistor and said first and second peripheral parts being intended to form respectively first and second regions of the transistor,
forming gate patterns partly in the openings, straddling the central parts of the transistor patterns and extending mainly in a second direction (y) at the border of the first peripheral parts,
forming longitudinal spacers on either side of the gate patterns, said longitudinal spacers covering the first and second peripheral parts of the transistor patterns projecting in the third direction (z) in a plane (xy),
forming the memory elements so that each memory element has an edge in alignment in the third direction (z) with an edge of a longitudinal spacer. For example, each memory element has a flank in contact with a flank of a spacer. These flanks extend mainly or partly at least in the plane yz. The memory elements are thus typically formed at the border of the longitudinal spacers, at the second peripheral parts.
forming the gates of the transistors from the gate patterns.

Unlike the method disclosed by the document US 2017/0092541 A1, the use of longitudinal spacers covering the first and second peripheral parts (subsequently forming the first and second regions of the transistors) makes it possible to precisely control the distance between the memory element and the gate of the selection transistor that is associated therewith. This improves the reproducibility of the definition of the memory elements. This furthermore improves the compactness of the memory cell. The memory cells are thus formed as close as possible to the gates, separated therefrom in the first direction x solely by the longitudinal spacers. This makes it possible to make the 3D matrix of memory cells thus formed more dense.

This method therefore makes it possible to obtain a 3D matrix of memory cells having high integration density.

According to one possibility, forming the stack comprises the following steps:
forming a temporary stack by epitaxy in the third direction comprising at least two semiconductor layers of the first semiconductor material separated by at least one sacrificial layer made from a second semiconductor material,
after forming the gate patterns and preferably after forming the longitudinal spacers around the gates, removing the at least one sacrificial layer as from the openings,
filling with the second dielectric material a space left by removing the at least one sacrificial layer, so as to form at least one dielectric layer.

The transistors based on the first material are consequently not insulated from each other from the very start of the method. They are insulated subsequently, at the time of the removal of the second layer carried out for example via selective etching.

On the other hand, in the document US 2017/0092541 A1, the stack of insulated transistors is directly formed by transferring semiconductor layers onto insulating layers, in alternation. Such a transfer method is expensive and complex.

In the present invention, the second material may be semiconductive. It may advantageously serve as a germination layer for the epitaxy of the first material. Thus the various layers may be formed by epitaxial growth of the first and second materials, without transfer of layers.

The formation of such a stack of layers of the first and second materials, followed by a removal of the second material and filling by a dielectric material aimed at replacing the second material, therefore ultimately makes it possible to obtain a stack of semiconductive and insulating layers at reduced cost. This furthermore makes it possible to preserve the crystalline structure, for example the monocrystalline character, of the semiconductive layers of the first material.

BRIEF DESCRIPTION OF THE FIGURES

The aims, objects, features and advantages of the invention will be clearer from the detailed description of embodiments thereof that are illustrated by the following accompanying drawings, wherein.

Figure 1:
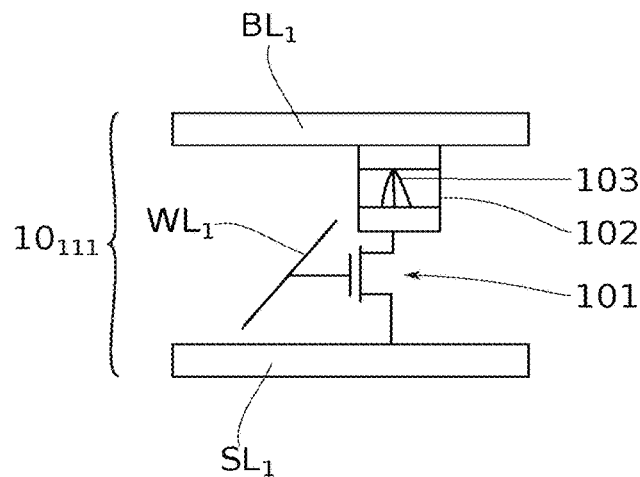
FIG. 1 illustrates schematically a resistive memory cell of the OxRAM type.

The drawings are given by way of examples and are not limitative of the invention. They constitute schematically outline representations intended to facilitate understanding of the invention and are not necessarily to the scale of practical applications. In particular, the dimensions of the various structures (layers, patterns) or zones do not represent reality.

DETAILED DESCRIPTION

Before beginning a detailed review of embodiments of the invention, it is stated that, optionally, the invention comprises at least any one of the following optional features that can be used in association or alternatively.

According to one example, the first and second regions are solely covered by spacers projecting in the third direction z in a plane xy.

According to one example, the gate completely surrounds the channel of at least one selection transistor. This enclosing gate makes it possible to obtain a so-called "gate all around" selection transistor architecture. Such a transistor has improved electrostatic control.

According to one example, for each transistor, optionally apart from the transistor the channel of which is situated at the lowest altitude level $n_1$ in the third direction z, the gate completely surrounds the channel.

According to one example, the memory device comprises at least three and preferably at least four transistors stacked in the third direction z. This makes it possible to further increase the density of the memory device.

According to one example, said spacers are situated in line with, that is to say vertically above, the first and second regions in the third direction z.

According to one example, the memory element has variable resistivity, so as to form resistive memory cells, for example of the OxRAM type.

According to one example, the gates of the transistors are electrically connected to each other and the first regions of the transistors are electrically insulated from each other. First independent regions corresponding to the sources of the transistors make it possible to power the transistors independently. This makes it possible for example to perform read or write operations on each level independently.

According to one example, the gates of the transistors are electrically connected to each other in a wordline zone of the microelectronic system.

According to one example of the microelectronic system, the first regions of the transistors of two different levels are electrically insulated from each other.

According to one example, the microelectronic system comprises at least three and preferably at least six memory devices disposed parallel in the first direction x.

According to one example, the first regions, typically the sources, occupying various levels are connected in a ladder, independently of each other, in a source-line zone. This makes it possible to power the transistors and/or the memory points independently on each level of the matrix of memory cells.

According to one example, the method further comprises ladder etchings in a source-line zone, so as to reach the first regions, typically the sources, of the various levels. According to one example, the method further comprises the formation of ladder contacts on the first regions of the various levels.

According to one example, the first semiconductor material is silicon and the second semiconductor material is a silicon-germanium alloy.

According to one example, forming the gates comprises the following steps:
  Removing the gate patterns, also referred to as sacrificial gates, so as to fully leave clear the channels formed in the central parts of the transistor patterns,
  Depositing a gate dielectric material and then a gate metal material around said channels so as to form so-called all-around gates completely surrounding at least one channel among said channels.

According to one example, the at least one dielectric layer comprises remaining portions of the at least one sacrificial layer at the central parts of the transistors between the channels of the transistors and these remaining portions are removed after the gate patterns are removed and before the gates are formed.

According to one example, the formation of the memory elements at the second regions is guided by transverse spacers extending mainly in a plane normal to the main extension direction of the longitudinal spacers. This makes it possible to form memory points "autoaligned" with the second regions, typically the drains of the transistors. The lithography stresses are thus released.

According to one example, the method comprises the following steps:
Forming, on a substrate extending in first and second directions, a stack in a third direction comprising at least two layers made from a first semiconductor material separated by at least one sacrificial layer made from a second semiconductor material, each layer made from a first semiconductor material defining a given altitude level in the third direction,
Forming transistor patterns by anisotropic etching in the third direction of zones of the stack, said patterns comprising at least two transistors stacked in the third direction z, each of these transistors being based on the first material and comprising a channel in the form of a wire extending in the first direction x, a source extending in the second direction y, and a drain,
Filling said zones with a sacrificial gate material,
Forming sacrificial gates by anisotropic etching in the third direction of only part of said sacrificial gate material, said sacrificial gates extending over a first side of the sources of the transistors, straddling the channels of the transistors,
Forming longitudinal spacers on either side of the sacrificial gates, said longitudinal spacers extending mainly in the second direction y and being intended to cover the sources and the drains of the transistors projecting in the third direction z in a plane xy,
Forming first and second openings on either side of said longitudinal spacers and vertically in line with the longitudinal spacers in the third direction z, the first openings exposing the transistor drains and the second openings exposing a second side of the sources,
Partially etching the at least one sacrificial layer selectively with respect to the layers made from a first semiconductor material, as from said first and second openings,
Filling with a dielectric material a space left by the partial etching of the at least one sacrificial layer, so as to insulate the sources from each other and the drains from each other,
Removing the sacrificial gates so as to expose the first side of the sources and the channels of the transistors,
Etching the at least one sacrificial layer selectively with respect to the layers made from a first semiconductor material, as from the locations of removed sacrificial gates, so as to leave clear the channels of the transistors,
Depositing a dielectric gate material and then a metal gate material around the channels of the transistors, so as to form gates encasing the channels of the transistors,
Forming the memory elements at the drains of the transistors.

Unless specifically indicated to the contrary, technical features described in detail for a given embodiment can be combined with the technical features described in the context of other embodiments described by way of example and non-limitatively. In particular, the number of levels of the stack may be greater than 4, or even greater than 10. The number and/or the form of the openings in the stack and the transistor patterns illustrated in the figures may vary and be combined so as to form another embodiment that is not necessarily illustrated or described. Such an embodiment is obviously not excluded from the invention.

Moreover, unless there is incompatibility, it should be understood that the device, the microelectronic system and the manufacturing method may comprise, mutatis mutandis, all the optional features presented in the present application.

The present invention finds, as its preferential field of application, the 3D integration of microelectronic systems performing logic and memory functions.

The present invention makes provision in particular for producing a 3D architecture comprising a high density of nanowires superimposed on various levels. This 3D architecture is in particular configured to electrically connect each nanowire independently. Each nanowire is preferably surrounded by an all-around gate so as to obtain a GAA transistor. This gate is extended on the source side of the transistors and is bordered by longitudinal spacers. These spacers cover the sources and the drains of the various transistors.

It is stated that, in the context of the present invention, the term "on", "surmounts", "covers" or "underlying" or the equivalents thereof do not mean "in contact with". Thus, for example, the presence of a spacer or of a layer on or which covers a structural element does not necessarily mean that the spacer or the layer is directly in contact with the structural element but means that the spacer or the layer at least partially covers the structural element while being either directly in contact therewith being separated therefrom by at least one other layer or channel or any other element.

Structural element means a layer "based on" a material A, a structural element, a layer comprising this material solely or this material A and optionally other materials, for example doping elements or alloy elements. Thus a spacer based on silicon nitride SiN may for example comprise non-stoichiometric silicon nitride (SiN), or stoichiometric silicon nitride ($Si_3N_4$), or silicon oxynitride (SiON).

The word "dielectric" qualifies a material the electrical conductivity of which is sufficiently low in the given application to serve as an insulator. In the present invention, a dielectric material preferably has a dielectric constant of less than 7.

The term "step" does not necessarily mean that the actions performed during a step are simultaneous or immediately successive. Some actions in a first step may in particular be followed by actions related to a different step, and other actions of the first step may then be repeated. Thus the term step does not necessarily mean actions that are unitary and inseparable in time and in the concatenation of the phases of the method.

In the present patent application, thickness will preferentially be spoken of for a layer, height for a device (transistor or gate for example) and depth for a cavity or an etching. The thickness is taken in a direction normal to the main extension plane of the layer, the height and the depth are taken in a direction normal to the base plane of the substrate.

Unless indicated to the contrary, in the figures, the height and the depth are taken along the z axis of the orthonormal reference frame xyz.

An element situated in line with or vertically above another element means that these two elements are both situated on the same line normal to the base plane of the substrate, i.e. on the same line oriented vertically along z in the figures.

An element "bordering" another element means that this element partially or completely surrounds the other element. Unless explicitly mentioned, this term means a partial overlap.

The terms "substantially", "approximately", "of" the order of mean "to within 10%" or, when it is the case of an angular orientation, "to within 10°" and preferably "to within 5°". Thus a direction substantially normal to a plane means a direction having an angle of 90°±10° with respect to the plane.

In order to determine the geometry and the arrangement of the various elements constituting a device (such as a transistor or a memory cell) or a microelectronic system (such as a resistive memory of the OxRAM type), electron microscopy analyses may be carried out, in particular scanning electron microscopy (SEM) or transmission electron microscopy (TEM).

The chemical compositions of the various elements or layer can be determined by means of the well-known method EDX or X-EDS, the acronym for "energy dispersive X-ray spectroscopy".

This method is well suited for analysing the composition of layers or elements of small dimensions. It may be implemented on metallurgical sections in SEM or TEM.

These techniques make it possible in particular to determine whether the characteristics of transistors or memory cells formed in a 3D architecture correspond to those of the devices or systems described in the context of the present invention.

These techniques also make it possible to follow the various steps performed by a method for manufacturing transistors or memory cells in 3D integration, for example through analyses on samples of devices during manufacture. The use of sacrificial layers and sacrificial gates may in particular be an indication of implementation of the method according to the invention.

The invention will now be described through two sample embodiments of a resistive memory of the OxRAM type. These two examples are organised in two sections respectively called "example 1" and "example 2". The steps of manufacturing a memory according to these examples are subdivided into subsections respectively called "formation of the sacrificial gates", "insulation of the sources", "structuring of the sourcelines zone", "structuring of the wordlines zone", "structuring of the bitlines zone", "and formation of the contacts". These subsections are defined for reasons of clarity and are not necessarily strictly successive.

Figure 2:
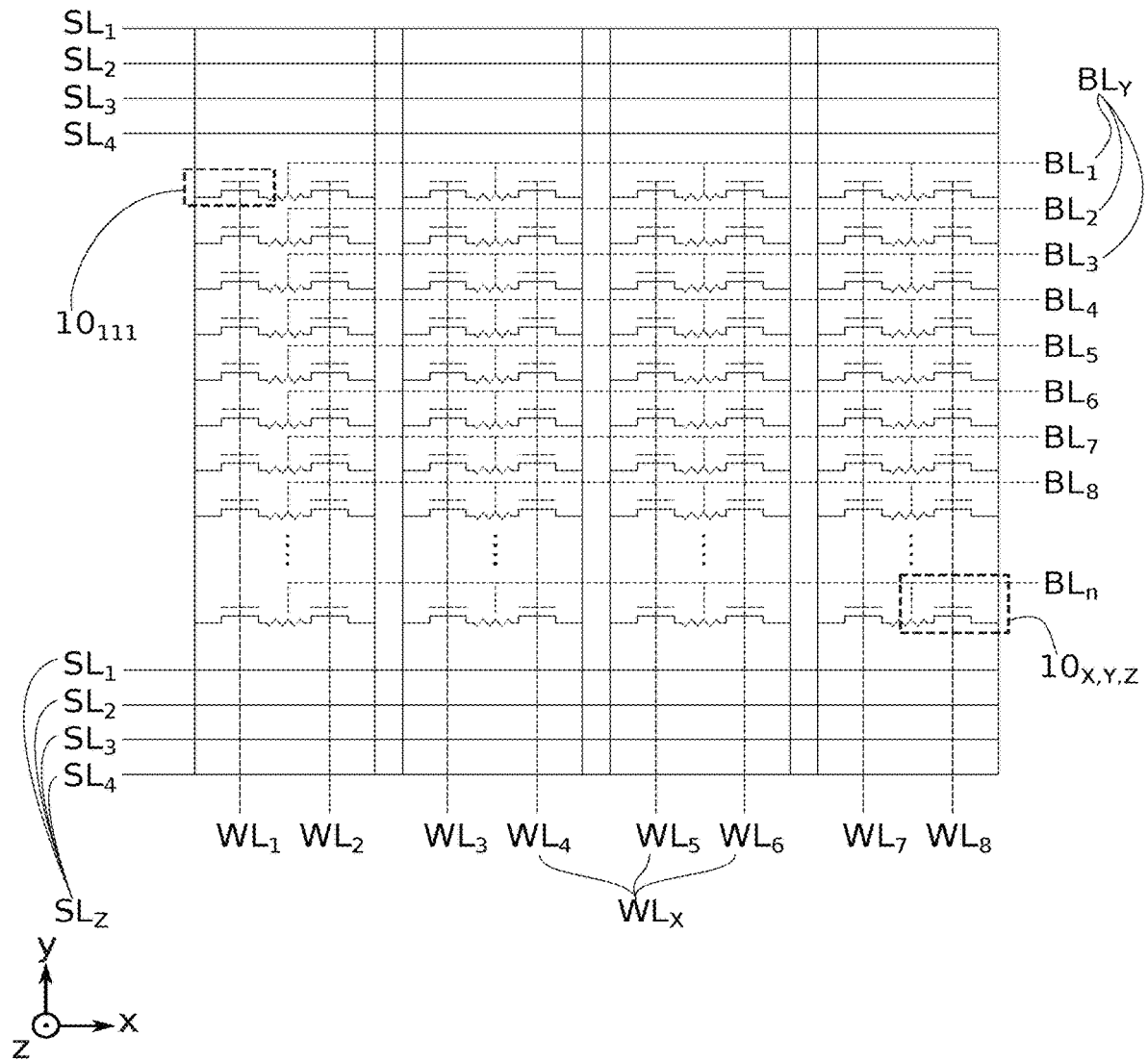
FIG. 2 presents a design diagram of a matrix of memory cells according to one embodiment of the present invention.

FIG. 2 presents a functional diagram of such an OxRAM resistive memory, formed from a plurality of memory cells $10_{x,y,z}$ each comprising a resistive element and a transistor. These memory cells $10_{x,y,z}$ are also referred to as 1T1R cells. In practice, a memory cell may include four memory points and four selection transistors.

The memory cells $10_{x,y,z}$ are typically organised in a matrix on various integration levels. An integration level is situated at a given altitude z along the axis Z. The memory cells $10_{x,y,z}$ are thus located by their coordinates x and y for a given level Z.

In order to address each memory cell $10_{x,y,z}$ of this 3D matrix independently, connection lines are drawn. Each memory cell $10_{x,y,z}$ is thus connected to a supply or writing line referred to as sourceline $SL_Z$, a command or wordline referred to as wordline $WL_X$, and a reading or data line referred to as bitline $BL_Y$.

In these examples, the sourcelines are carried by the levels z, the wordlines extend along Y and the bitlines extend along X. For each memory cell, the resistive element is connected to a bitline $BL_Y$, the source of the transistor is connected to a sourceline $SL_Z$, and the gate of the transistor is connected to a wordline $WL_X$. The wordlines $WL_1$, $WL_2$, $WL_3$, $WL_4$, $WL_5$, $WL_6$, $WL_7$, $WL_8$ are for example 8 in number (x=[1 . . . 8]), so as to encode information in 8 bits. The levels carrying the sourcelines $SL_1$, $SL_2$, $SL_3$, $SL_4$ are for example 4 in number (z=[1 . . . 4]) and hereinafter called $N_1$, $N_2$, $N_3$, $N_4$ or, by contraction, levels $SL_1$, $SL_2$, $SL_3$, $SL_4$. The bitlines $BL_1$, $BL_2$, $BL_3$, $BL_4$, $BL_5$, $BL_6$, $BL_7$, $BL_8$ are for example 8 in number (y=[1 . . . 8]), or more (y=[1 . . . n]), according to the logic format required for the memory. The limited number of memory cells $10_{x,y,z}$ of these examples makes it possible to illustrate the main features of the invention clearly and concisely. These examples do not exclude other possibilities of organisation of the 3D matrix.

Figure 3:
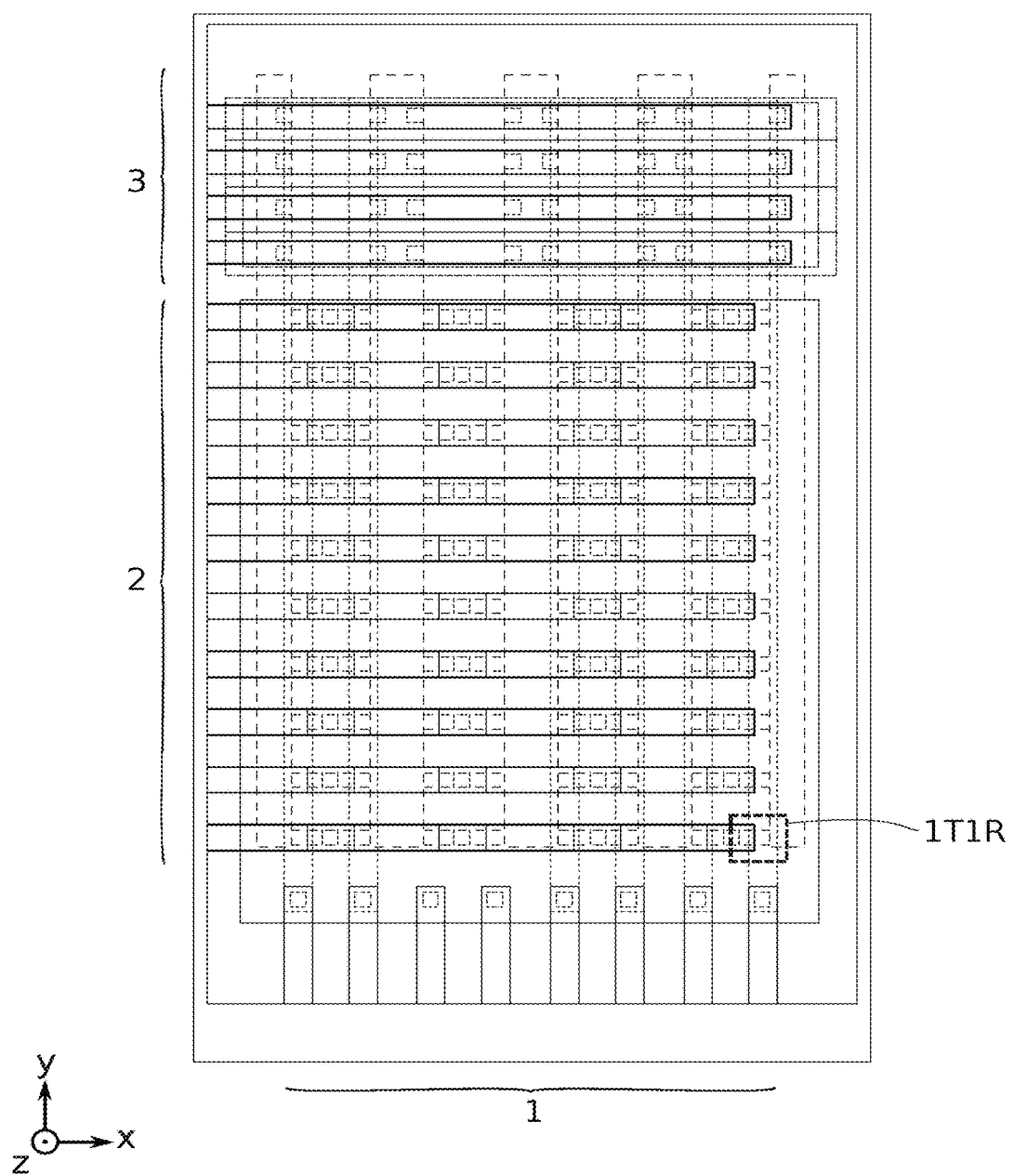
FIG. 3 presents a drawing of a microelectronic system comprising a matrix of memory cells according to one embodiment of the present invention.

FIG. 3 presents an example of arrangement of the structural elements of the OxRAM resistive memory. The 1T1R memory cells form a matrix in the plane XY at the intersection of the wordlines zone 1 and bitlines zone 2. This arrangement may comprise an offset sourcelines zone 3, juxtaposing the matrix, so as to facilitate the connection of the sourcelines.

The structural elements of this resistive memory are mainly the transistors or selection transistors, the memory elements or memory points and the wordlines, bitlines and sourcelines connection lines.

According to the invention, the transistors 101 are stacked on a plurality of integration levels (along the axis Z). These levels $n_1$, $n_2$, $n_3$, $n_4$ comprise in particular the sources 1002 of the transistors. They are electrically insulated from each other by means of a step of forming sacrificial gates 150. These sacrificial gates 150 are next replaced by all-around functional gates, of the GAA type. This general principle makes it possible to obtain a dense 3D matrix of GAA transistors. In the examples illustrated and described below, wordlines 1, bitlines 2 and sourcelines 3 zones are also defined and resistive memory elements 102 are formed so as to obtain a dense OxRAM memory in 3D integration.

A first example of production of a resistive memory of the OxRAM type will now be described with reference to FIGS. 4A to 18 in the following section:

Example 1

Formation of the Sacrificial Gates

Figure 4A:
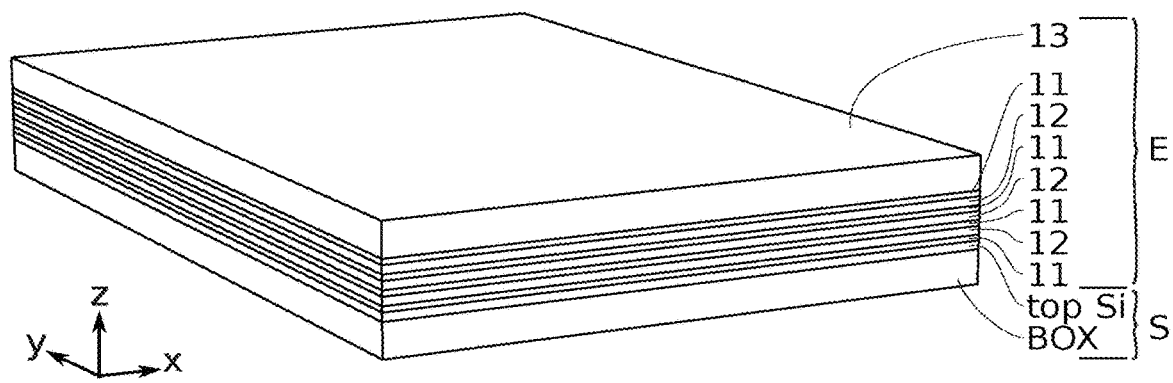
FIGS. 4A to 4G illustrate schematically in perspective view steps of manufacturing the sacrificial gates of a microelectronic system according to a first embodiment of the present invention.
Figure 4B:
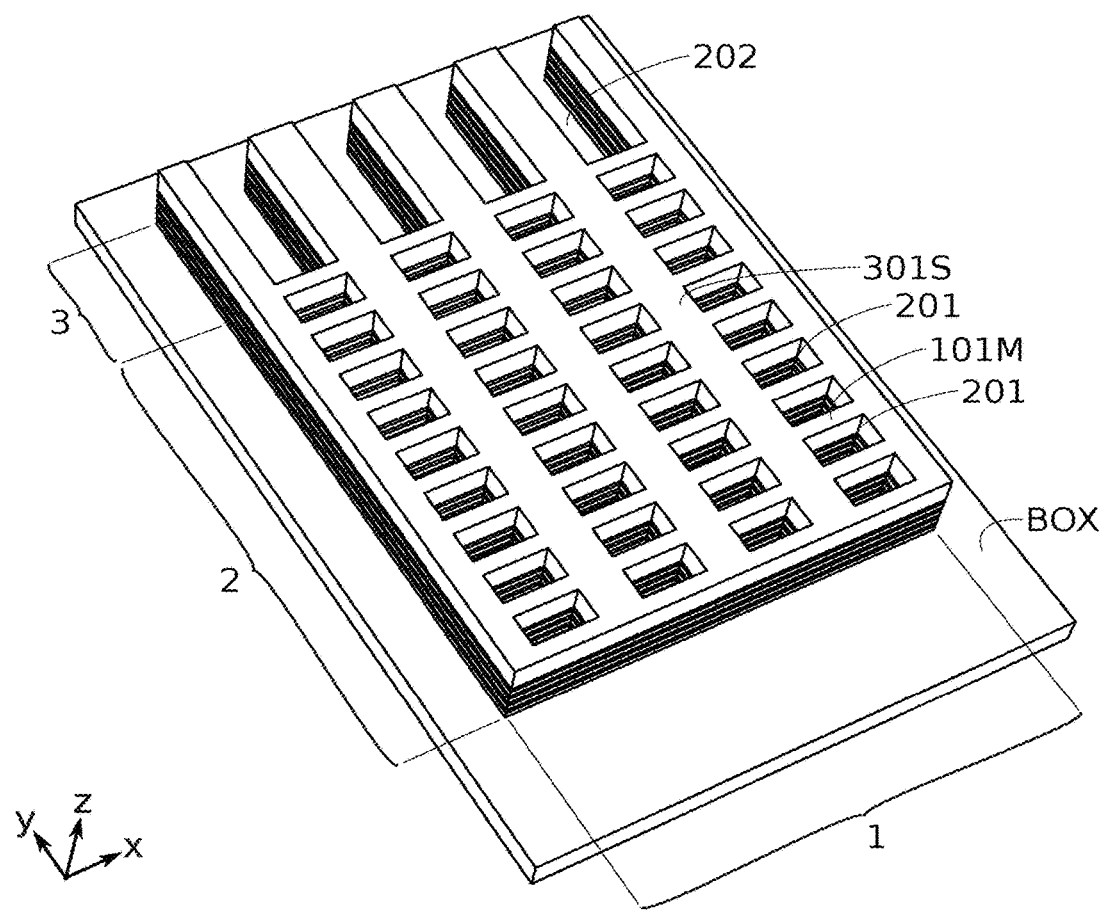

FIGS. 4A and 4B illustrate the formation of the stack and the definition of the transistor patterns. FIGS. 4C to 4G illustrate steps of forming the sacrificial gates at the transistor patterns.

As illustrated in FIG. 4A, a first step consists of producing a stack E of semiconductor layers 11, 12 on a substrate S. The substrate S may be a substrate of the SOI (silicon on insulator) type comprising, in accordance with current terminology for a person skilled in the art, a thick layer of silicon referred to as "Si bulk" (not shown in FIG. 4A), a layer of silicon oxide known as "BOX" (buried oxide) and a thin layer of silicon known as "top Si". The thickness of the top Si may typically be around 12 nm. The thickness of the BOX may typically be between 25 nm and 145 nm. Alternatively, the substrate S may be a solid "Si bulk" substrate. Alternatively, the substrate is of the GeOI or SGOI type (respectively germanium on insulator or silicon-germanium on insulator) known to persons skilled in the art. In this last case, the layer in contact with the BOX is a sacrificial layer of SiGe. This ultimately makes it possible to form transistors all having a GAA configuration, on each level.

The stack E typically comprises an alternation of layers 11 of silicon-germanium (SiGe) and layers 12 of silicon (Si).

The concentration of Ge in the SiGe alloy may be 20%, 30% or 45% for example. This concentration of germanium is chosen so as to afford good selectivity of the etching of the SiGe with respect to the Si, during selective etching steps. The higher the concentration of Ge, the greater will be the selectivity to Si during the subsequent removal of the SiGe. This stack E is advantageously formed by epitaxy of the layers of SiGe 11 and of Si 12. This step of forming the stack E is inexpensive and well known to persons skilled in the art. The thicknesses of the layers Si and SiGe may typically be around 15 nm, and more generally between 5 nm and 50 nm for example. In a way that is known in order to prevent the formation of structural defects, the maximum thicknesses permitted for the layers 11 of SiGe depend in particular on the concentration of Ge chosen.

In the example illustrated in FIG. 4A, four layers of Si (the top Si layer of the substrate and three epitaxed Si layers 12) alternate with four epitaxed layers of SiGe 11. An Si/SiGe superlattice is thus obtained. The number of layers of Si and of SiGe may naturally be increased. This ultimately makes it possible to increase the number of transistors and of memory cells.

A hard-mask layer 13, preferably of silicon nitride SiN, is next deposited on the Si/SiGe superlattice.

As illustrated in FIG. 4B, a conventional step of lithography/etching is performed in order to define transistor patterns 101M, source patterns 301S and openings 201, 202. The etching is anisotropic. It is configured to etch the Si/SiGe superlattice over the entire height thereof, stopping on the BOX. It can be performed by plasma using an HBr/$O_2$ etching chemistry. The transistor patterns 101M may have a length $I_T$ along X of between 100 nm and 500 nm. They preferably have a width $L_T$ along Y of between 10 nm and 80 nm, for example around 40 nm. This makes it possible to obtain a plurality of superimposed nanowires of Si intended to form the channels of the transistors.

The openings 202 in the sourcelines zone 3 are significantly wider than the openings 201 of the matrix defined by the wordlines 1 and bitlines 2 zones. This makes it possible to reserve sufficiently wide locations for the subsequent formation of the sourcelines contacts, in particular from ladder sourcelines contacts.

Figure 4C:
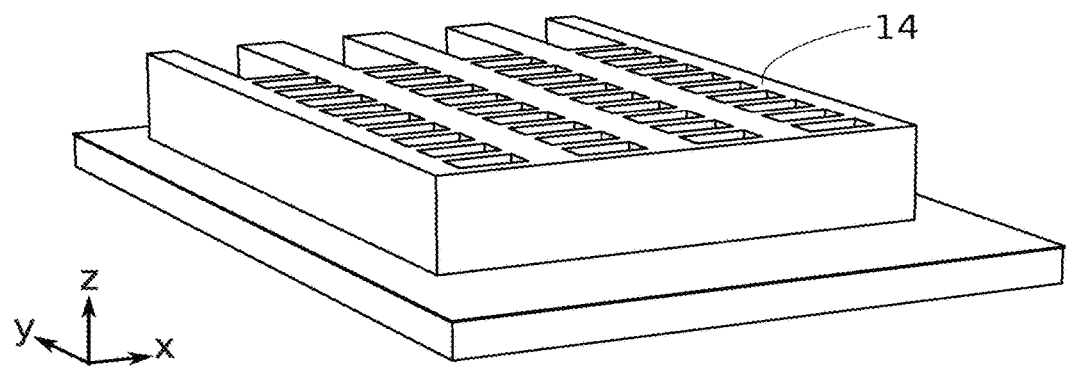
Figure 4D:
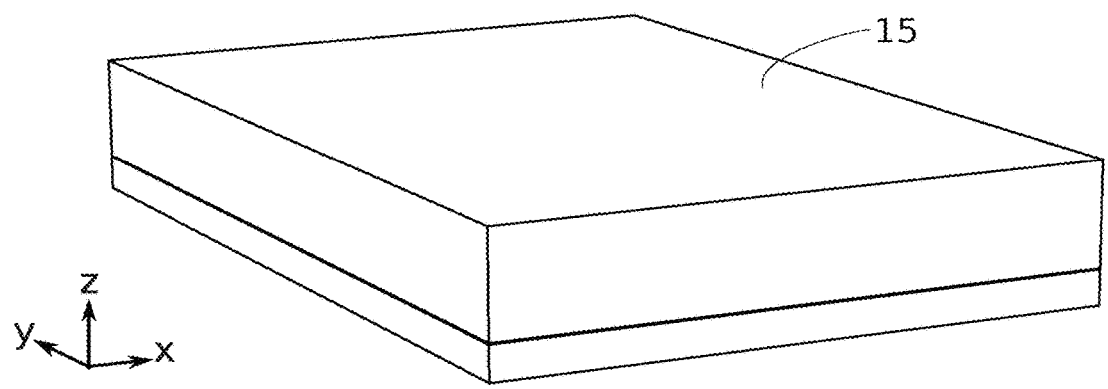

FIGS. 4C and 4D illustrate respectively steps of depositing a layer 14 of silicon oxide $SiO_2$ and a layer 15 of polycrystalline silicon (polySi). The $SiO_2$ is preferably a stoichiometric oxide deposited by CVD, referred to as TEOS, from the name of the silicon precursor (tetraethyl orthosilicate) generally used. This deposition is standard. The thickness of $SiO_2$ deposited may typically be a few nanometres, for example 7 nm. The polySi is deposited so as to fill the openings 201, 202. The thickness of polySi deposited may typically be a few hundreds of nanometres, for example 380 nm. These successive deposits form an $SiO_2$/polySi stack similar to a conventional gate stack. The structuring of this stack makes it possible to form pseudo-gates referred to as sacrificial gates in this application. These sacrificial gates are in fact preserved during intermediate steps of manufacturing the devices, and then removed in order to be replaced in the end by functional gates. According to an alternative possibility, the polySi may be replaced by an amorphous silicon.

Figure 4E:
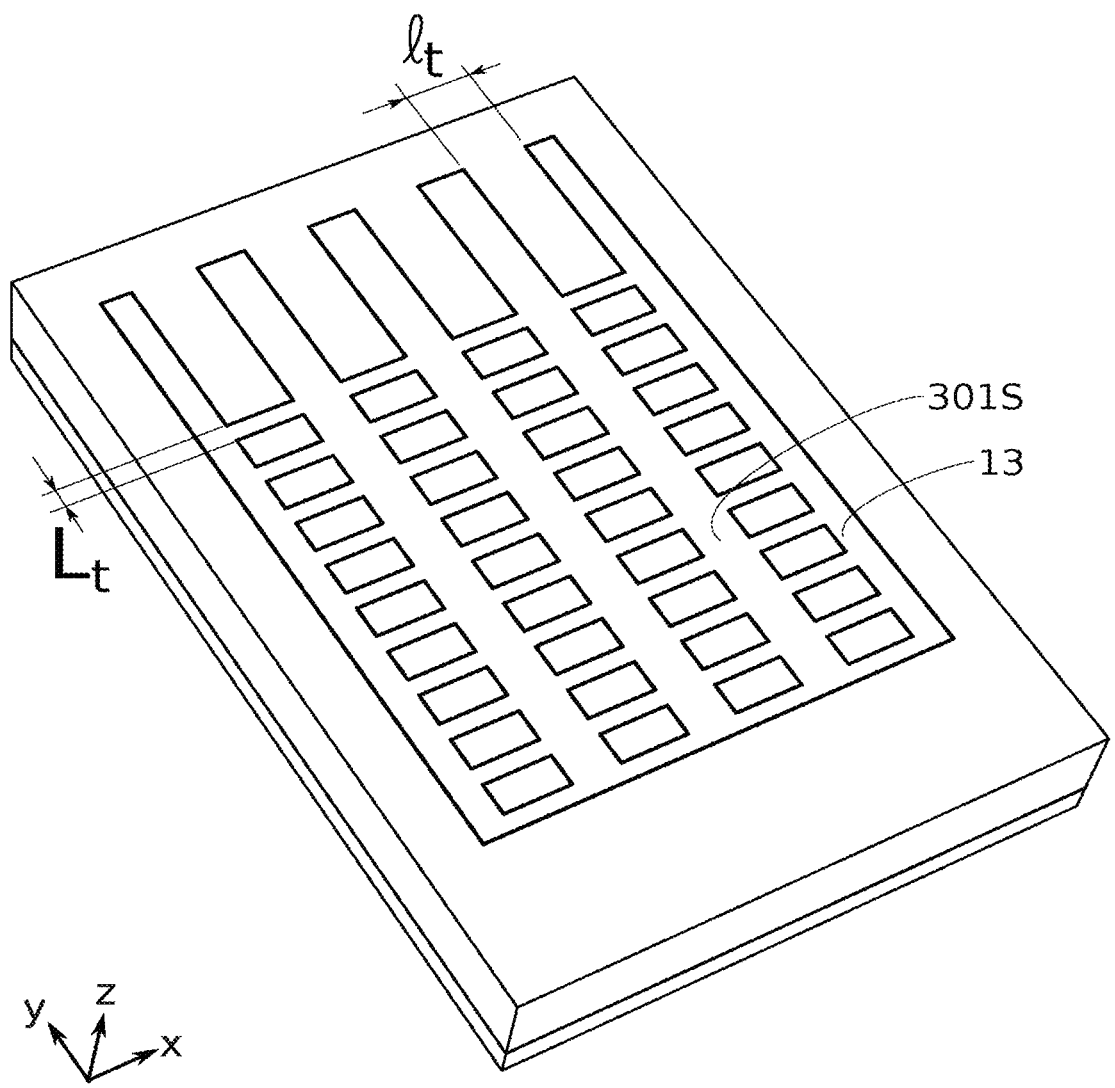

FIG. 4E illustrates a flattening step, typically by chemical mechanical polishing CMP, configured so as to be stopped on the hard mask 13.

Figure 4F:
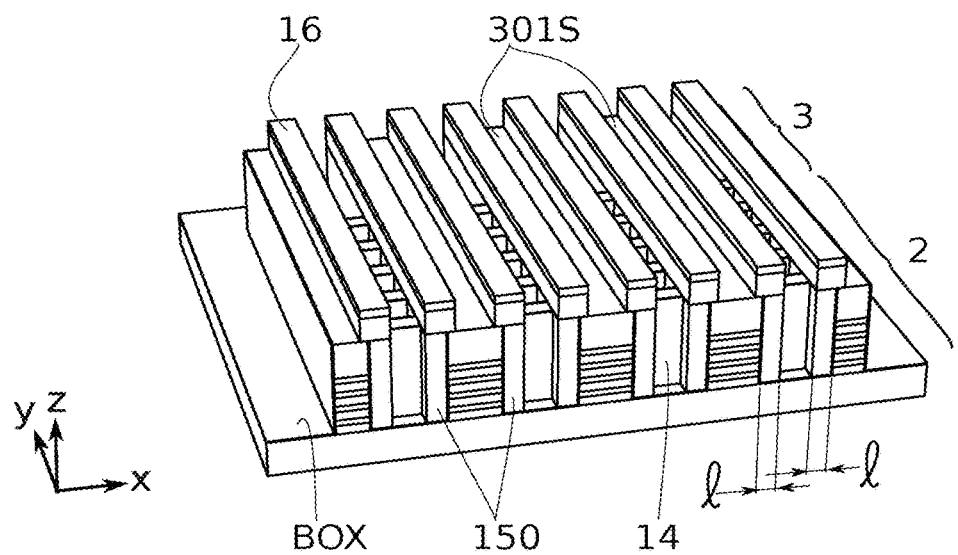

Another hard mask 16 may next be deposited over the entire surface of the plate, covering the hard mask 13 and the polySi exposed at the end of the flattening (not illustrated). This hard mask 16 comprises for example a layer of silicon nitride SiN with a thickness of approximately 90 nm surmounted by a layer of silicon oxide with a thickness of approximately 36 nm. The hard mask 16 is structured by lithography/etching so as to define the sacrificial gates. The hard mask 16 thus covers portions of transistor patterns 101M directly linked to the source patterns 301S (FIG. 4F). These portions of transistor patterns 101M are said to be peripheral. They preferably have a dimension l along X of between 10 nm and 150 nm, for example 50 nm. This dimension l may be proportional to the length $l_T$ of the transistor patterns 101M, for example l=k·$l_T$ with 0.1≤k≤0.4.

The sacrificial gates 150 are formed between the peripheral portions, by anisotropic etching of the polySi outside the regions covered by the hard mask 16, as illustrated in FIG. 4F.

The anisotropic etching of the polySi along Z may be performed by plasma, for example in $CH_2F_2$/$SF_6$/$N_2$/He and/or HBr/$O_2$/He chemistry. The layer 14 of TEOS and the buried oxide (BOX) advantageously serve as a stop layer during this etching of the polySi. The sacrificial gates 150 of dimension l along X are thus formed in the "bitline" 2 and "sourceline" 3 zones. In the bitline zone 2, the sacrificial gates 150 extend between the transistor patterns. They border on either side, along Y, the peripheral portions situated at each end of the transistor patterns. In the sourceline zone 3, the sacrificial gates 150 extend continuously along Y.

Figure 4G:
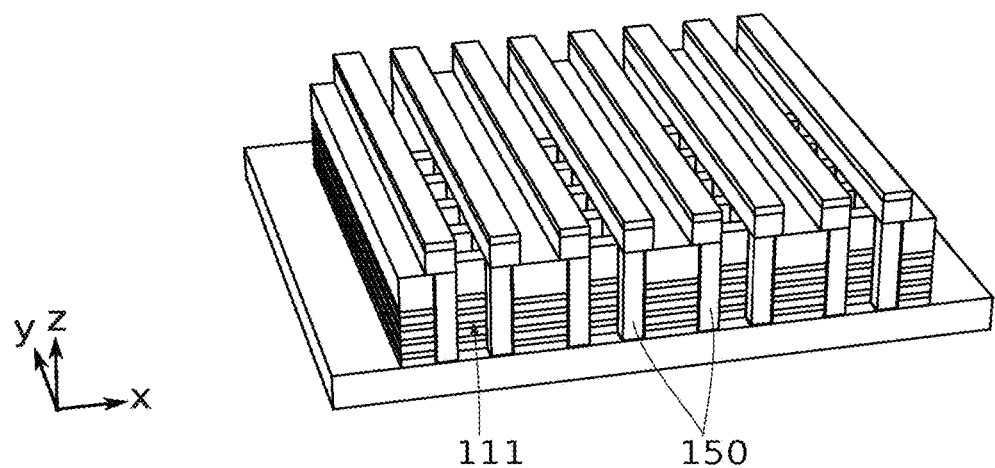

FIG. 4G illustrates the removal of the layer 14 of TEOS oxide, after etching of the polySi. This removal makes it possible to expose a central portion 111 of the transistor patterns, between the peripheral portions 112.

Figure 5:
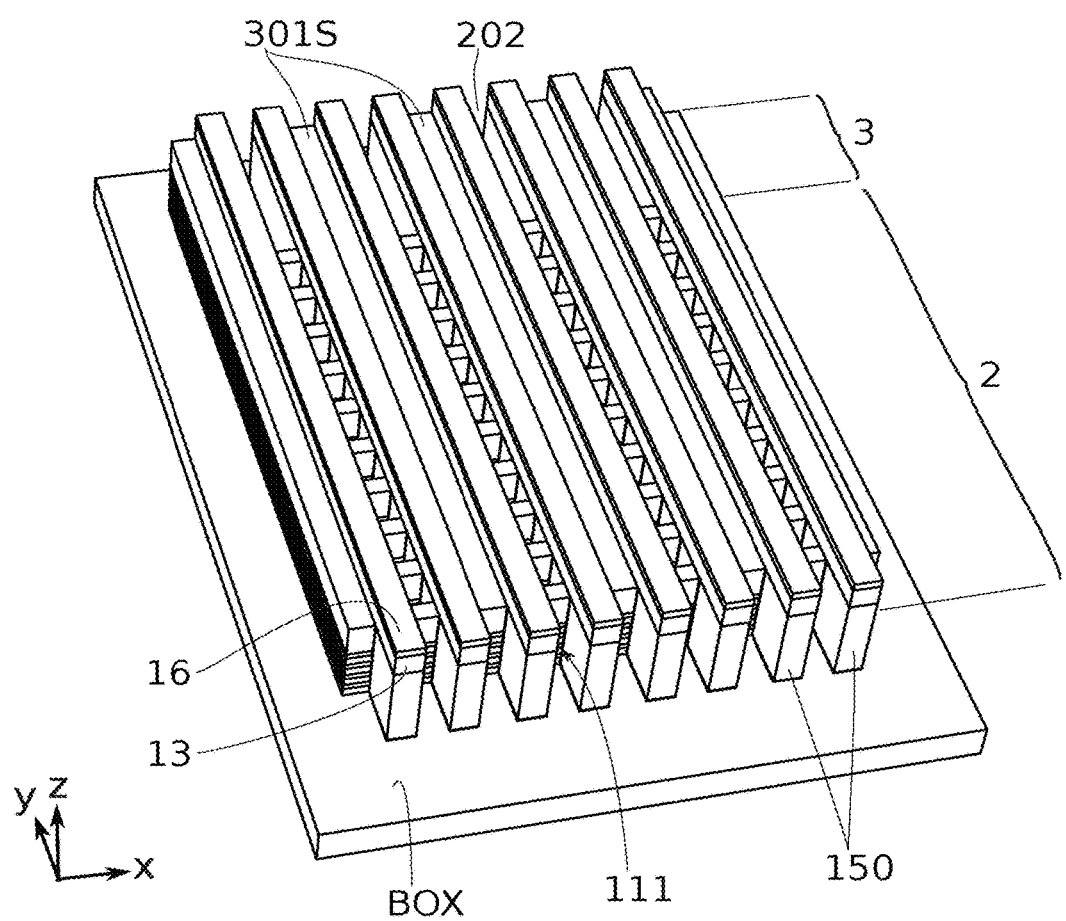
FIG. 5 illustrates schematically in perspective view a step of manufacturing a microelectronic system according to a first embodiment of the present invention.

FIG. 5 illustrates the bitline zone 2 in which the central portions 111 of the exposed transistor patterns are located, and the sourceline zone 3 in which the openings 202 are bordered by the sacrificial gates 150.

Figure 6A:
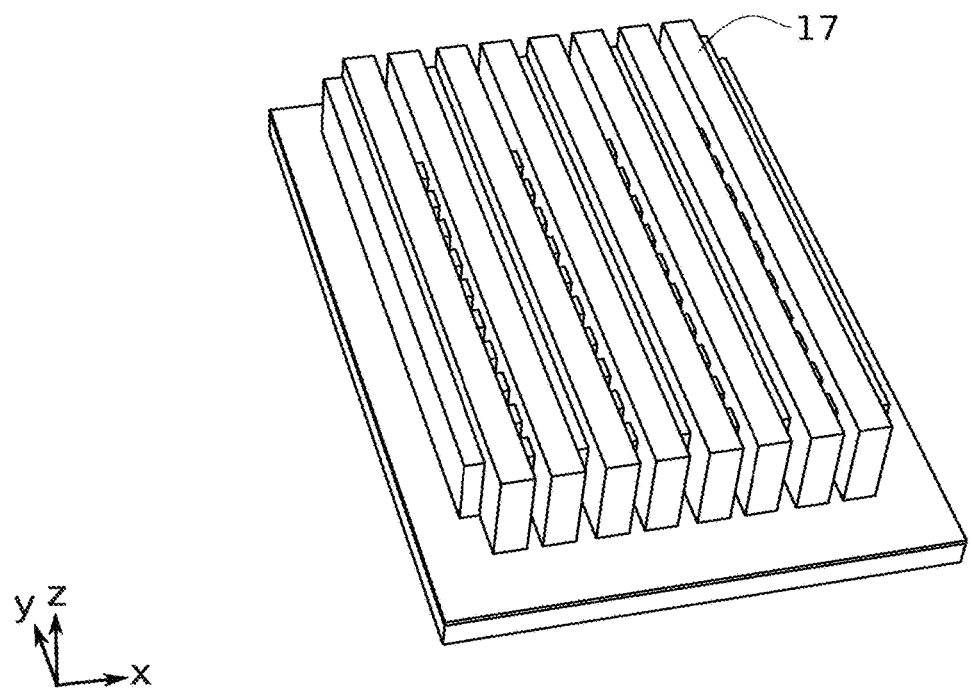
FIGS. 6A to 6C illustrate schematically in perspective view steps of manufacturing a microelectronic system according to a first embodiment of the present invention.
Figure 6B:
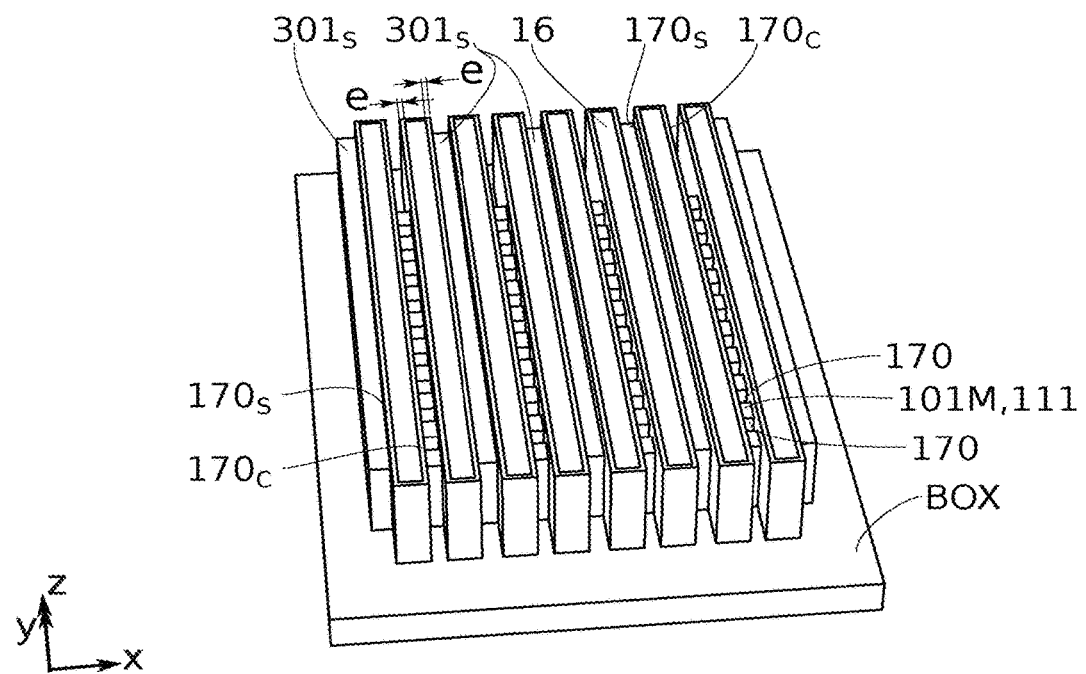

FIGS. 6A and 6B illustrate the formation of spacers 170, 170c, 170s. The spacers 170c, 170s extend mainly along y along either side of the sacrificial gates 150. These spacers 170c, 170s are said to be longitudinal. The spacers 170 extend mainly along x on either side of the transistor patterns 101M. These spacers 170 are said to be transverse. The spacers 170, 170c, 170s are typically formed from a deposit of a standard layer 17 of SiN (FIG. 6A) followed by an anisotropic etching of this layer 17 of SiN (FIG. 6B). The thickness e of the layer of SiN may be between 10 nm and 50 nm, for example around 20 nm. At the end of the etching of the spacers, the hard mask 16 and the BOX are exposed. The spacers 170c, 170s have a width along X equal to e and cover the flanks of the hard mask 16. The source patterns 301S are thus partly covered by these spacers 170s on the sides thereof bordering the hard masks 16. The spacers 170s form, on the sides of the source patterns 301S, a protrusion of SiN aimed at protecting the Si/SiGe stack during a subsequent etching. The spacers 170c cover the peripheral portions 112 of transistor patterns 101M. The spacers 170 cover the flanks of the central portions 111 of transistor patterns 101M.

The parts of the layer of SiN extend in planes parallel to the base plane XY, between the vertical spacers, are then opened by a first anisotropic etching, for example by plasma using fluorocarbon chemistry, for example based on $CH_2F_2$/$O_2$ or $CH_3F$/$O_2$ and $CHF_3$. Such a first anisotropic etching is known to persons skilled in the art. The Si/SiGe stack underlying the open parts is then etched over the entire height thereof, with stoppage on the layer of buried oxide (BOX), by a second anisotropic etching, for example by plasma using $HBr/O_2$ chemistry.

Figure 6C:
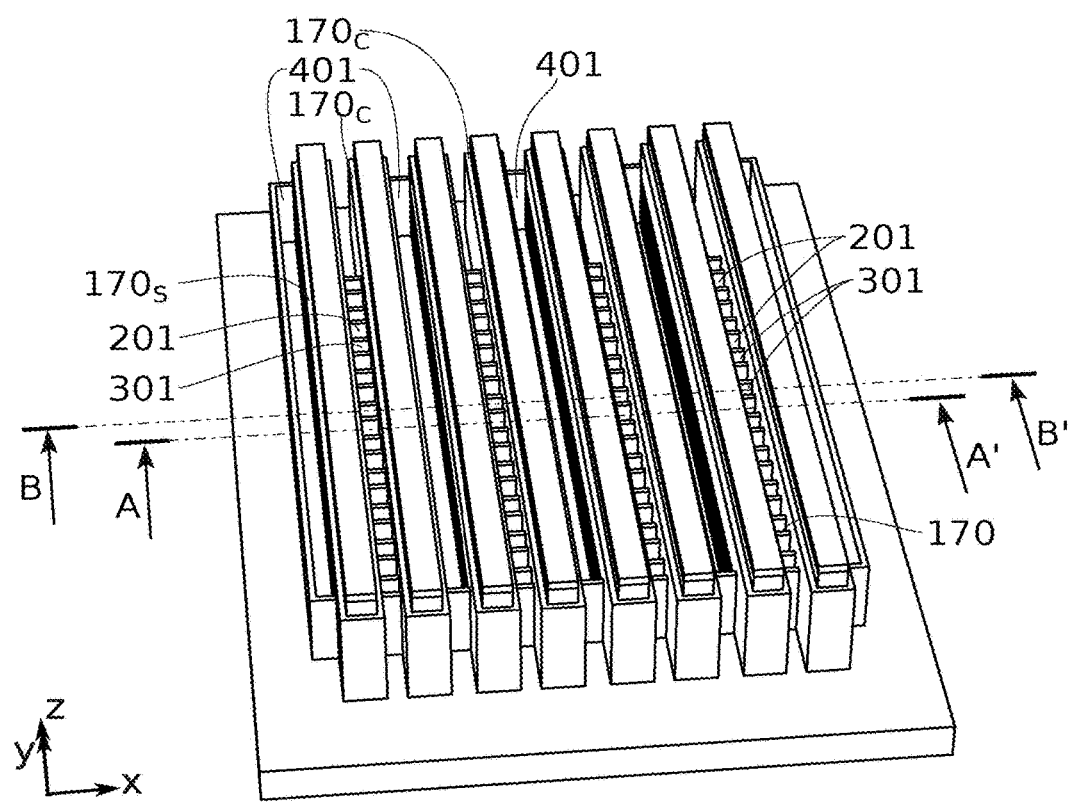

FIG. 6C illustrates the structure obtained after these first and second anisotropic etchings. In particular, the source patterns 301S have been partially etched and give way to openings 401 bordered by the Si/SiGe stacks surmounted by the spacers $170_s$. The central portions 111 of the transistor patterns 101M have been etched and give way of openings 301 bordered by the spacers 170, $170_c$. These openings 301 emerging on the peripheral portions of the transistor patterns are advantageously delimited by the spacers 170, $170_c$. This makes it possible to relax the resolution stresses in lithography in order subsequently to fill these openings 301.

Figure 7A:
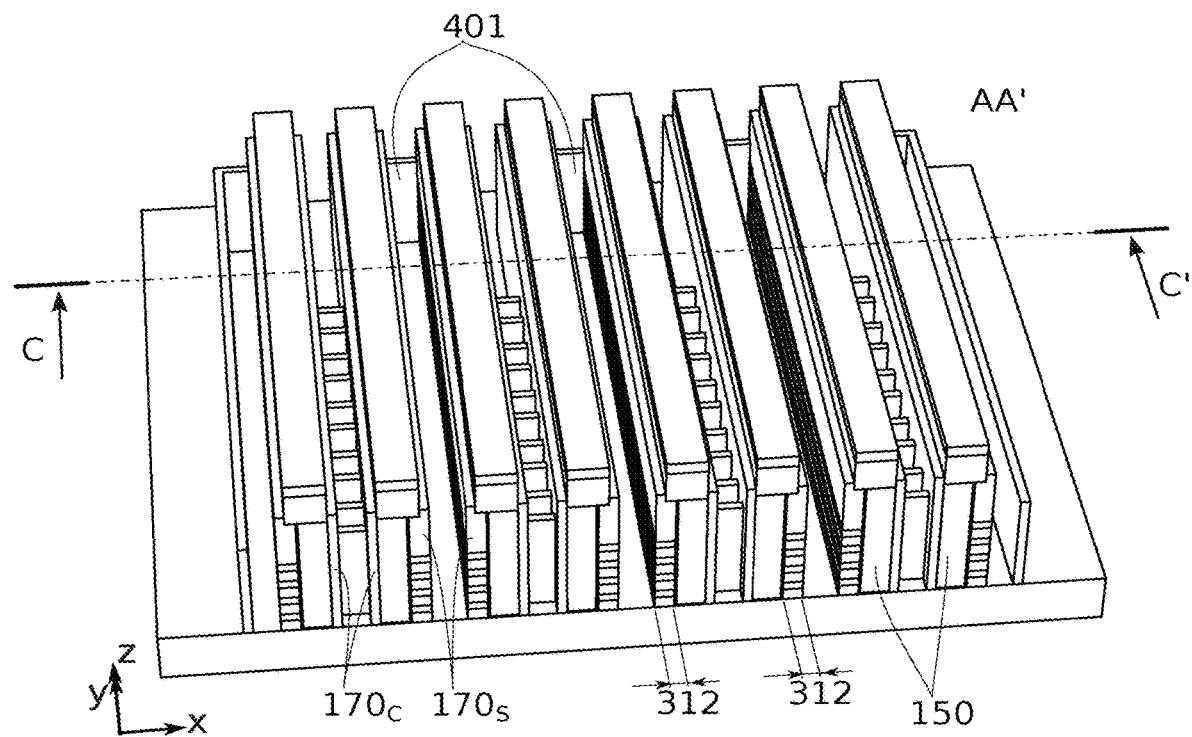
FIGS. 7A and 7B illustrate respectively cross sections along the axes AA' and BB' illustrated in FIG. 6C.
Figure 7B:
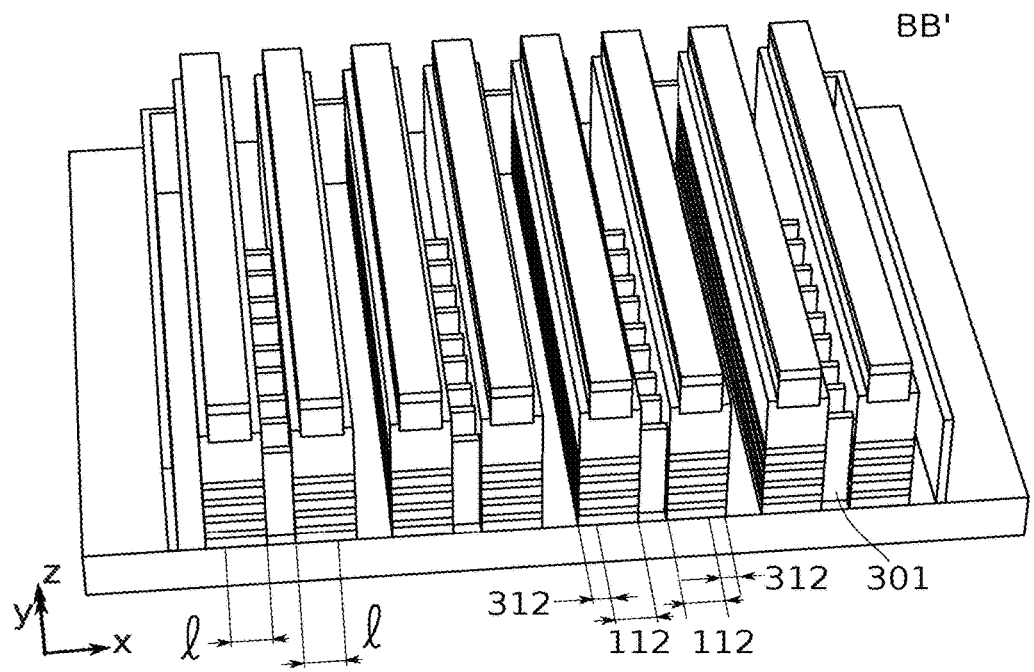

Two cross sections in the structure illustrated in FIG. 6C are presented in FIGS. 7A and 7B.

FIG. 7A shows a cross section passing through openings 201, along the line AA' shown in FIG. 6C. This cross section is similar to a cross section passing through openings 401 (not illustrated). It is clear that the sacrificial gates 150 form a series of pillars affording lateral anchoring of the Si/SiGe multilayers thus structured in a "comb". The peripheral portions 312 of the source patterns 301S are continuous along the axis Y. A first side of these peripheral portions 312 emerges on the openings 401. A second side of these peripheral portions 312 is attached to the sacrificial gates 150. Preferentially, the layers Si of these peripheral portions 312 subsequently form the sources of the transistors.

FIG. 7B shows a cross section passing through openings 301, along the line BB' shown in FIG. 6C. The teeth of the "comb" correspond to the peripheral portions 112 of the transistor patterns 101M, of length l along X. Preferentially, the Si layers of these peripheral portions 112 will subsequently form the channels and drains of the transistors.

Insulation of the Sources

In order to be able to independently address each of the transistors of the 3D matrix, it is necessary to at least partly insulate the transistors from each other. These transistors are formed from Si layers of the Si/SiGe stack. The SiGe layers are therefore preferably removed and replaced by electrically insulating layers. The SiGe layers are said to be sacrificial. They are used for forming the stack and then removed in order to insulate the transistors, and in particular the sources of these transistors.

Advantageously, a step of insulation of the sources supplying the channels of the transistors is performed. These sources are formed from the Si layers of the peripheral portions 312 of the source patterns 301S illustrated in FIGS. 7A, 7B.

Figure 8A:
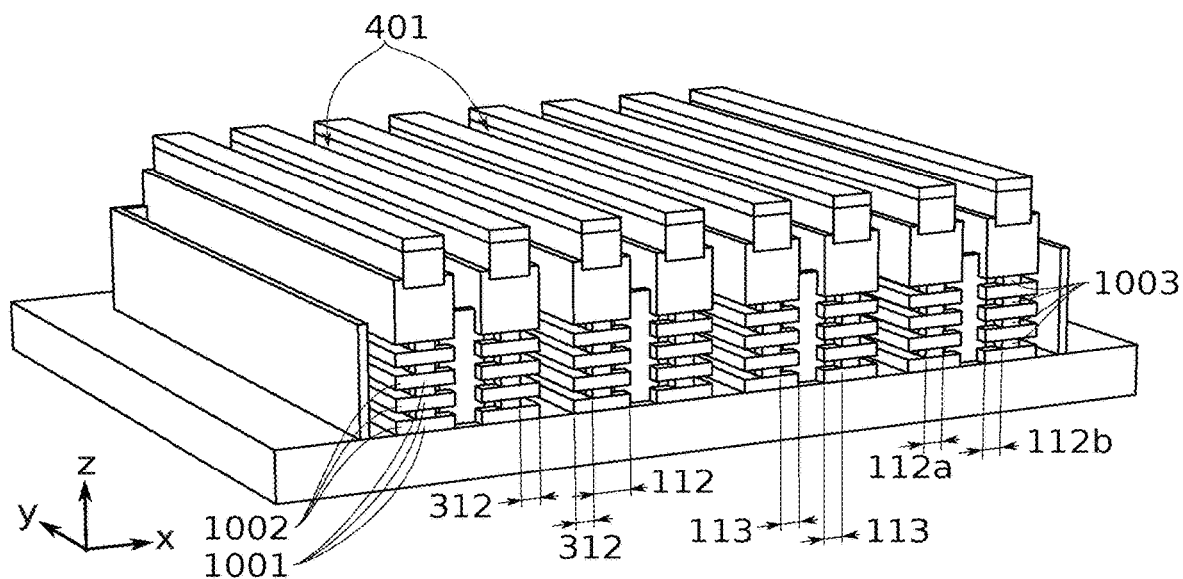
FIGS. 8A to 8D illustrate schematically in perspective view steps of manufacturing a microelectronic system aimed at insulating the transistor sources from each other, according to a first embodiment of the present invention.

As illustrated in FIG. 8A, portions of the SiGe layers of the stack are etched from the openings 301, 401. This etching is selective with respect to the silicon, and preferably isotropic. An etching solution based on acetic acid, hydrofluoric acid HF and hydrogen peroxide solution $H_2O_2$ may be used.

The etching is configured so that the SiGe layers of the peripheral portions 312 are etched through the openings 401. The etching front as from the openings 401 thus stops substantially vertically in line with the sacrificial gates 150. The sources 1002 are consequently suspended.

The etching of the SiGe layers preferably also takes place through the openings 301. The selective etching of the SiGe layers thus takes place on either side of the stack, at the transistor patterns, as illustrated in FIG. 8A. Parts 113 of SiGe layers of the peripheral portions 112 are thus etched. The etching is preferably stopped in time before the SiGe layers are completely removed. Portions 1003 of SiGe are thus kept. The peripheral portions 112 are thus subdivided into parts 112a, 112b. The parts 112a comprise the future channels 1001 made from Si alternating with the portions 1003 made from SiGe. The parts 112b comprise the future suspended drains 1006 made from Si. The drains 1006 and the channels 1001 can thus be defined during this step of partial etching of the SiGe. This partial etching also makes it possible to avoid any risk of collapse of the transistor channels 1001.

The polySi sacrificial gates make it possible in particular to hold the Si layers during the SiGe etching. They form a structure of attachment pillars for the Si layers.

Figure 8B:
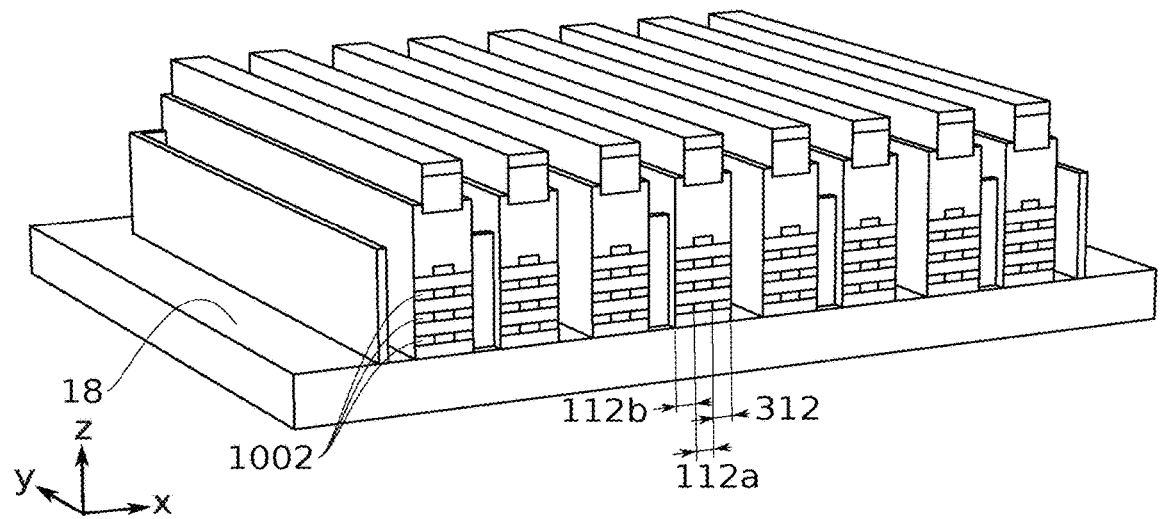

FIG. 8B illustrates the deposition of a dielectric layer 18, for example SiN, intended to fill the cavities formed by the removal of the SiGe. The sources 1002 are thus electrically insulated from each other.

Figure 8C:
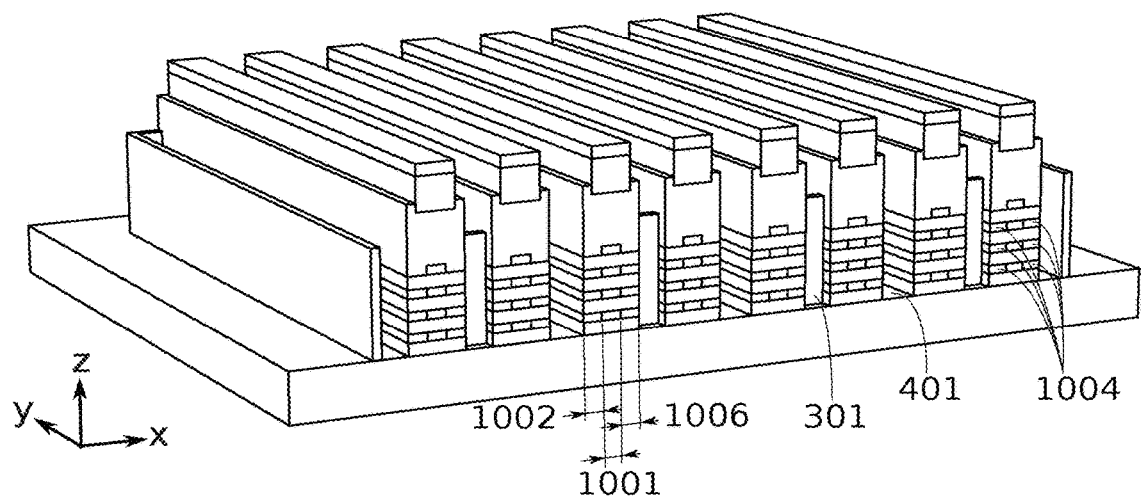

The layer 18 is next partially etched, for example using a dilute solution of phosphoric acid $H_3PO_4$ or of acetic acid $H_2O_2$, so as to expose the flanks substantially parallel to the plane YZ of the Si layers, on the same side as the openings 401 and on the same side as the openings 301. The BOX is preferably also exposed during this etching of the layer 18, as illustrated in FIG. 8C. FIGS. 8A to 8C illustrate these steps of removal of the SiGe and of insulation of the sources along a cross section passing through the openings 301.

Figure 8D:
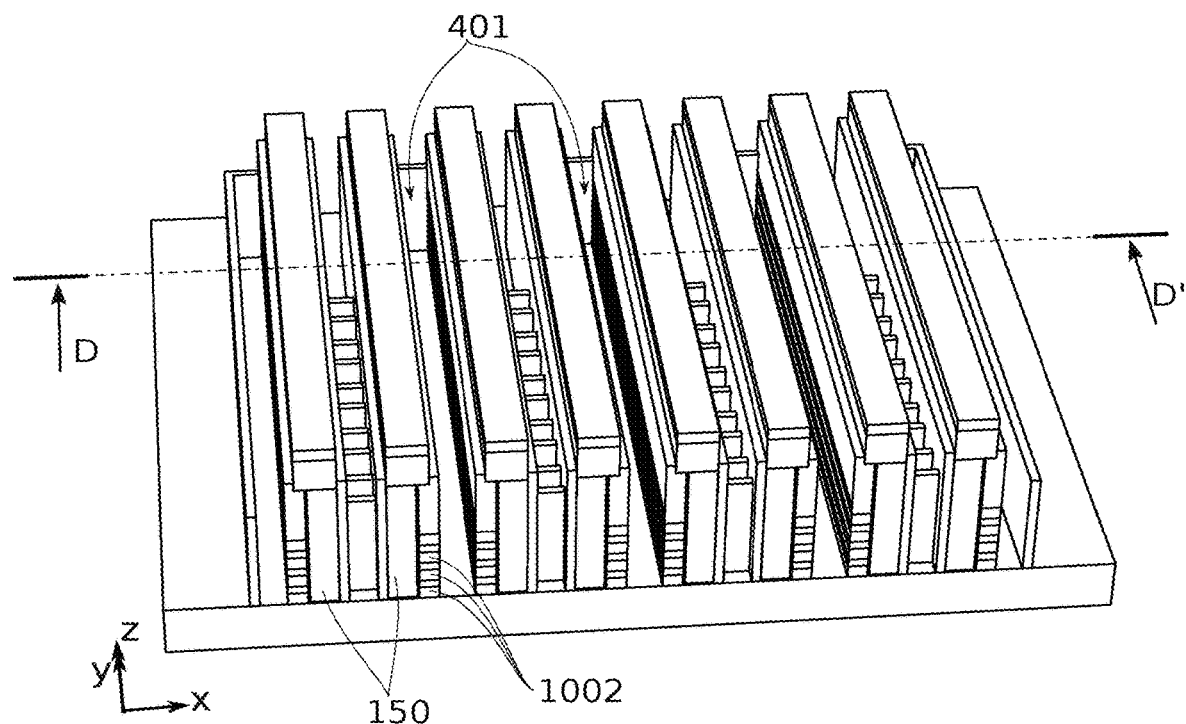

FIG. 8D illustrates the state of the structure after these steps of removing the SiGe and insulating the sources over a cross section passing through the openings 201. It is clear that the sacrificial gates 150 serve as a support for the sources 1002.

Figure 9:
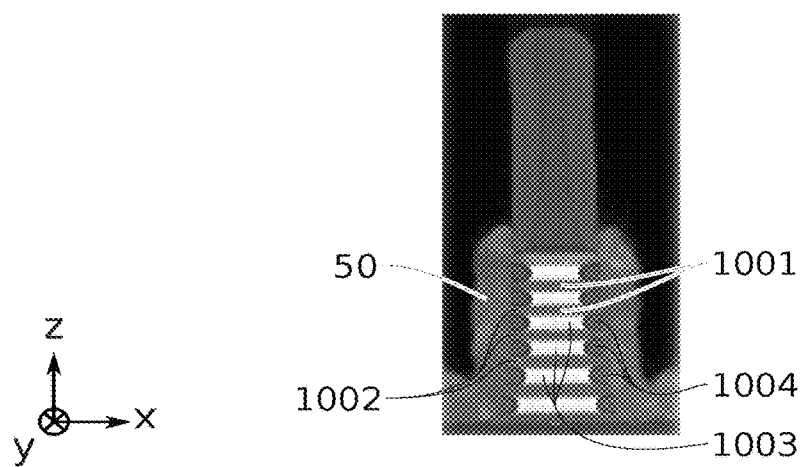
FIG. 9 presents a STEM HAADF image of a part of a microelectronic system according to a first embodiment of the present invention, during manufacture.

FIG. 9 is a scanning transmission electron microscopy image illustrating a device obtained after insulation of the sources 1002, as shown schematically in FIG. 8C.

Figure 10A:
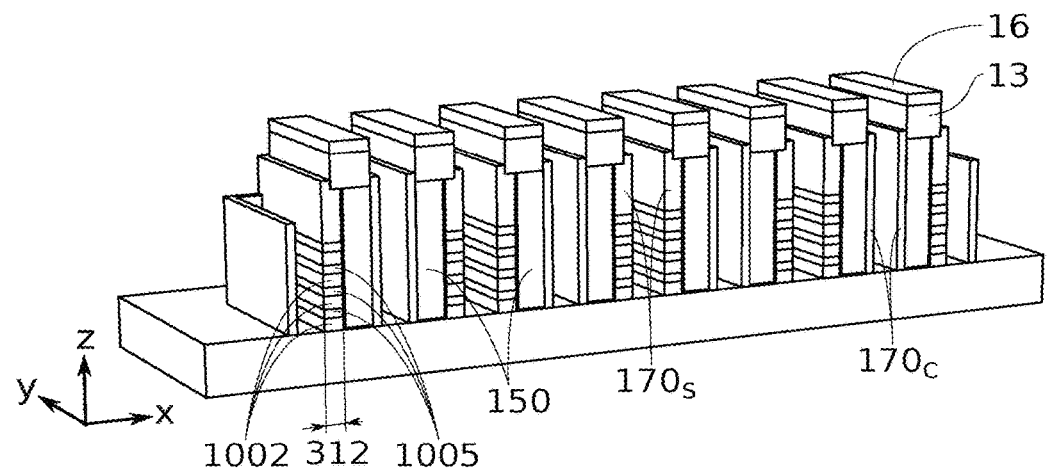
FIGS. 10A and 10B illustrate a part of a microelectronic system according to a first embodiment of the present invention, respectively before and after insulation of the sources from each other.
Figure 10B:
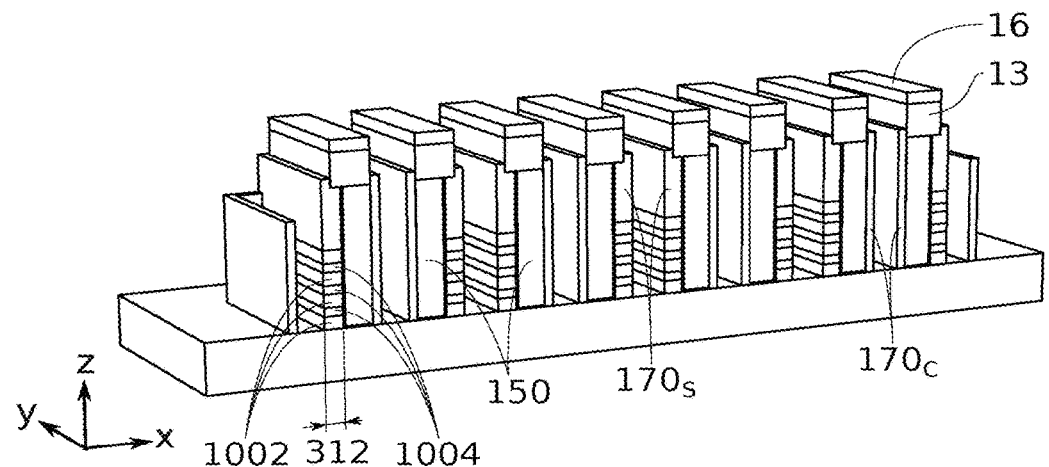

The remaining portions of SiGe 1003 are visible between the channels 1001 of the transistors. The plugs 1004 formed by the deposition of the SiN layer 18 are also visible on either side of the SiGe portions 1003. The layer 50 is an epitaxy performed for other requirements. FIGS. 10A and 10B present enlargements of the structure obtained respectively before and after insulation. Thus FIG. 10A illustrates in an enlarged fashion a cross section along the line CC' shown in FIG. 7A, passing through the openings 401 of the sourceline zone. FIG. 10B illustrates in an enlarged fashion a cross section along the line DD' shown in FIG. 8D, passing through the openings 401 of the sourceline zone.

The sacrificial gates 150, the spacers $170_c$, $170_s$, the hard masks 13 and 16 and the sources 1002 are visible in the two FIGS. 10A, 10B. The SiGe portions 1005 of the peripheral portions 312 of the source patterns 301S present before insulation (FIG. 10A) are replaced by the SiN plugs 1004 in the peripheral portions 312 of the source patterns 301S after insulation (FIG. 10B).

Structuring of the Sourcelines Zone

After insulation of the sources 1002, the openings 401, 301, 201 between the lines of the hard mask 16 are preferably filled with a TEOS oxide 180. The structure is next flattened by CMP until the hard mask 16 is removed, so as to expose the hard mask 13.

Figure 11A:
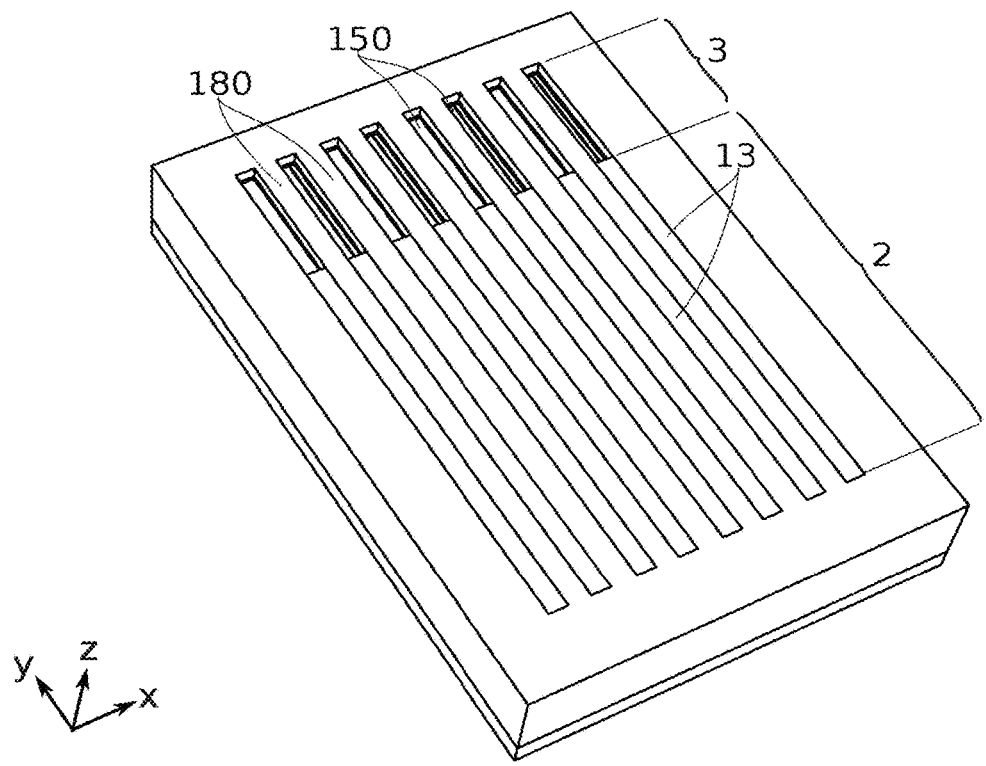
FIGS. 11A and 11D illustrate schematically in perspective view steps of manufacturing the zone of the sourcelines of a microelectronic system according to a first embodiment of the present invention.

By means of a conventional lithography/etching step, this hard mask 13 can then be removed in the sourceline zone 3, so as to expose the polySi of the sacrificial gates 150, as illustrated in FIG. 11A. The SiN hard mask 13 can be etched by means of a dilute solution of phosphoric acid $H_3PO_4$, or by plasma dry etching based on fluorocarbon species (for example $CH_2F_2/O_2$).

Figure 11B:
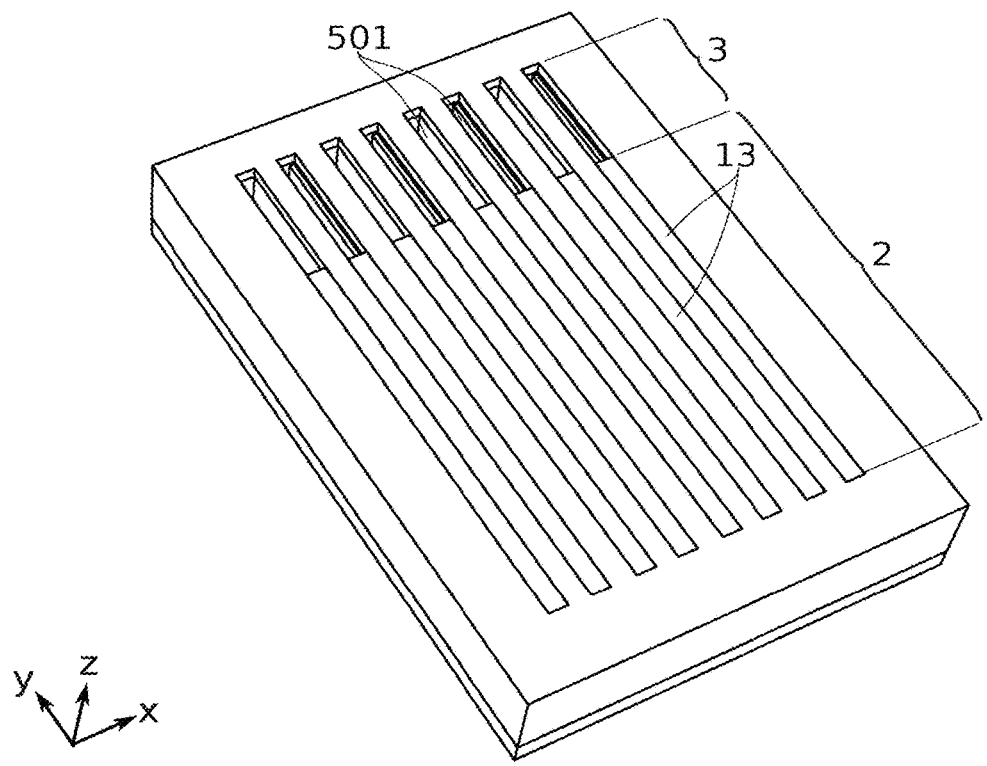

The sacrificial gates 150 of the sourceline zone 3 are next removed, as illustrated in FIG. 11B. The polySi of the sacrificial gates can be etched by means of a solution of tetramethylammonium hydroxide (TMAH) or tetraethylammonium hydroxide (TEOH). The TEOS oxide of the sacrificial gates can be etched by means of a fluorocarbon chemistry plasma, for example in $SF_4/CH_2F_2$/He chemistry.

Figure 11C:
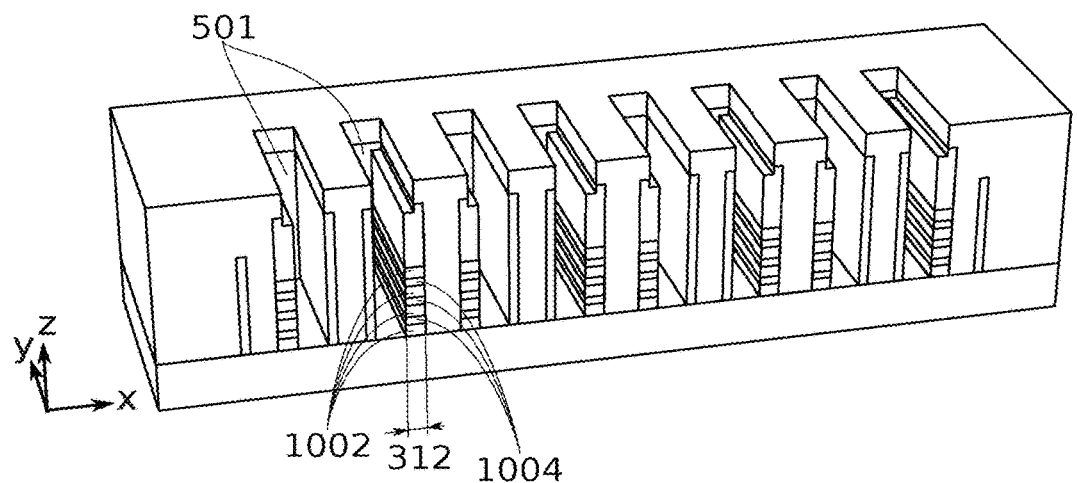

In the example illustrated in FIG. 11C, removing the sacrificial gates 150 forms openings 501. These openings 501 expose the second side of the peripheral portions 312 comprising the stack of sources 1002 insulated from each other by the plugs of SiN 1004. The sacrificial gates have thus made it possible to form a support for the sources 1002 when the portions of SiGe 1005 are replaced by the plugs of SiN 1004 in the peripheral portions 312. For SiGe portions 1005 having a width along X of less than or equal to 100 nm, this replacement can be done in a single step as illustrated previously by FIGS. 7A to 8D.

On the other hand, if the SiGe portions 1005 have a width along X greater than 100 nm, for example 150 nm, or 200 nm, complete removal of these portions 1005 may cause a collapse or sticking of the sources 1002 to each other. In this case, a partial removal of the portions 1005 over a width along X of less than 100 nm may first of all be performed as from the openings 401 emerging on the first side of the peripheral portions 312 (not illustrated). Then, after removal of the sacrificial gates, a complementary removal of the portions 1005 over a remaining width along X may be performed as from the openings 501 emerging on the second side of the peripheral portions 312. In this case, the sacrificial gates form first of all a support during the first partial removal of the SiGe interposed between the sources, and then, by removing them, these sacrificial gates allow access for the second complementary removal of the SiGe interposed between the sources. This replacement in two steps by means of the sacrificial gates makes it possible for example to size the sources so that they have a width of between once and twice the critical width of collapse of the sources, i.e. the width beyond which the sources are liable to collapse.

Figure 11D:
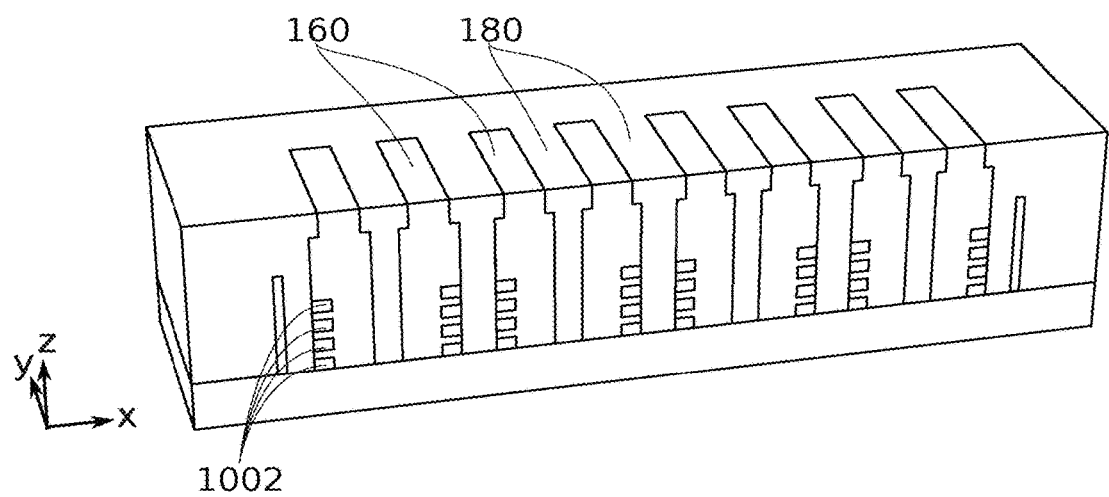

After removal of the sacrificial gates in the sourceline zone 3, the openings 501 are preferably filled with a deposit of SiN 160. This deposit is followed by a flattening by CMP after stoppage on the layer of TEOS oxide 180, as illustrated in FIG. 11D.

The sources 1002 are thus completely insulated from each other in the sourceline zones 3.

Figure 12:
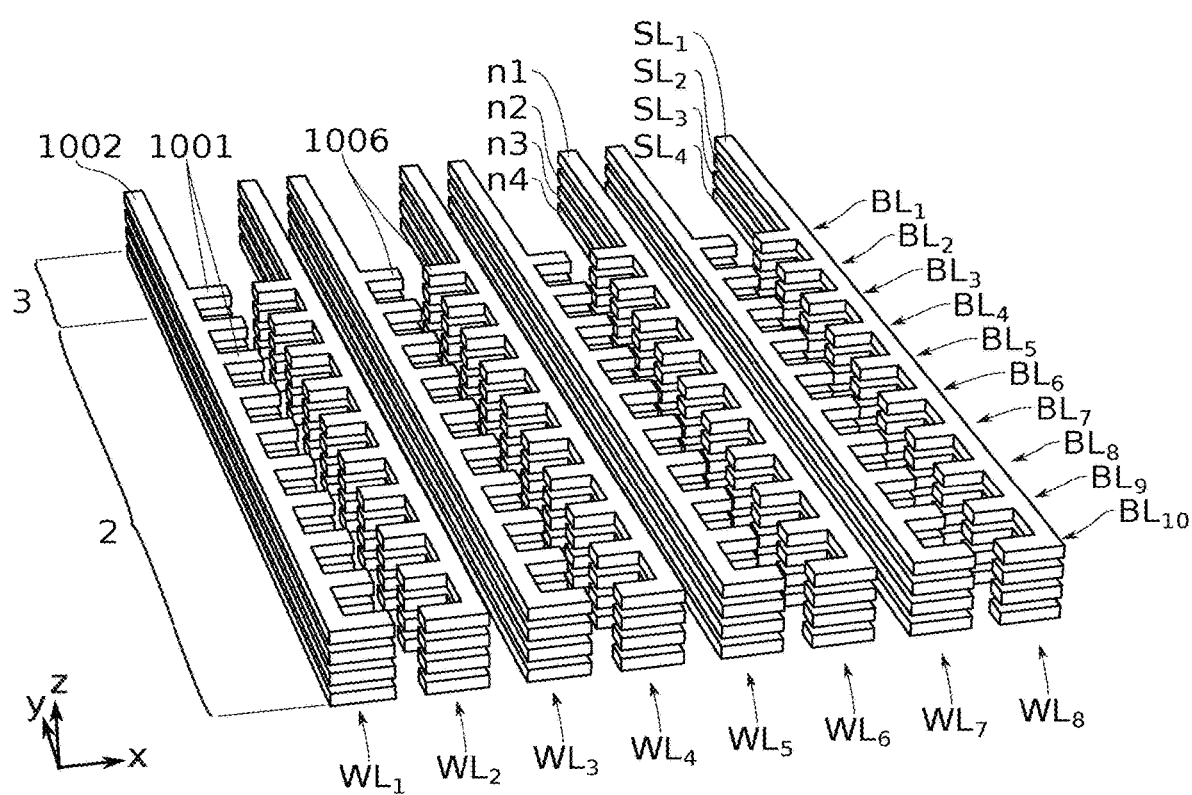
FIG. 12 is a schematic view of the sources and channels made from silicon of a microelectronic system according to a first embodiment of the present invention.

FIG. 12 shows solely the elements based on Si of the structure. The sources 1002 serving the channels 1001 of transistors in the bitline zone 2, in the form of combs, are thus clearly visible. This "skeleton" of silicon can in particular make it possible to form a 3D matrix comprising eight wordlines $WL_1$, $WL_2$, $WL_3$, $WL_4$, $WL_5$, $WL_6$, $WL_7$, $WL_8$, four levels n1, n2, n3, n4 of sourcelines $SL_1$, $SL_2$, $SL_3$, $SL_4$ and ten bitlines $BL_1$, $BL_2$, $BL_3$, $BL_4$, $BL_5$, $BL_6$, $BL_7$, $BL_8$, $BL_9$, $BL_{10}$.

Structuring of the Wordlines Zone

Figure 13A:
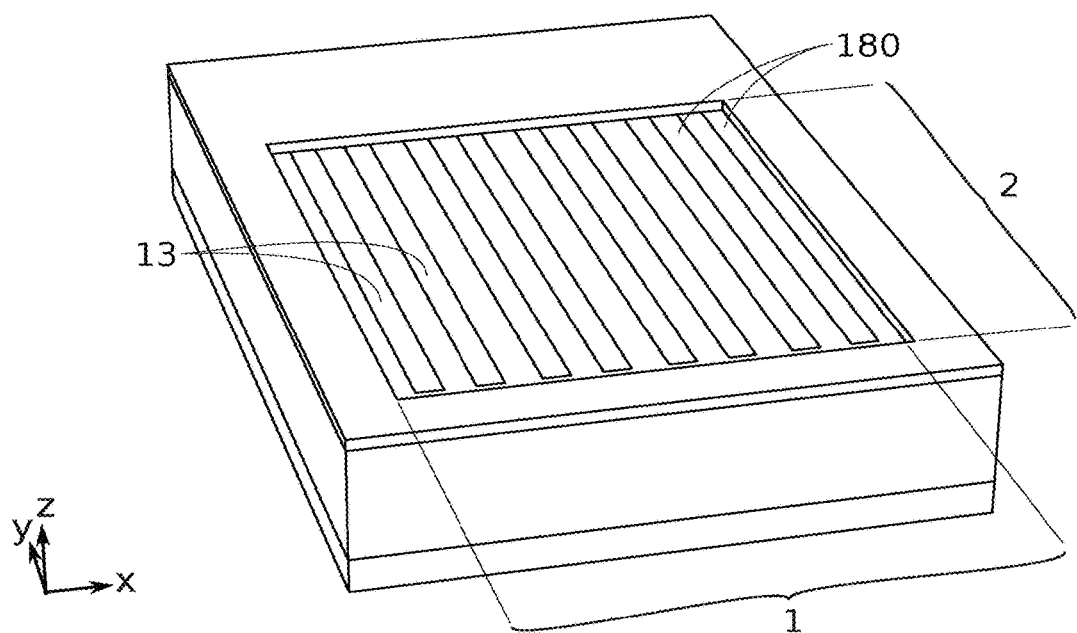
FIGS. 13A to 13F illustrate schematically in perspective view steps of manufacturing the zone of the wordlines of a microelectronic system according to a first embodiment of the present invention.

FIG. 13A illustrates a masking, for example by lithography, making it possible to protect the sourceline zone 3 while exposing the wordlines zone 1. Hereinafter, the WL are produced at the lines of the hard mask 13.

Figure 13B:
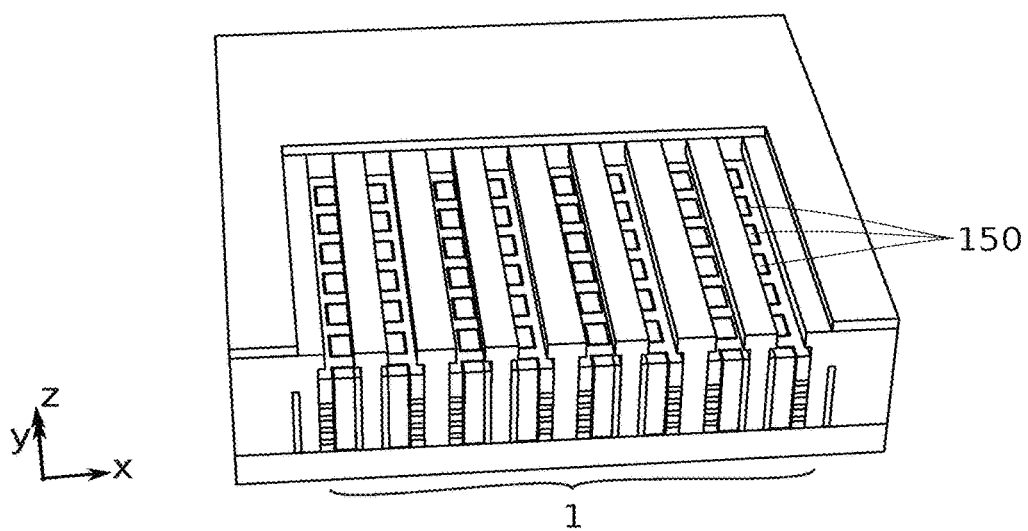

As illustrated in FIG. 13B, an etching of the hard mask 13 is carried out so as to expose the polySi of the sacrificial gates 150 of the wordlines zone 1. This etching of the SiN hard mask 13 may be done by plasma, for example by means of a $CH_2F_2/O_2$ or $CHF_3$/He and $CH_3F/O_2$/He/$CH_4$ plasma chemistry.

Figure 13C:
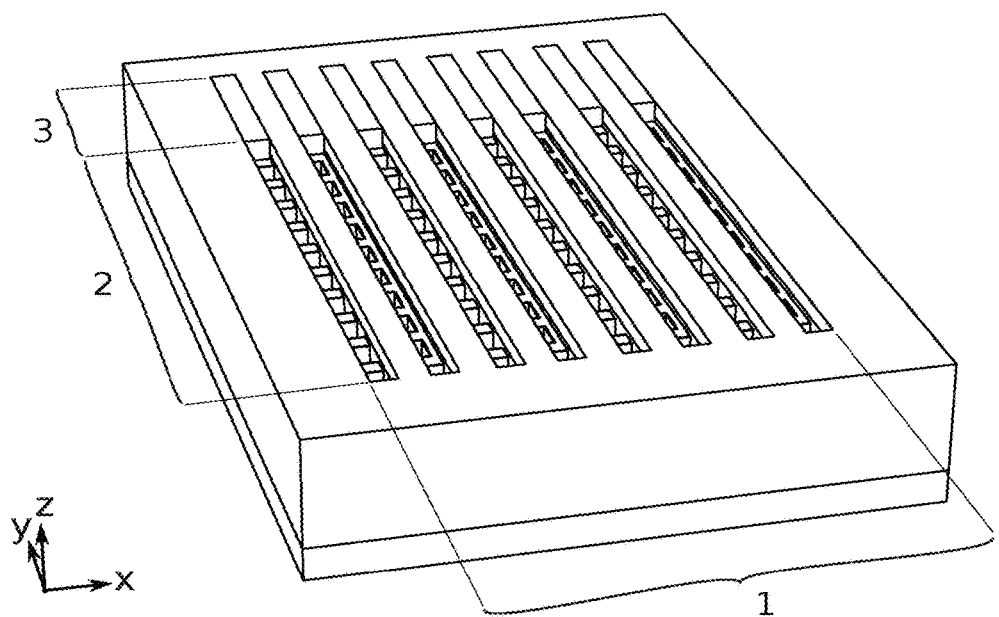
Figure 13D:
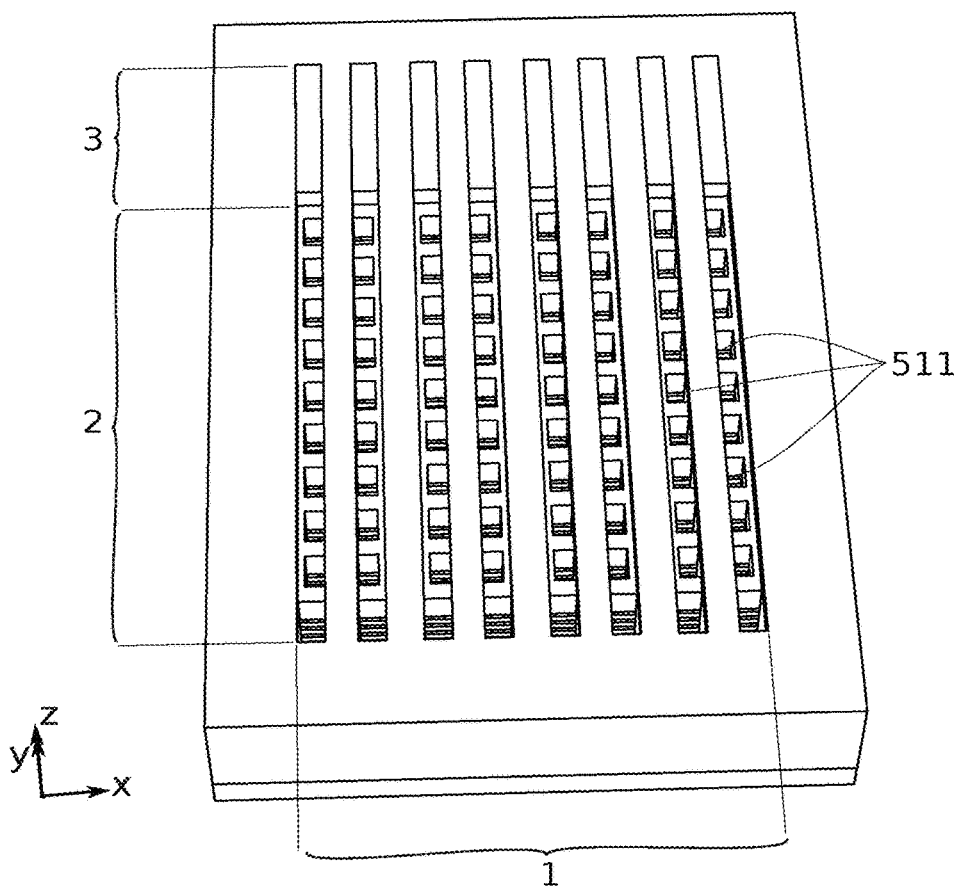

The sacrificial gates 150 of the wordlines zone 1 are next removed, as illustrated in FIGS. 13C, 13D. The polySi of the sacrificial gates can be etched by means of a solution of tetramethylammonium hydroxide (TMAH) or tetraethylammonium hydroxide (TEAH) (FIG. 13C). The TEOS oxide of the sacrificial gates can be etched by means of a plasma in fluorocarbon chemistry, for example in $CH_4/CH_2F_2$/He chemistry (FIG. 13D).

In the example illustrated in FIG. 13D, removing the sacrificial gates 150 forms openings 511. These openings 511 are bordered by two peripheral portions 112 of transistor patterns 101M, a first side of peripheral portions 312 comprising the stack of the sources 1002 insulated from each other, and a spacer 170c (not visible).

The peripheral portions 112 of transistor patterns 101M here each comprise a part 112a formed by a stack of Si nanowires between which portions 1003 of SiGe are situated, and a part 112b formed by a stack of Si nanowires between which plugs 1004 of SiN are situated.

Figure 13E:
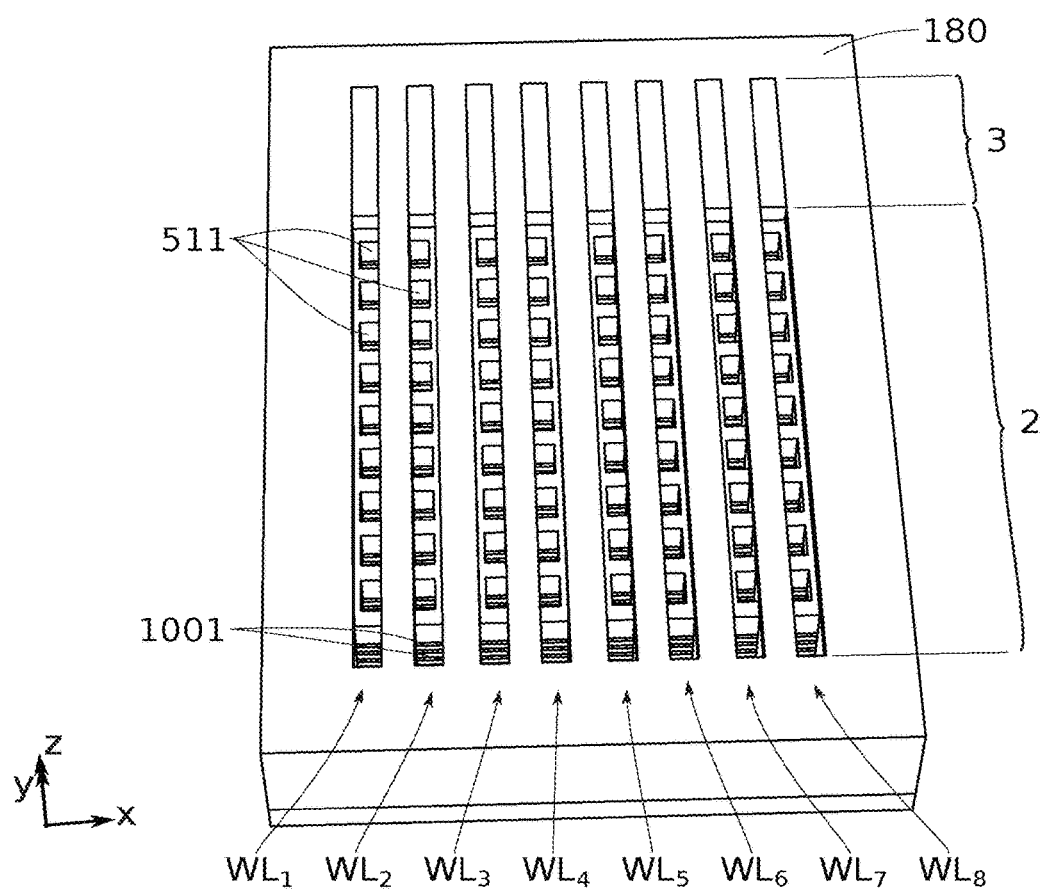

FIG. 13E illustrates the selective etching of the portions 1003 of SiGe. This etching has good $S_{SiGe:Si}$ selectivity with respect to Si, preferably $S_{SiGe:Si}$>5:1. This makes it possible to etch the SiGe while preserving the Si nanowires and the parts of the sources 1002 exposed at the first side of the peripheral portions 312. This etching also has good $S_{SiGe:SiN}$ selectivity with respect to SiN, preferably $S_{SiGe:SiN}$>5:1. This makes it possible to etch the SiGe while preserving the SiN spacers 170c and the plugs 1004. The etching is thus confined along the $WL_8$, being stopped laterally by the SiN spacers 170c and the first side of the peripheral portions 312.

At the end of the etching, the channels 1001 of the Si transistors are suspended between the openings 511 of the same wordline $WL_X$ (x=1 . . . 8) (FIG. 13E).

Figure 13F:
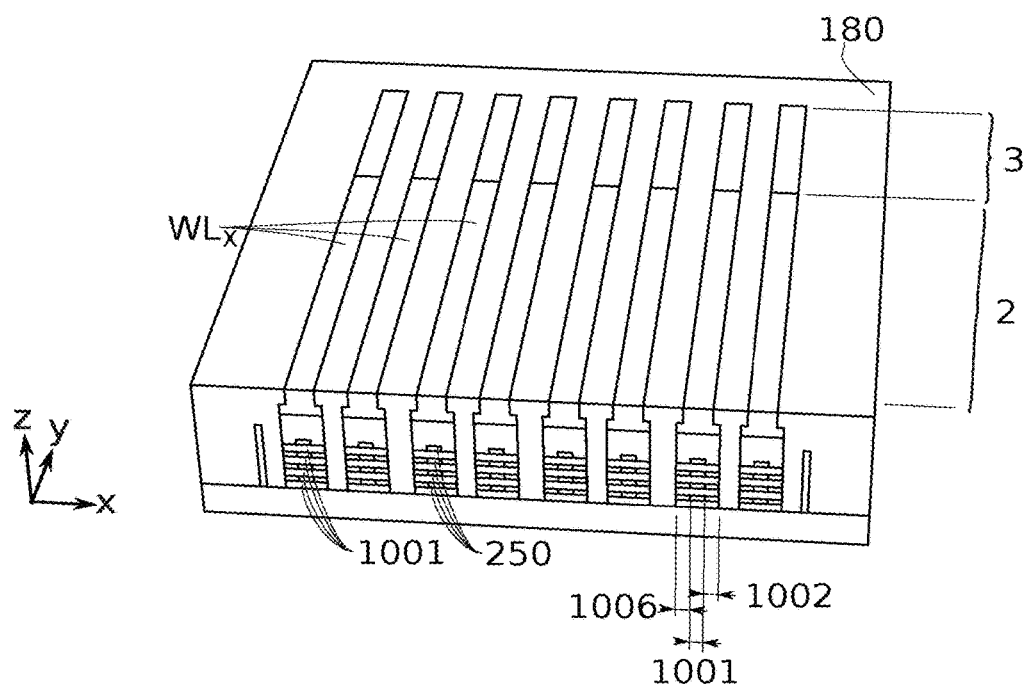

FIG. 13F illustrates the formation of the functional gates in place of the sacrificial gates. Successive depositions of materials used for forming functional gates make it possible to form the functional gates 250 around each channel 1001. These functional gates can be formed from a deposition of material with a high dielectric constant referred to as high-k, for example $HfO_2$ over a thickness of 2 nm, followed by a deposition of TiN over a thickness of 3 nm, followed by a deposition of tungsten W aimed at filling the openings 511 and the wordlines $WL_x$ delimited by the TEOS oxide 180. A flattening by CMP with stoppage on the TEOS oxide 180 makes it possible as required to remove the excess metal layers. The wordlines $WL_x$ (x=1 . . . 8) are thus defined. The transistors in the 3D matrix are therefore gate-all-around MOS transistors based on stacked Si nanowires.

FIG. 13F makes it possible to distinguish in cross section the sources 1002 of the transistors, the channels 1001 surrounded by the all-around gates 250, and nanowire parts forming the drains 1006 of the transistors. The sources 1002 extend along Y as far as the sourceline zone 3. The drains 1006 extend along X as far as the regions of openings 301 filled with oxide 180.

Structuring of the Bitlines Zone

The following step consists of removing the oxide 180 of the zones of openings 301, so as to access the drains 1006 of the transistors.

Figure 14A:
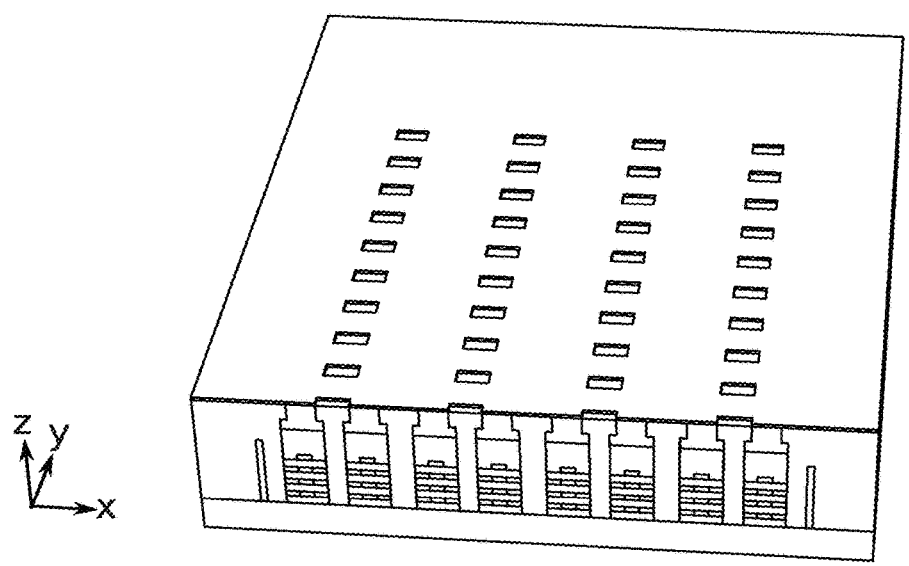
FIGS. 14A to 14C illustrate schematically steps of a method for manufacturing the zone of the data lines of a microelectronic system according to a first embodiment of the present invention.
Figure 14B:
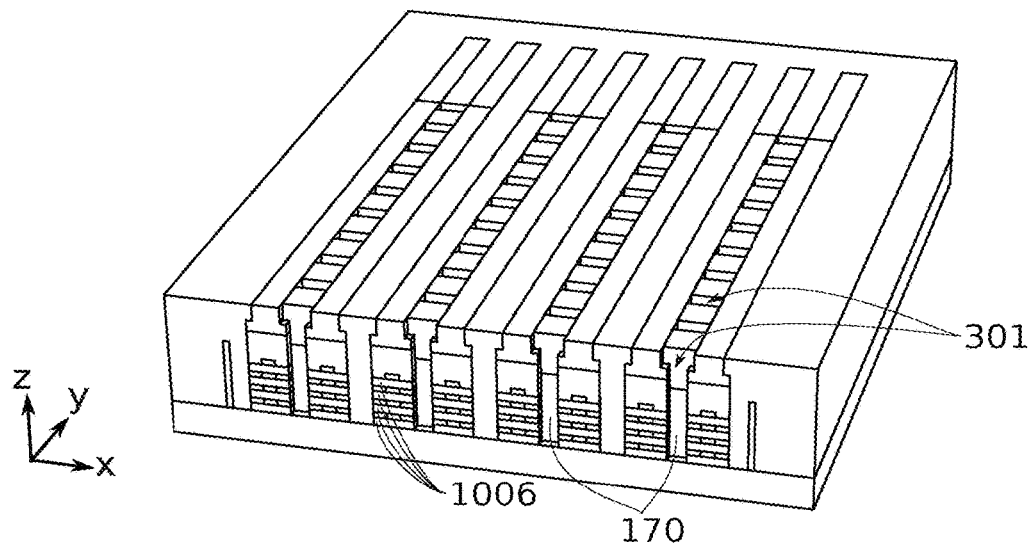

FIG. 14A illustrates a lithography step prior to the etching of the oxide 180 at the regions of openings 301. Advantageously, the alignment constraints related to this lithography step are reduced by virtue of the presence of the spacers 170 embedded in the oxide 180. A selective etching of the oxide 180 with respect to the nitride SiN of the spacers 170 consequently makes it possible to "automatically" expose the openings 301 emerging on the drains 1006, as illustrated in FIG. 14B. The subsequent formation of the resistive elements of the memory points precisely at the openings 301 is thus advantageously assisted by the presence of the spacers 170 defining the openings 301. This step of lithography/etching of the oxide 180 intended to open the memory-point zones is said to be "autoaligned", because of the presence of the spacers 170 guiding the etching of the oxide 180.

Figure 14C:
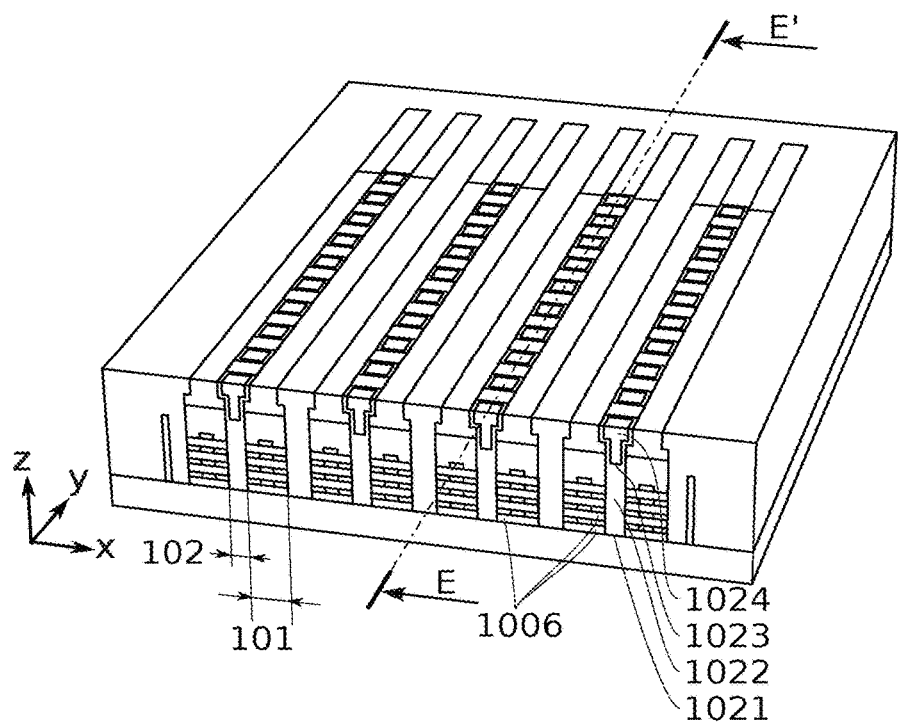
Figure 15:
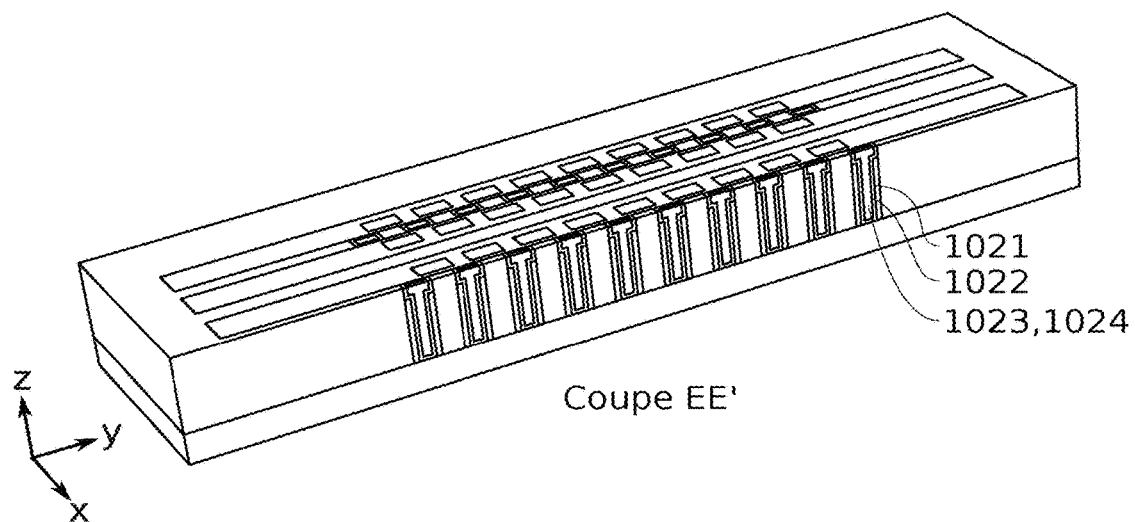
FIG. 15 illustrates schematically the step of the manufacturing method illustrated in FIG. 14C along a longitudinal section EE' shown in FIG. 14C.

After etching of the oxide 180, the openings 301 are filled by successive depositions so as to form the memory points or memory elements 102, as illustrated in FIGS. 14C and 15, respectively along a cross section and a longitudinal section. In the case of a resistive memory of the OxRAM type, these memory elements 102 may be based on $HfO_2$. For example, these memory elements 102 may be produced by deposition of an $HfO_2$ layer 1021, for example with a thickness of 5 nm, followed by a deposition of a layer of Ti 1022, for example with a thickness of 5 nm, followed by a deposition of a layer of TiN 1023, for example with a thickness greater than 5 nm, followed by a deposition of a layer of W 1024, for example with a thickness of 300 nm. The layer of W 1024 may typically extend outside the openings 301. It is then flattened by CMP with stoppage on the layer of oxide 180.

The memory elements 102 thus formed are directly in contact with the drains 1006 of the selection transistors. According to one possibility, the drains 1006 may be silicided in advance before the deposition of the layers forming the memory elements 102. The autoalignment of the memory points with the drains 1006 of the selection transistors makes it possible in particular to move these two elements forming a resistive memory cell closer together. This makes it possible to increase the density of resistive memory cells in the 3D matrix.

In particular, each memory element 102 has an edge or flank in contact with an edge or flank of a spacer 170c surmounting the stack forming the drains of the transistors. These edges or flanks extend mainly in planes parallel to the plane yz.

Formation of the Contacts

Figure 16A:
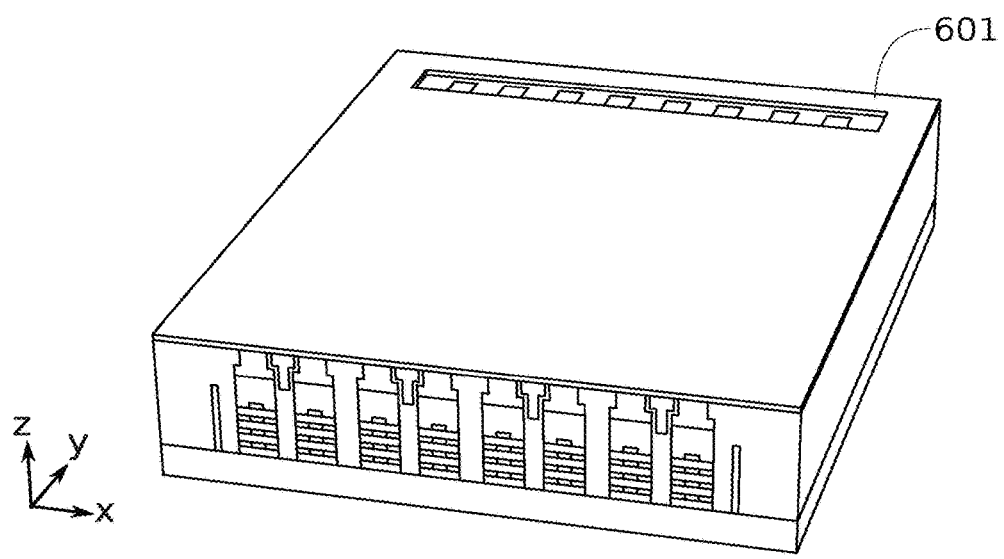
FIGS. 16A to 16D illustrate schematically steps of a method for manufacturing the zone of the sourcelines of a microelectronic system according to a first embodiment of the present invention, for producing ladder contacts.

FIG. 16A illustrates a lithography step aimed at forming contacts in the sourceline zone 3 of the 3D matrix. The contacts to be formed in the sourceline zone 3 are preferably ladder contacts. A sequence of lithography/etching steps then makes it possible, in a known fashion, to form such ladder contacts, on each of the source levels. Typically, a first line 601 of contact patterns is defined by lithography (FIG. 16A).

Figure 16B:
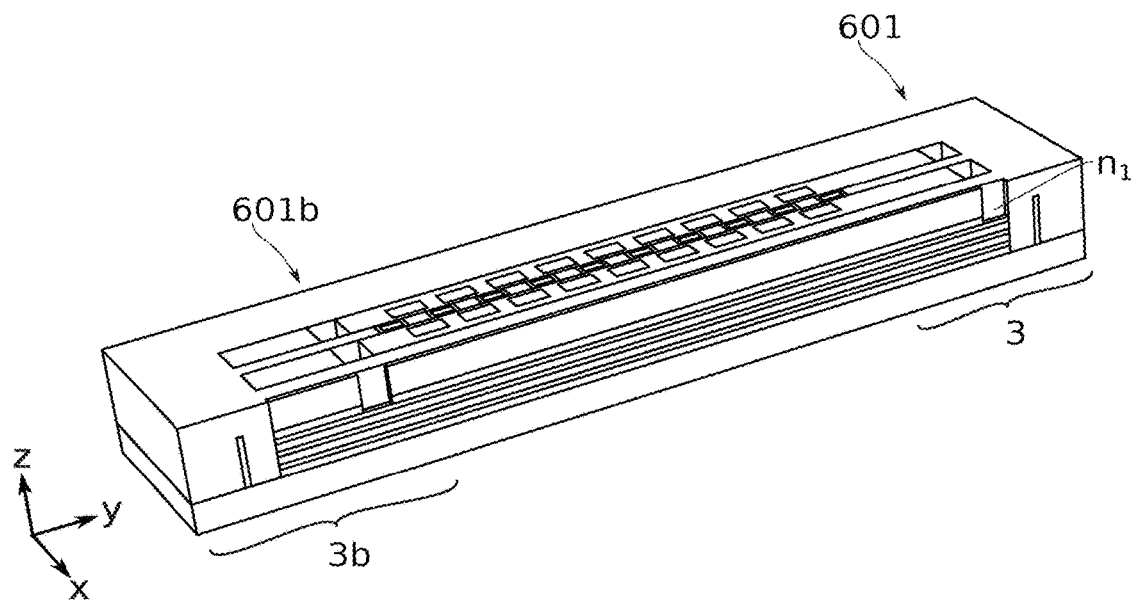

A first etching configured to reach and etch the first source level n1 is then performed (FIG. 16B).

Figure 16C:
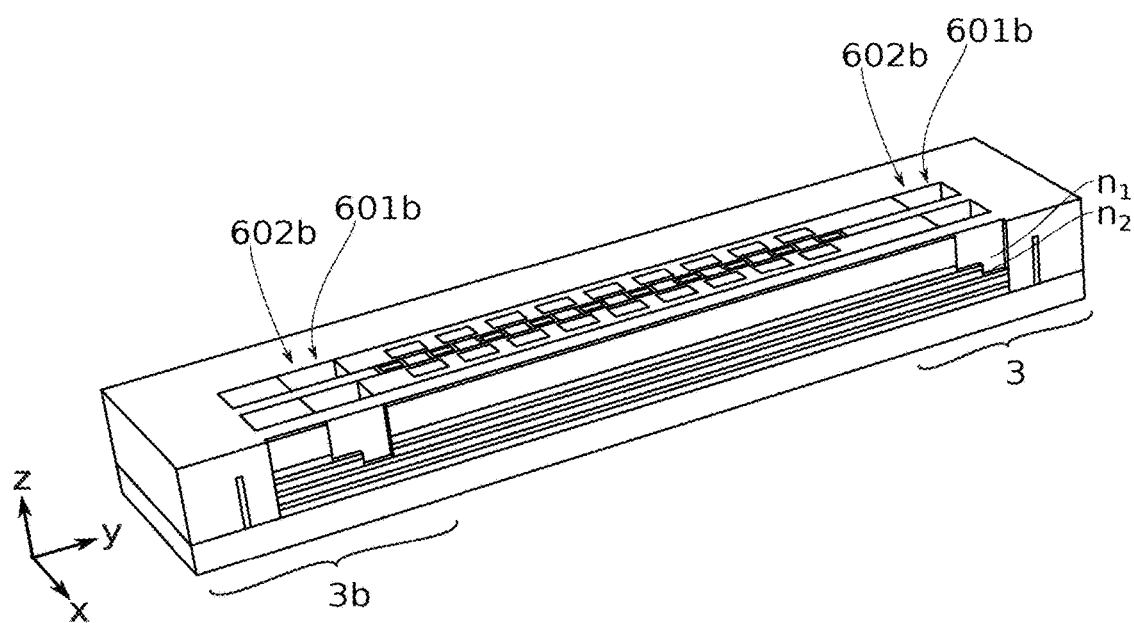

A second lithography can then make it possible to define a second line 601 of contact patterns, while keeping the first line 601 exposed. A second etching similar to the first etching is performed. This makes it possible to reach and etch simultaneously the first source level n1 at the second line 602 and the second source level n2 at the first line 601 (FIG. 16C).

A third lithography can then make it possible to define a third line 603 of contact patterns, while keeping the first and second lines 601, 602 exposed. A third etching similar to the first and second etchings is performed. This makes it possible to reach and etch simultaneously the first source level n1 at the third line 603, the second source level n2 at the second line 602 and the third source level n3 at the first line 601 (FIG. 16D).

Figure 16D:
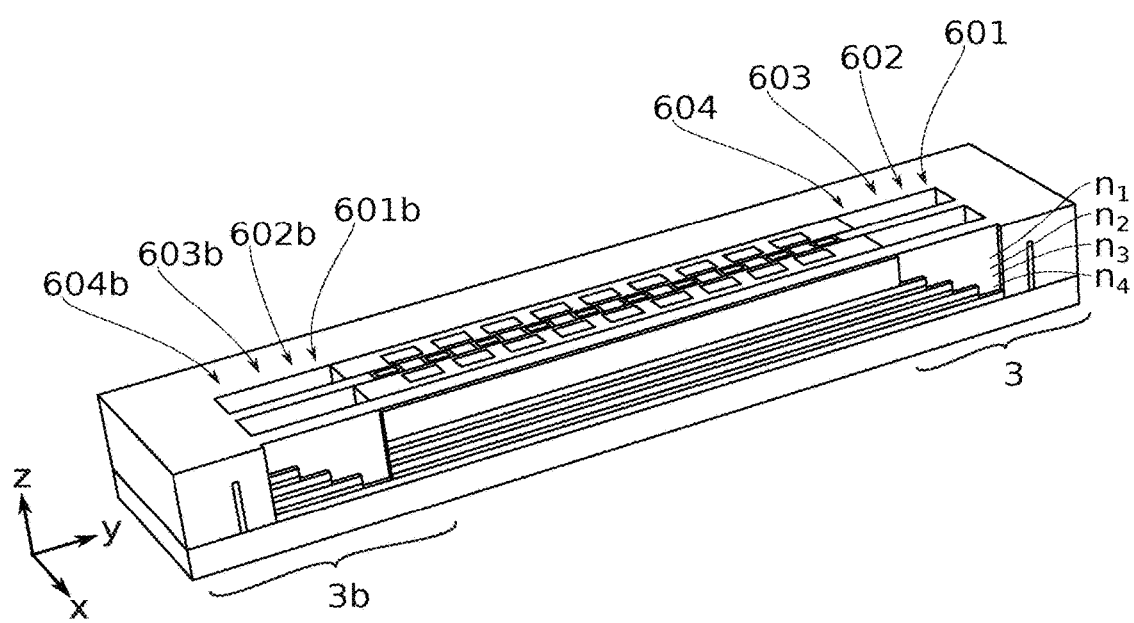

In the example illustrated here comprising four source levels n1, n2, n3, n4, a fourth and last lithography/etching makes it possible to reach and expose the first source level n1 at a fourth line 604 (FIG. 16D).

The four source levels n1, n2, n3, n4 are thus respectively exposed in a ladder at the lines 604, 603, 602, 601. This makes it possible then to form ladder contacts making it possible to collect the various source levels independently.

The source levels n1, n2, n3, n4 can be exposed via the lines 604, 603, 602, 601 in the sourceline zone 3, and optionally via the lines 604b, 603b, 602b, 601b in another sourceline zone 3b as illustrated in FIGS. 16B to 16D.

According to one possibility, reducing the dimension of the resin used during the lithography/etching, conventionally referred to as "trimming", can advantageously be used to reduce the number of lithography steps.

After having etched the various layers of Si/SiN in order to access the source levels, a nitride layer 701 with a thickness of between 5 nm and 20 nm, for example approximately 10 nm, is deposited in the sourceline zones 3, 3b. A thick layer of oxide $SiO_2$ 702 is next deposited on the whole of the structure and flattened by CMP, as illustrated in FIG. 17A.

Figure 17A:
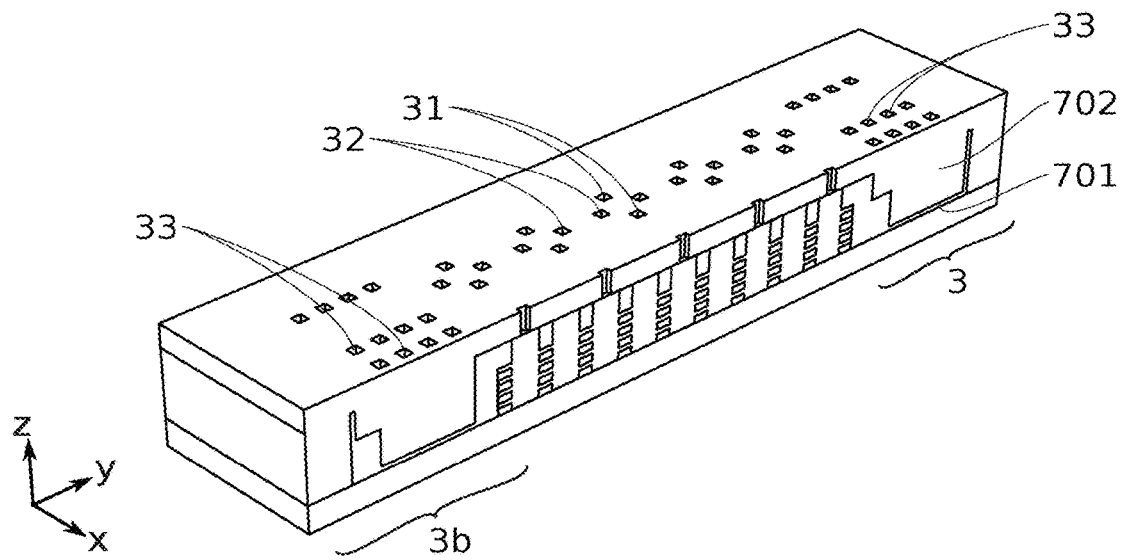
FIGS. 17A and 17B illustrate schematically steps of a method for manufacturing a microelectronic system according to a first embodiment of the present invention.

The contact holes 31, 32, 33 are next formed by lithography/etching through the oxide layer 702 (FIG. 17a). The contact holes 31 are dedicated to the connection of the wordlines with the gates of the selection transistors. The contact holes 32 are dedicated to the connection of the bitlines with the memory points. The contact holes 33 are dedicated to the connection of the sourcelines with the sources of the selection transistors.

The layer of nitride 701 serves as a stop layer for etching the contact holes 33 in the sourceline zones 3, 3b. The layers of tungsten of the functional gates and of the memory points serve as a stop layer for etching the contact holes 31, 32. The layer of nitride 701 is next etched at the contact holes 33 in order to expose the silicon of the sources.

Figure 17B:
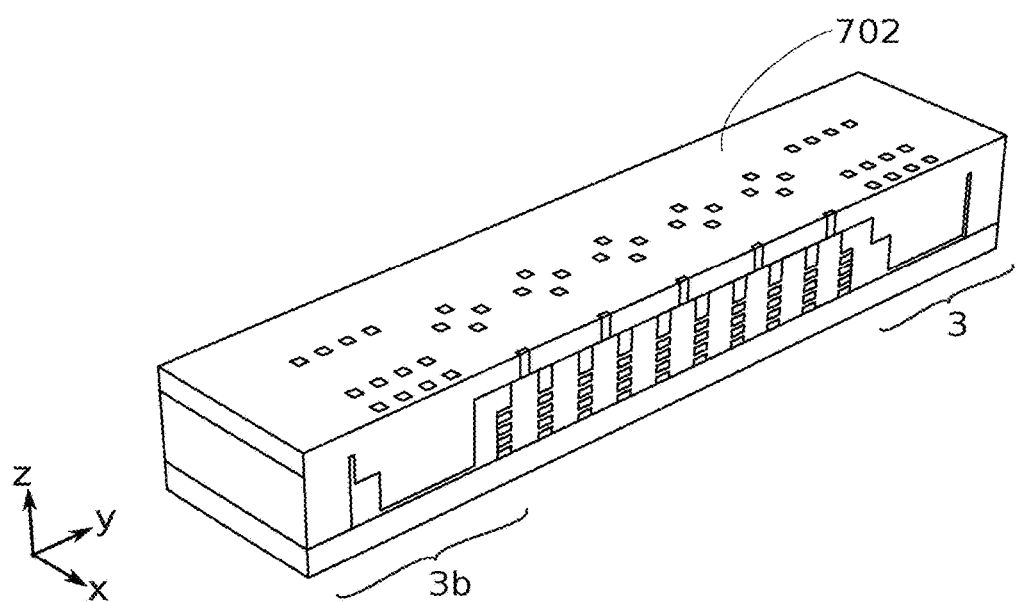

The contacts are then formed by filling the contact holes 31, 32, 33 by successive depositions of TiN with a thickness of approximately 7 nm and of tungsten W with a thickness of approximately 200 nm. Flattening by CMP with stoppage on the oxide layer 702 makes it possible to obtain a 3D matrix of integratable memory cells, as illustrated in FIG. 17B.

Figure 18:
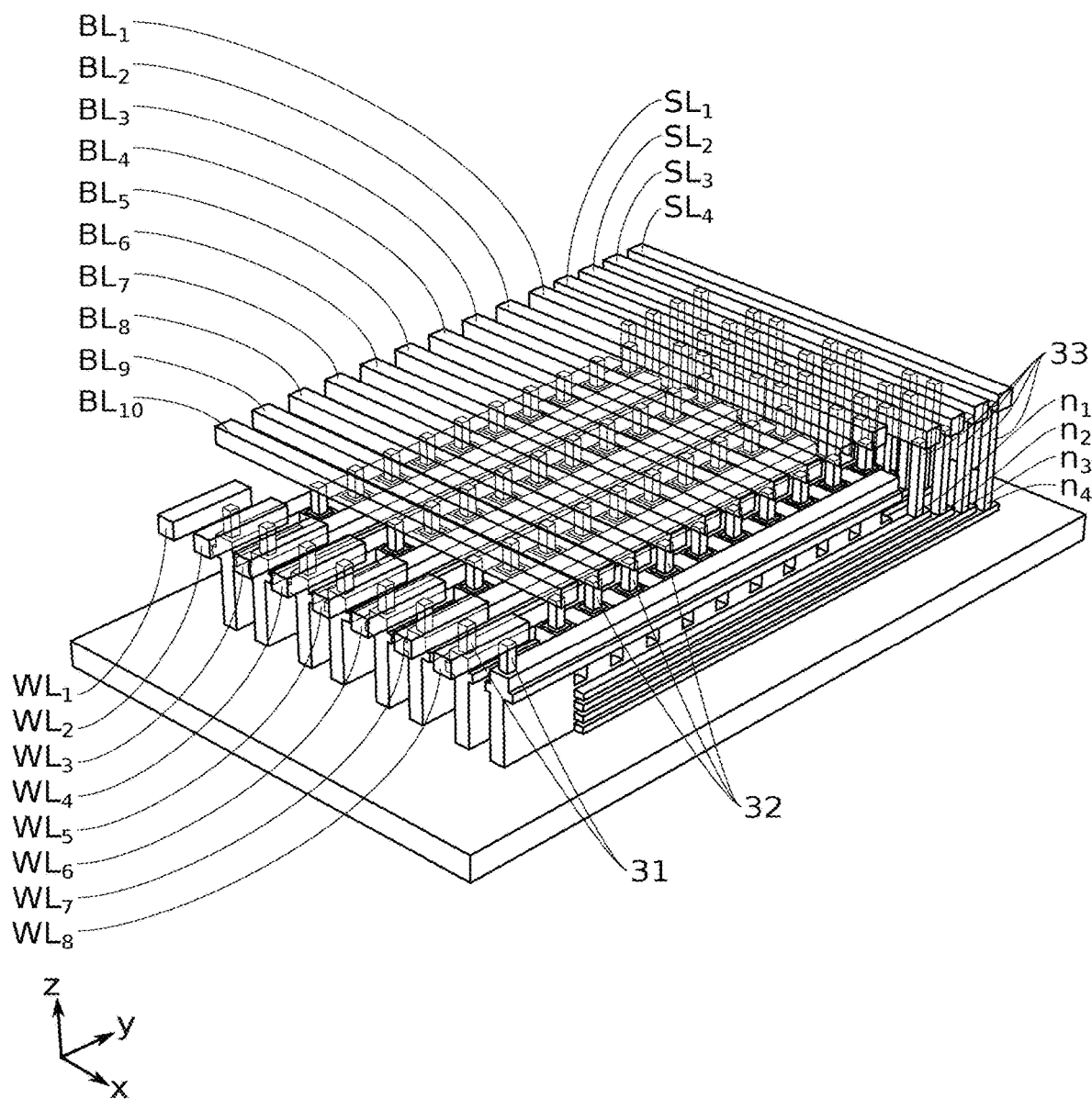
FIG. 18 illustrates schematically in perspective view a microelectronic system according to a first embodiment of the present invention.

FIG. 18 shows such a 3D matrix of memory cells without the layer 702, for more clarity. The sourceline contact lines SL1, SL2, SL3, SL4, wordlines contact lines $WL_1$, $WL_2$, $WL_3$, $WL_4$, $WL_5$, $WL_6$, $WL_7$, $WL_8$ and bitline contact lines $BL_1$, $BL_2$, $BL_3$, $BL_4$, $BL_5$, $BL_6$, $BL_7$, $BL_8$, $BL_9$, $BL_{10}$ are also visible in transparency in this FIG. 18. The contacts 31, 33 illustrated here correspond to another possibility of integration of the 3D matrix, slightly different from the one illustrated by FIGS. 17A, 17B. Obviously, these contacts can be defined according to various organisational planes, dependent on the integration constraints.

A second example embodiment of a resistive memory of the OxRAM type will now be described with reference to FIGS. 19 to 57 in the following section. Only the features distinct from the first example embodiment are described in detail below, the other features not described or partially described being deemed to be substantially identical to those of the first example embodiment.

Example 2

In this example, some manufacturing steps are reversed with respect to the concatenation of steps of the first example embodiment. This makes it possible to reduce the total number of steps. This also makes it possible to simplify the technical implementation of some parts of the 3D memory.

As before, on an SOI substrate comprising a silicon substrate denoted BULK, a thin layer of SiO₂ oxide denoted BOX, and a thin layer of Si denoted topSi, and thin layers of SiGe 11 and Si 12 are alternately formed by epitaxy.

Figure 19:
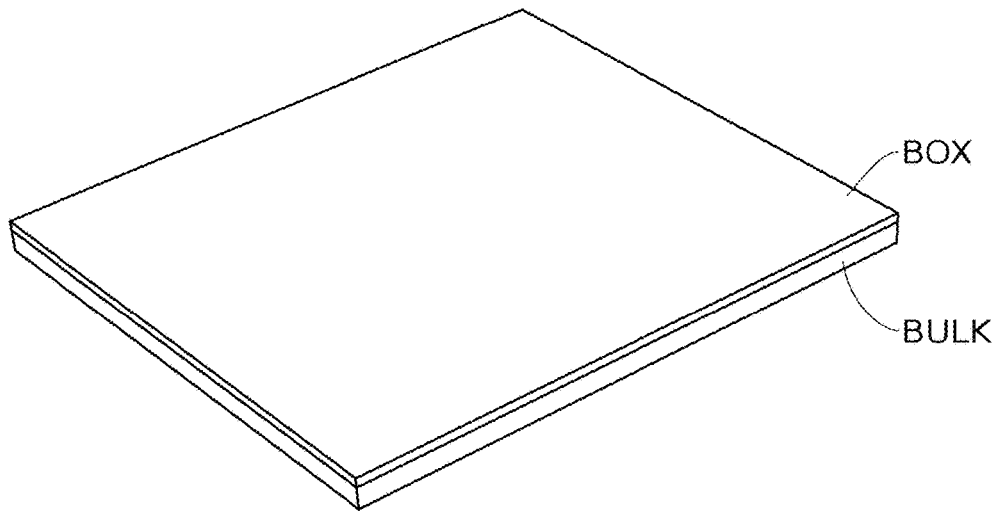
FIGS. 19 to 22 illustrate schematically in perspective view steps of manufacturing a microelectronic system according to a second embodiment of the present invention.

FIG. 19 illustrates solely the BULK and the BOX of the Si substrate.

Figure 20:
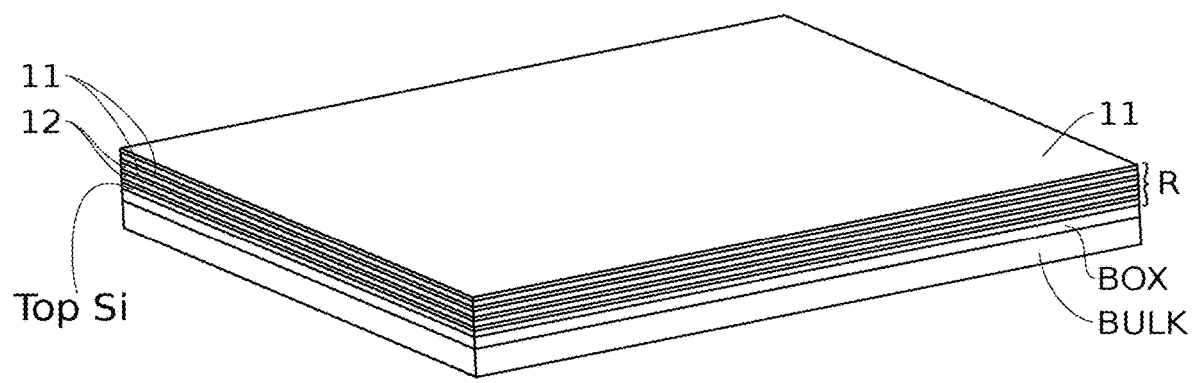

FIG. 20 illustrates the Si/SiGe superlattice denoted R, comprising the topSi and the alternating SiGe 11 and Si 12 layers.

Figure 21:
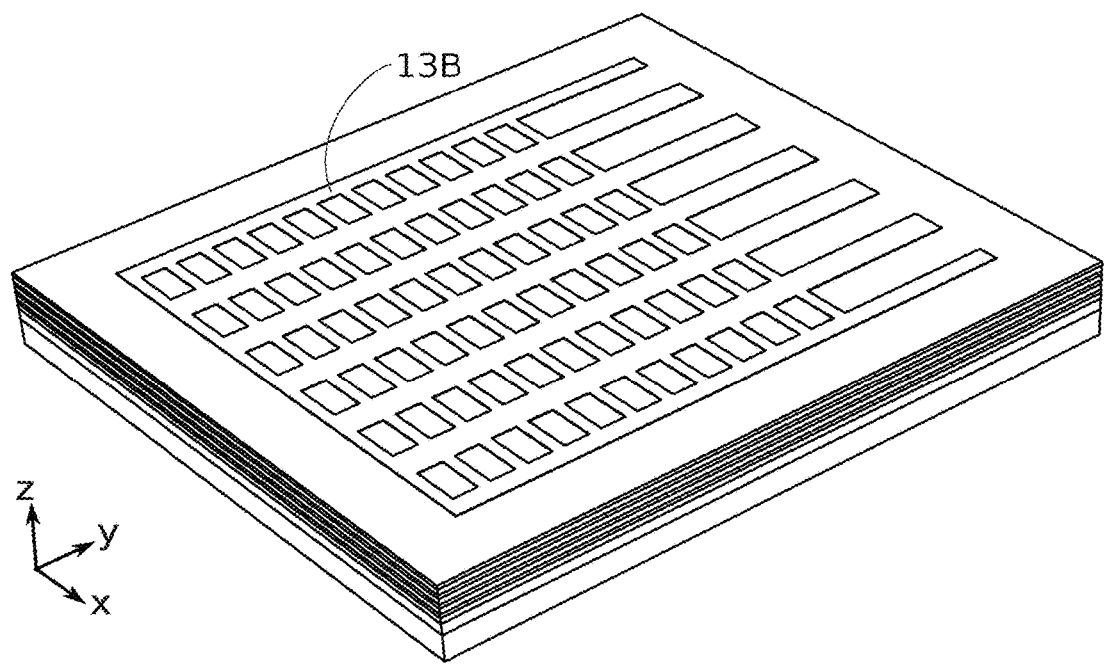

FIG. 21 illustrates a lithography step aimed at defining the various sourcelines, wordlines and bitlines zones by means of a first mask 13*b*.

Figure 22:
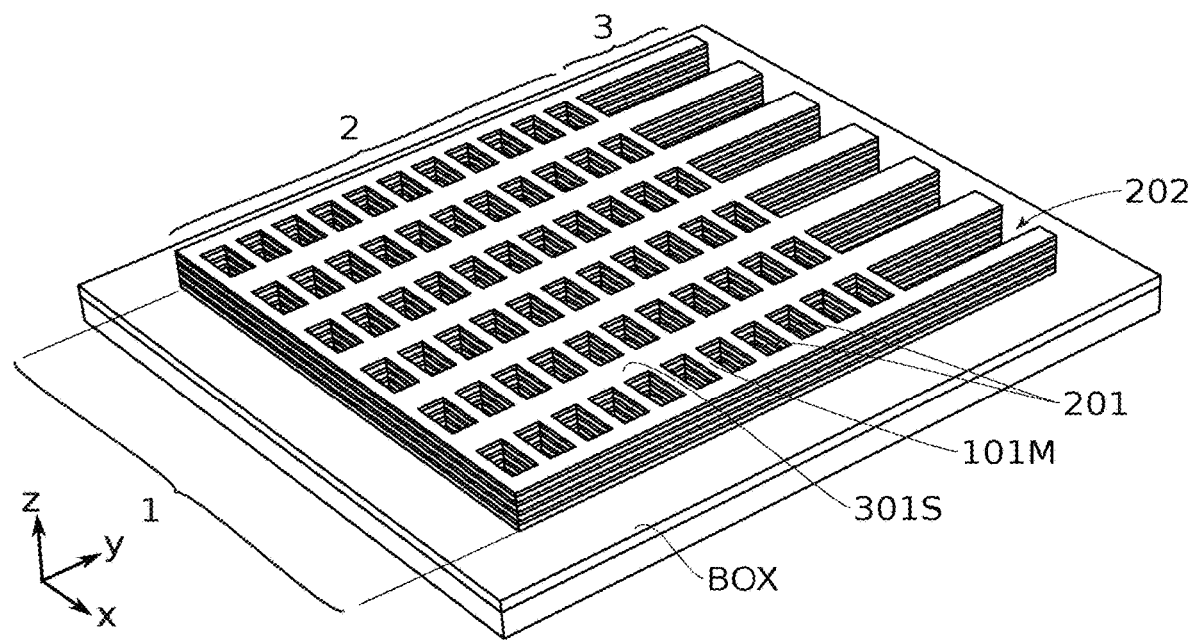

FIG. 22 illustrates the anisotropic etching along Z of the stack E with stoppage on the BOX. It can be carried out as before by plasma using HBr/O₂ etching chemistry. It makes it possible to define the transistor patterns 101M, the source patterns 301S and the openings 201, 202. The openings 202 in the sourcelines zone 3 are significantly wider than the openings 201 of the matrix defined by the wordlines 1 and bitlines 2 zones. This makes it possible to reserve sufficiently wide locations for forming the sourcelines contacts, in particular for the ladder sourcelines contacts.

Formation of the Contacts

In this example, the ladder contacts are formed prior to the other steps.

Figure 23:
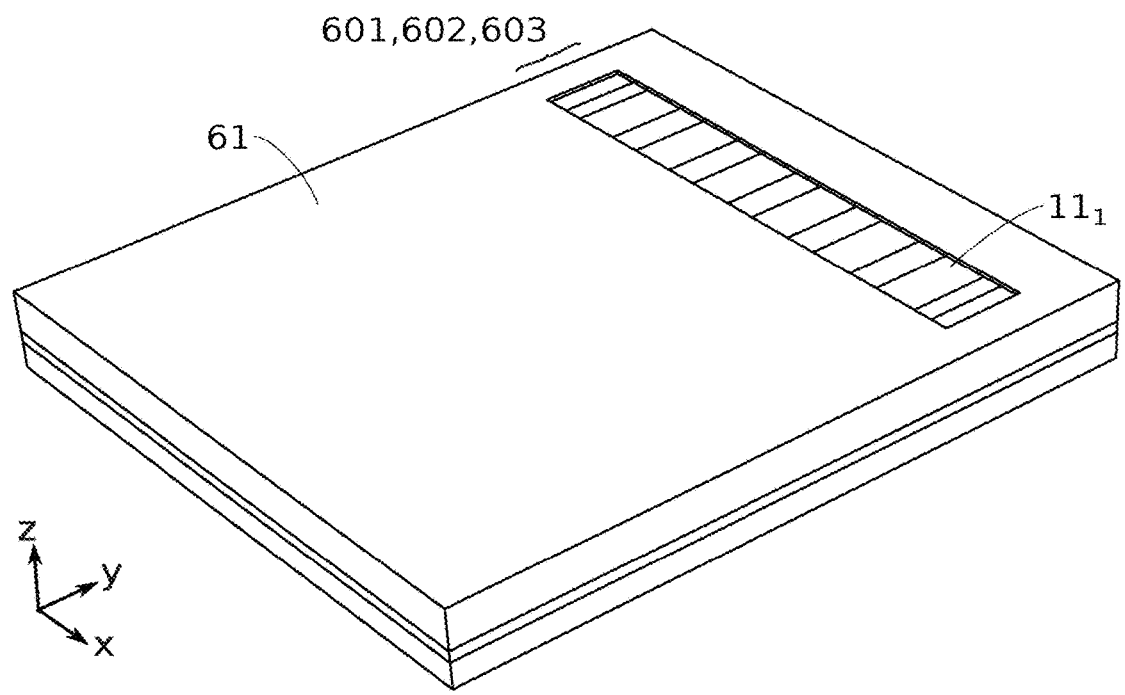
FIGS. 23 to 28 illustrate schematically steps of a method for manufacturing the zone of the sourcelines of a microelectronic system according to a second embodiment of the present invention, for producing ladder contacts.

FIG. 23 illustrates a lithography step aimed at forming contacts in the sourceline zone 3 of the 3D matrix. The contacts to be formed in the sourceline zone 3 are preferably ladder contacts. A sequence of lithography/etching steps then makes it possible, in a known fashion, to form such ladder contacts, on each of the source levels. Typically, a deposition of resin 61 is first of all carried out so as to cover all the sourceline 3, wordlines 1 and bitlines 2 zones structured previously. This makes it possible to protect the zones outside the zone of interest for forming ladder contacts. A first opening in the sourceline zone 3 making it possible to expose the SiGe layer 11₁ relative to the level n1, at the lines 601, 602, 603 of contact patterns, is defined by lithography (FIG. 23).

Figure 24:
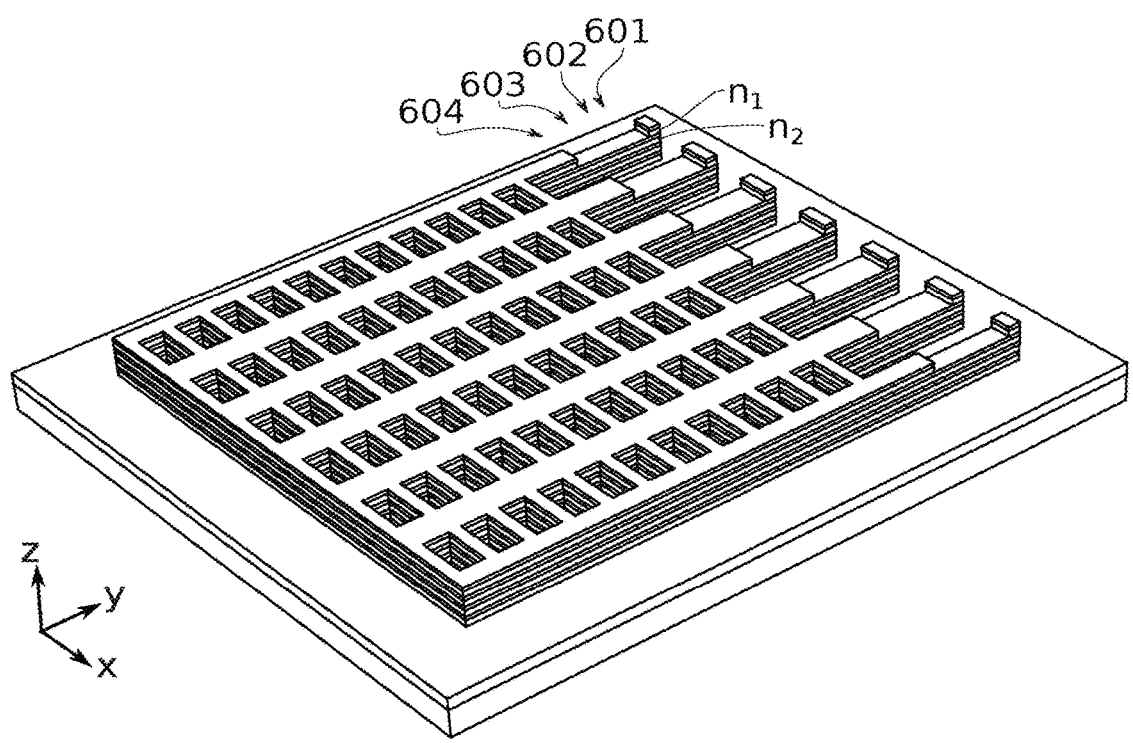
Figure 25:
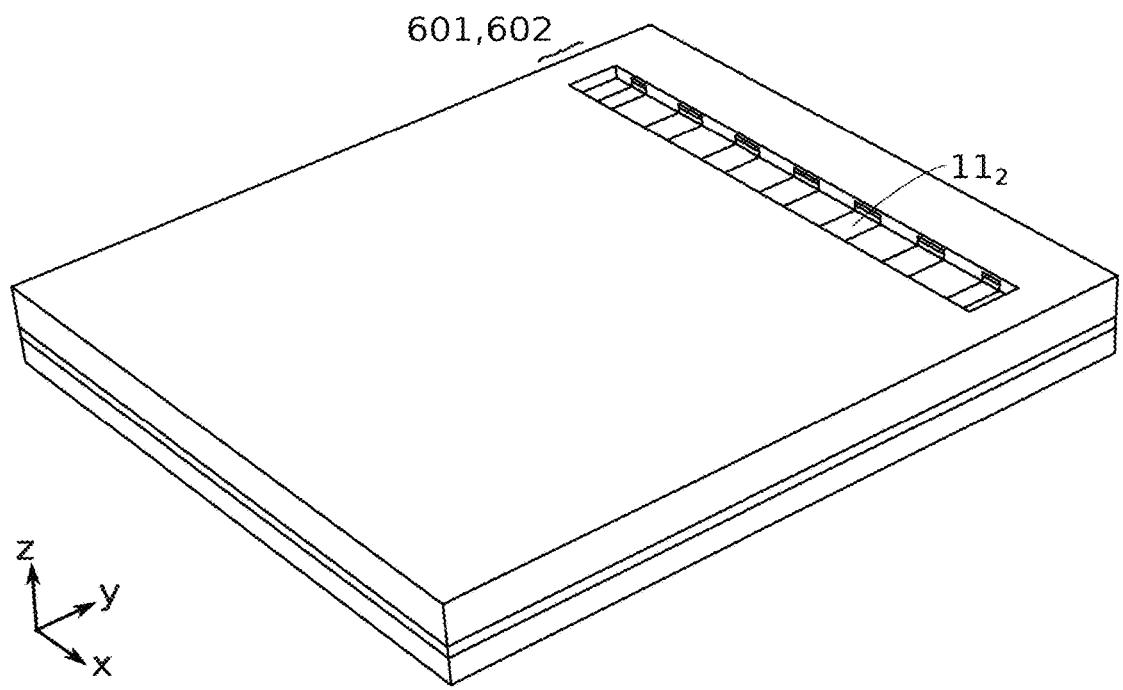

A first etching configured to reach and etch the first level n1 of Si is then carried out (FIG. 24).

Figure 26:
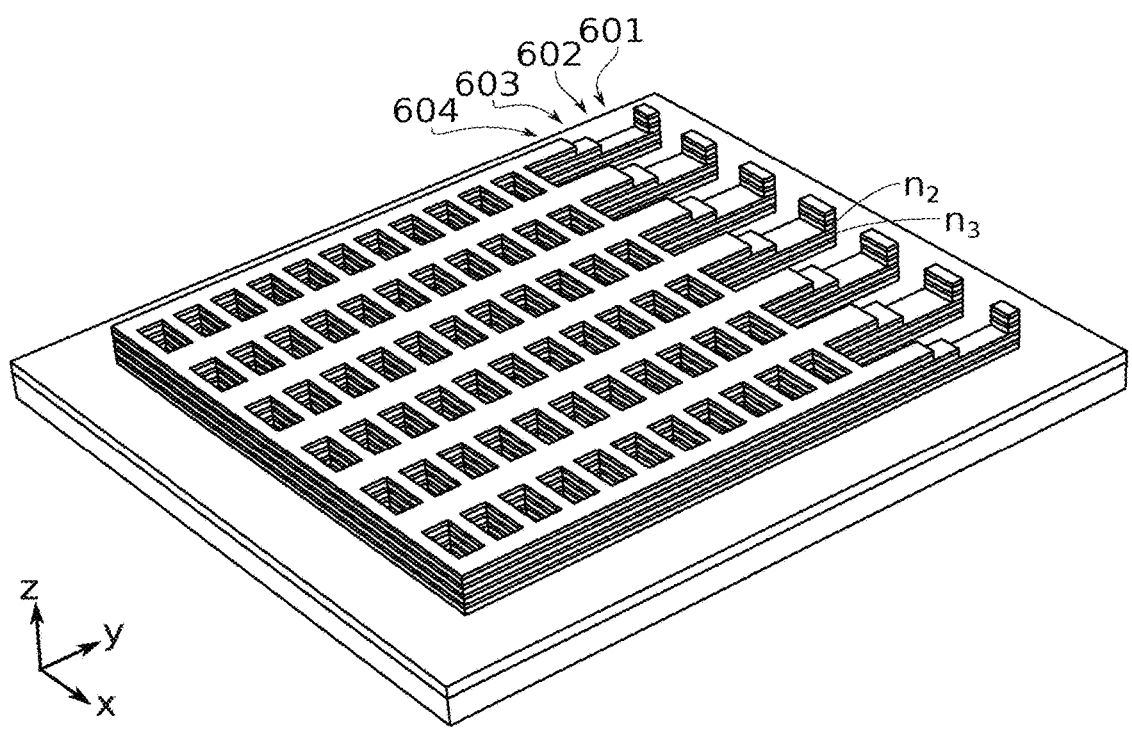
Figure 27:
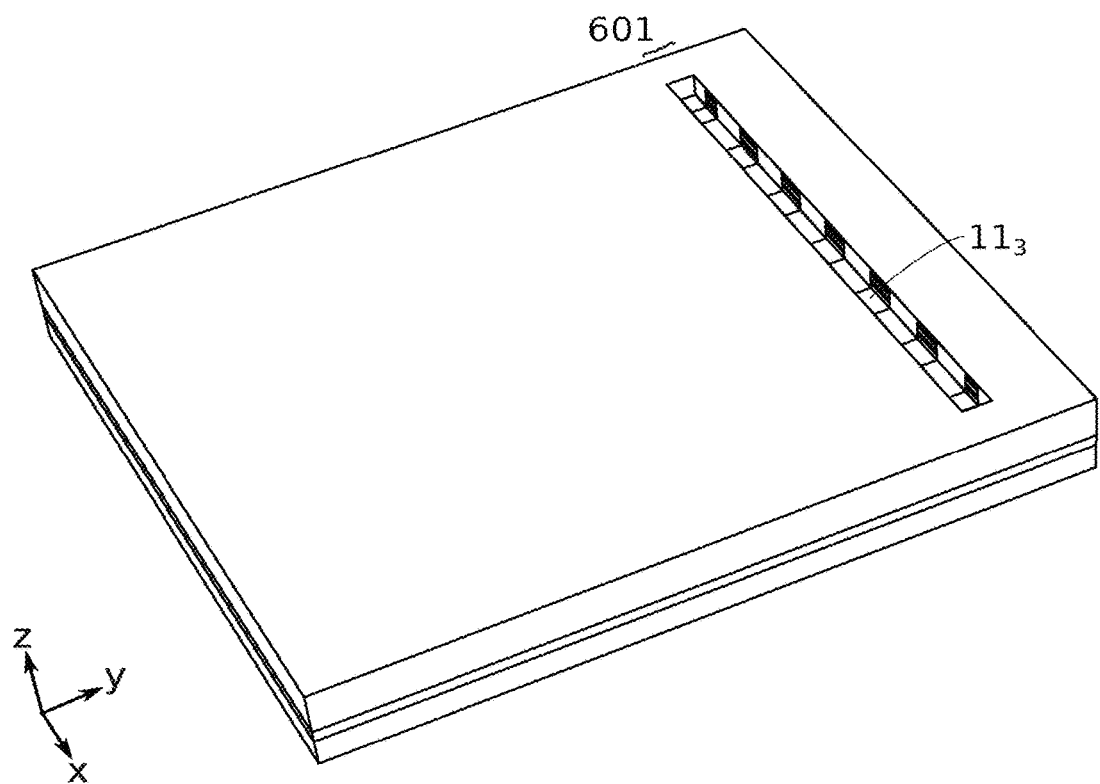

A second lithography (FIG. 25) can then define a second opening for exposing the SiGe layer 11₂ relative to the level n2, at the lines 601, 602, of contact patterns. A second etching similar to the first etching is carried out. This makes it possible to reach and etch the second level n2 of Si at the lines 601, 602 (FIG. 26).

A third lithography (FIG. 27) can then define a third opening for exposing the SiGe layer 11₃ relative to the level n2, at the line 601, of contact patterns. A third etching similar to the first and second etchings is carried out. This makes it possible to reach and etch the third level n3 of Si at the line 601 (FIG. 28).

Figure 28:
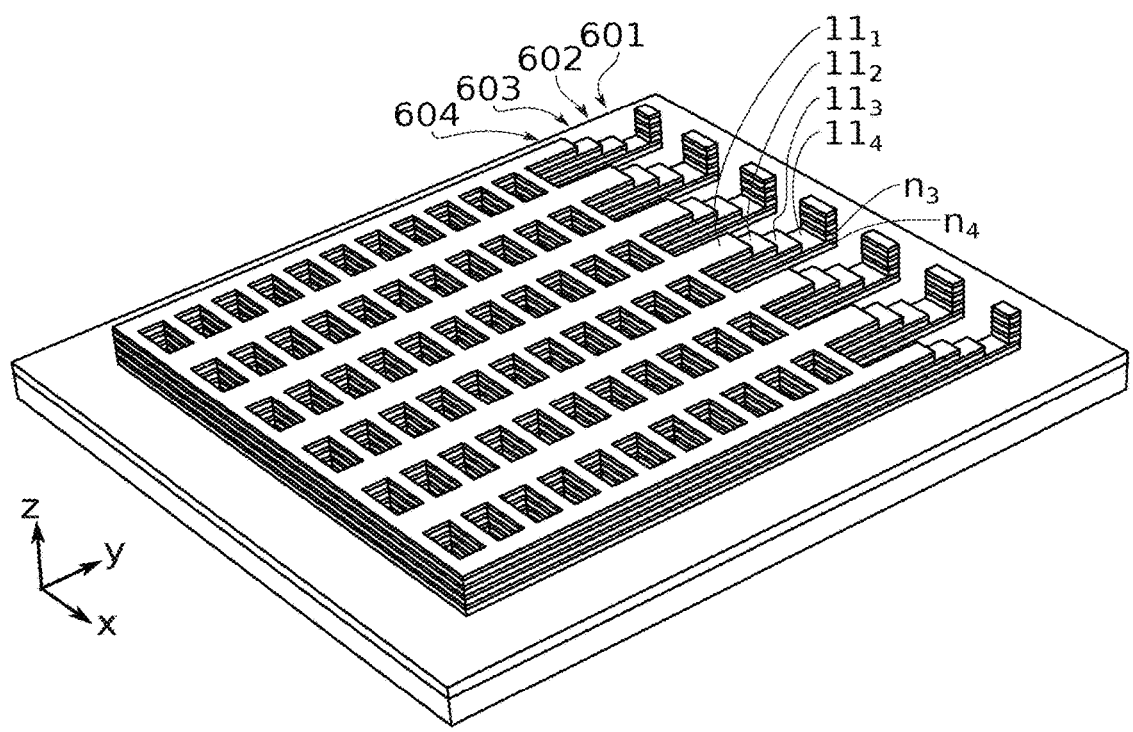

In the example illustrated here comprising four Si levels n1, n2, n3, n4, the SiGe layers 11₁, 11₂, 11₃, 11₄ are exposed in a ladder respectively at the lines 604, 603, 602, 601 of the sourcelines zone 3 (FIG. 28). A lithography/etching step is advantageously omitted in this second example embodiment, compared with the first example embodiment.

The resin 61 is not necessarily entirely removed and/or redeposited between each lithography/etching.

Formation of the Sacrificial Gates

FIGS. 29 to 33 illustrate steps of forming the sacrificial gates.

Figure 29:
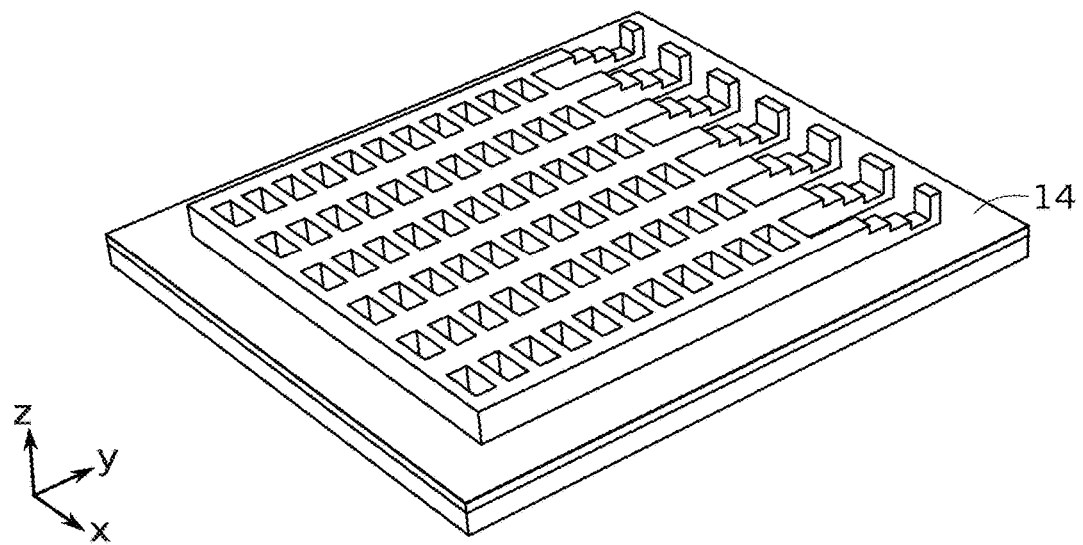
FIGS. 29 to 33 illustrate schematically in perspective view steps of manufacturing sacrificial gates of a microelectronic system according to a second embodiment of the present invention.
Figure 30:
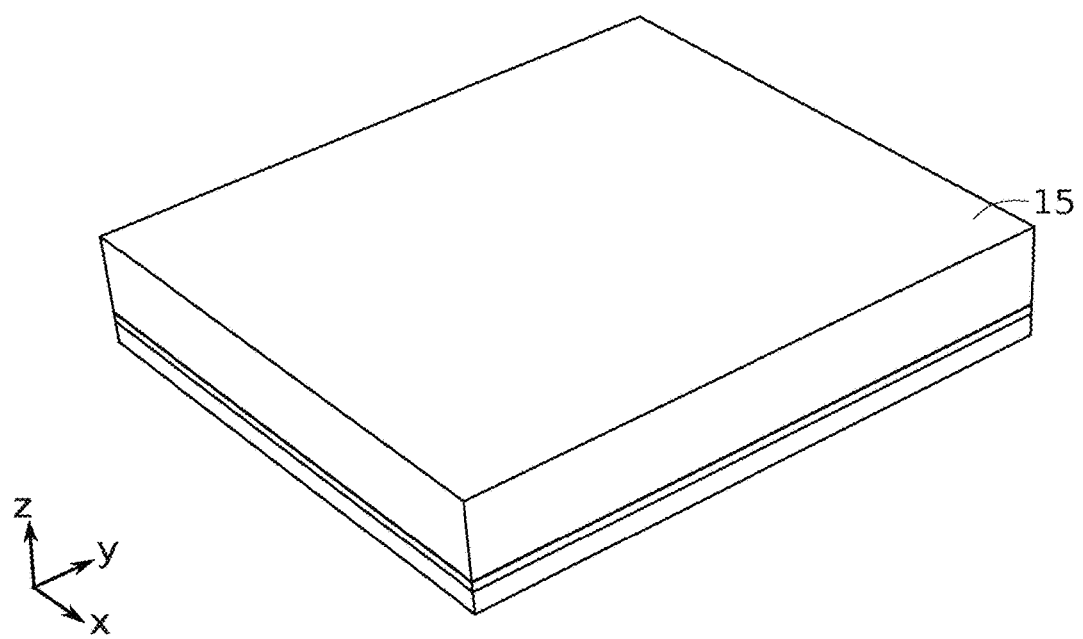

FIGS. 29 and 30 illustrate respectively steps of deposition of a layer 14 of silicon oxide SiO₂ and of a layer 15 of polycrystalline silicon (polySi). The thickness of SiO₂ deposited may typically be a few nanometres, for example 7 nm. The polySi is deposited so as to fill the openings 201, 202. The thickness of polySi deposited may typically be a few hundreds of nanometres, for example 380 nm. These successive deposits form an SiO₂/polySi stack similar to a conventional gate stack. Structuring this stack makes it possible to form these sacrificial gates.

Figure 31A:
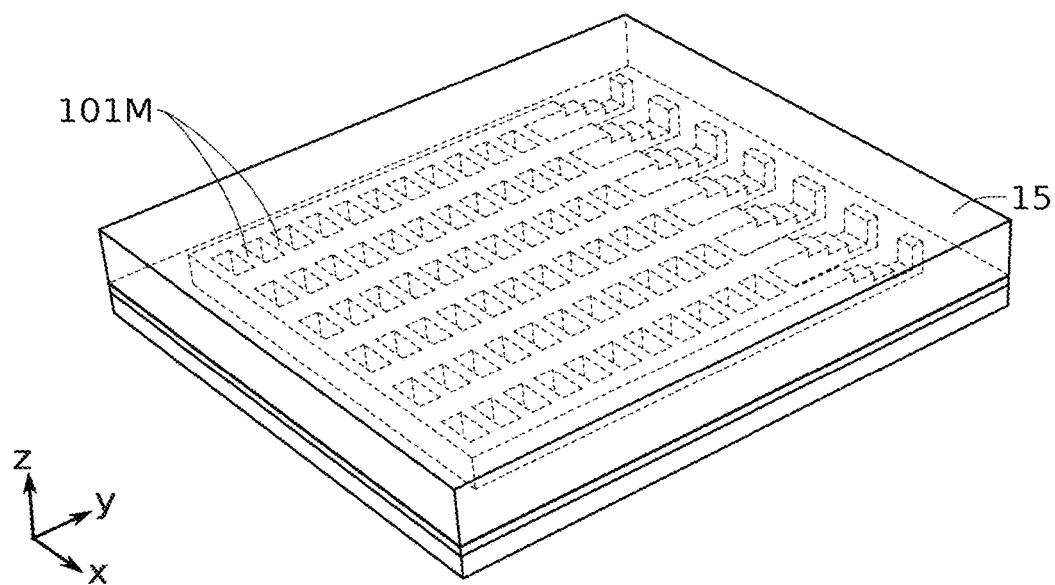

FIG. 31A illustrates a step of flattening the polySi 15, typically by mechanical chemical polishing CMP. This CMP can be stopped in time, for example after a few tens of seconds. The patterns 101M, 301S of the wordlines and bitlines zones, as well as the contacts structured in a ladder of the sourcelines zone, are visible by transparency through the flattened polySi layer 15.

Figure 31B:
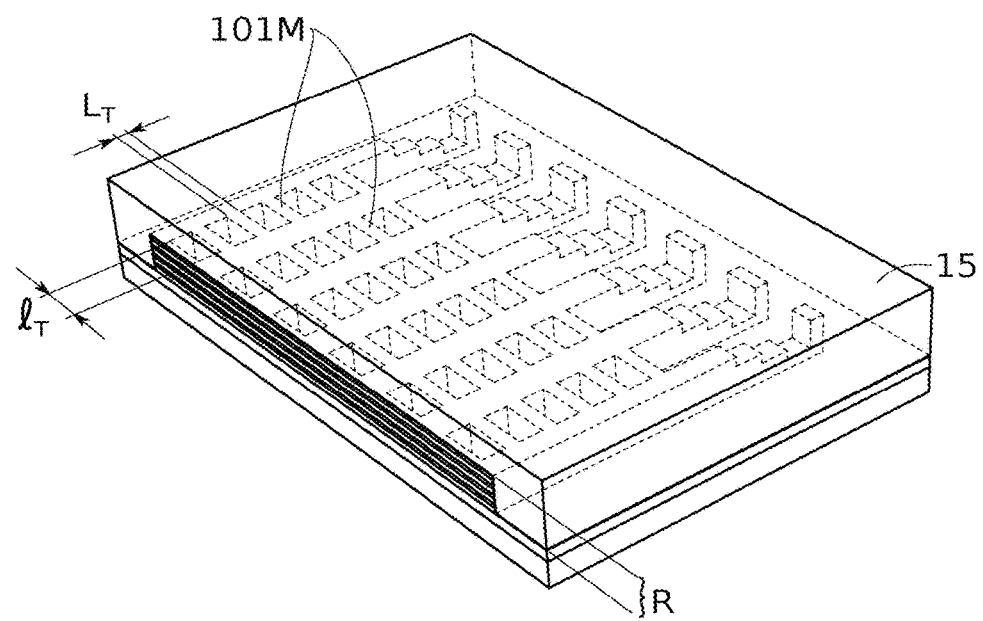

FIG. 31B is a view in cross section along XZ through the patterns 101M, of the structure obtained at the end of the step illustrated in FIG. 31A. The patterns 101M of length I_T and of width LT, formed in the superlattice R, are visible in this FIG. 31B.

Figure 32:
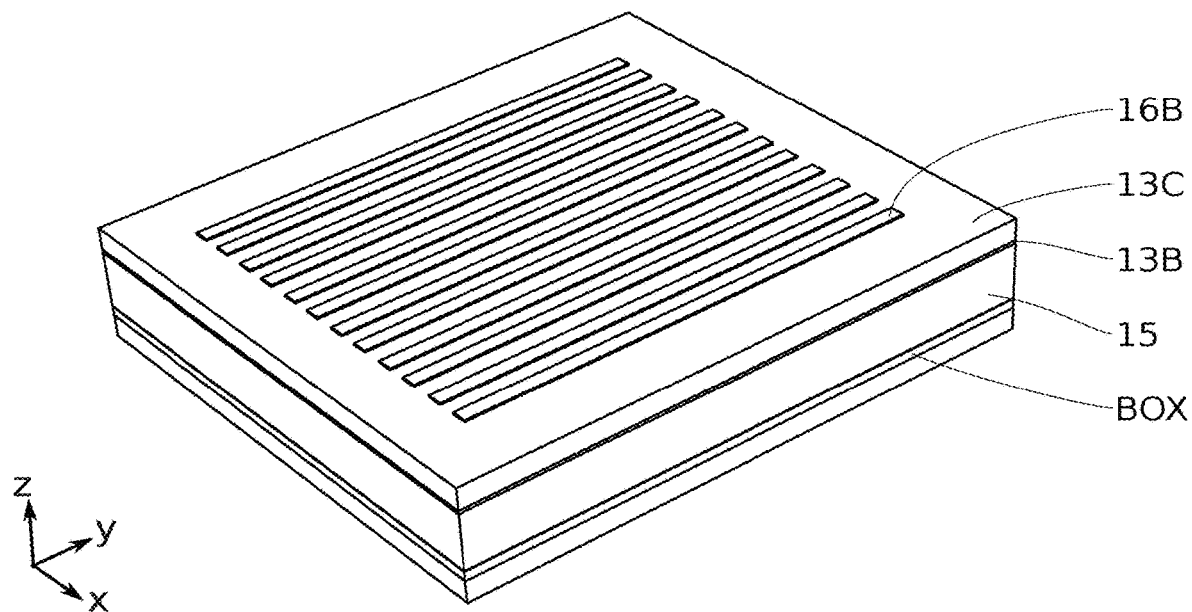

FIG. 32 illustrates a lithography step aimed at defining the sacrificial gates via a second mask 16B.

Previously, a layer of nitride 13*b* and a layer of oxide SiO₂ 13*c* are successively deposited on the flattened polySi layer 15.

Figure 33:
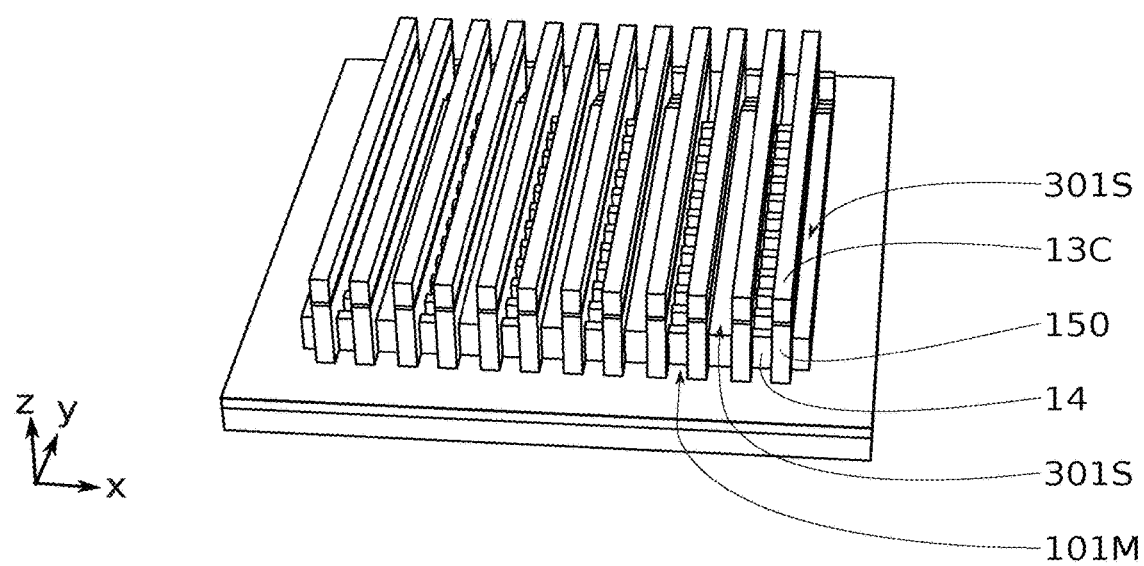

FIG. 33 illustrates the anisotropic etching along Z of the oxide 13C, of the nitride 13B and of the polySi 15. The layer 14 of TEOS and the buried oxide (BOX) advantageously serve as a stop layer during the etching of the polySi. The sacrificial gates 150 are thus formed straddling over the peripheral portions of the transistor patterns 101M. They extend mainly along Y and border along X the source patterns 301S, as before.

Figure 34:
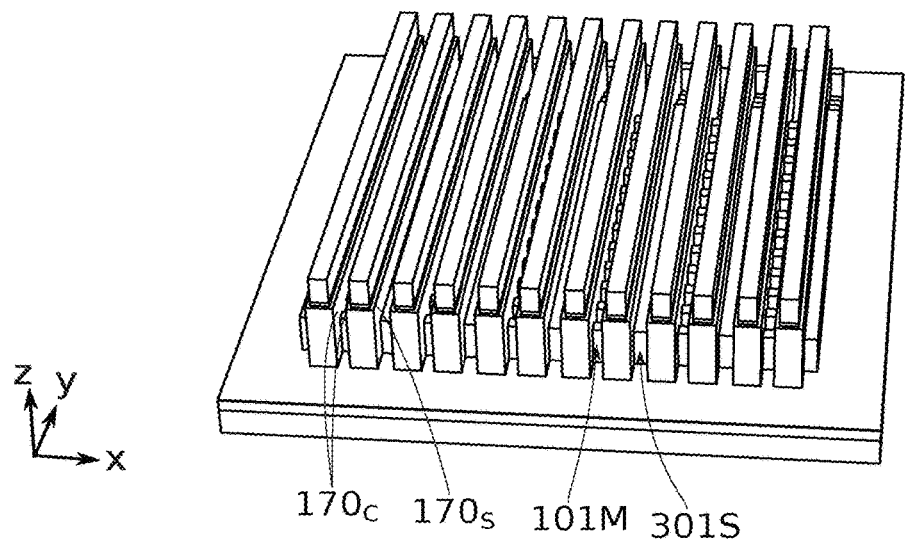
FIGS. 34 to 39 illustrate schematically in perspective view steps of manufacturing a microelectronic system aimed at insulating sources of transistors from each other, according to a second embodiment of the present invention.

FIG. 34 illustrates the formation of spacers 170*c*, 170*s* on either side of the sacrificial gates 150. These spacers are typically formed from a deposit of a standard layer of SiN followed by an anisotropic etching of this layer of SiN, as before. The source patterns 301S are thus partly covered by the spacers 170*s*. The transistor patterns 101M are thus partly covered by the spacers 170*c*.

Figure 35:
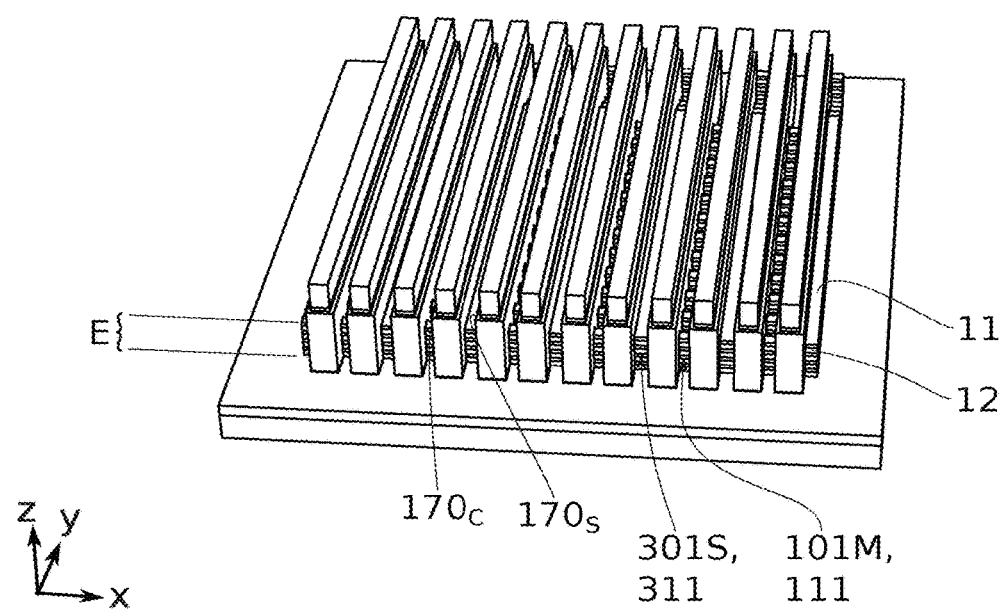

FIG. 35 illustrates the removal of the exposed parts of the layer 14 of TEOS oxide, after formation of the spacers 170*c*, 170*s*. This removal makes it possible to expose a central portion 111 of the transistor patterns 101M, between the spacers 170*c*, and a central portion 311 of the source patterns 301S between the spacers 170*s*.

Figure 36:
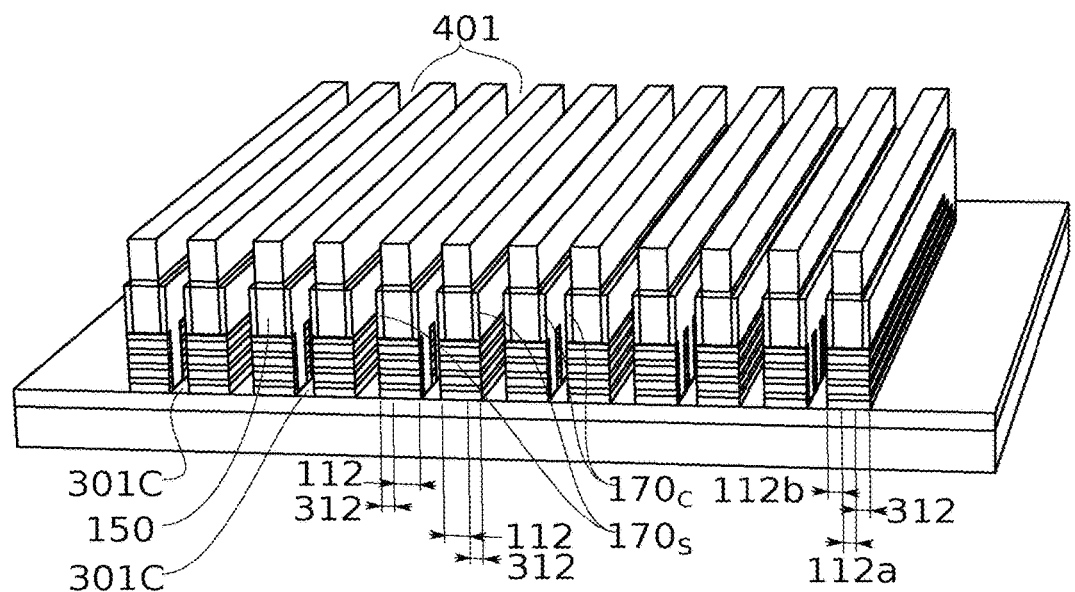

The central portions 111 and 311 are next etched anisotropically along Z, as far as the BOX, as illustrated in FIG. 36. This makes it possible to structure the Si/SiGe stack in the form of a comb.

Peripheral portions 312 of the source patterns 301S are preserved at the end of this etching, under the spacers 170*s*. These peripheral portions 312 are continuous along the axis Y. They form the body of the comb. A first side of these peripheral portions 312 emerges on the openings 401. A second side of these peripheral portions 312 is attached to the sacrificial gates 150. Preferentially, the layers Si of these peripheral portions 312 subsequently form the sources of the transistors.

Peripheral portions 112 of the transistor patterns 101M are also preserved at the end of this etching, under the sacrificial gates 150 and the spacers 170*c*. These peripheral portions 112 extend along X and emerge on the openings 301*c*. The peripheral portions 112 form the teeth of the comb. They are connected to each other by the peripheral portions 312.

Preferentially, the layers Si of these peripheral portions 112 will subsequently form the channels and drains of the transistors.

Insulation of the Sources

As before, in order to be able to independently address each of the transistors of the 3D matrix, it is necessary to insulate from each other the layers of Si of the various levels n1, n2, n3, n4. The SiGe layers are therefore preferably removed and replaced by electrically insulating layers.

Figure 37:
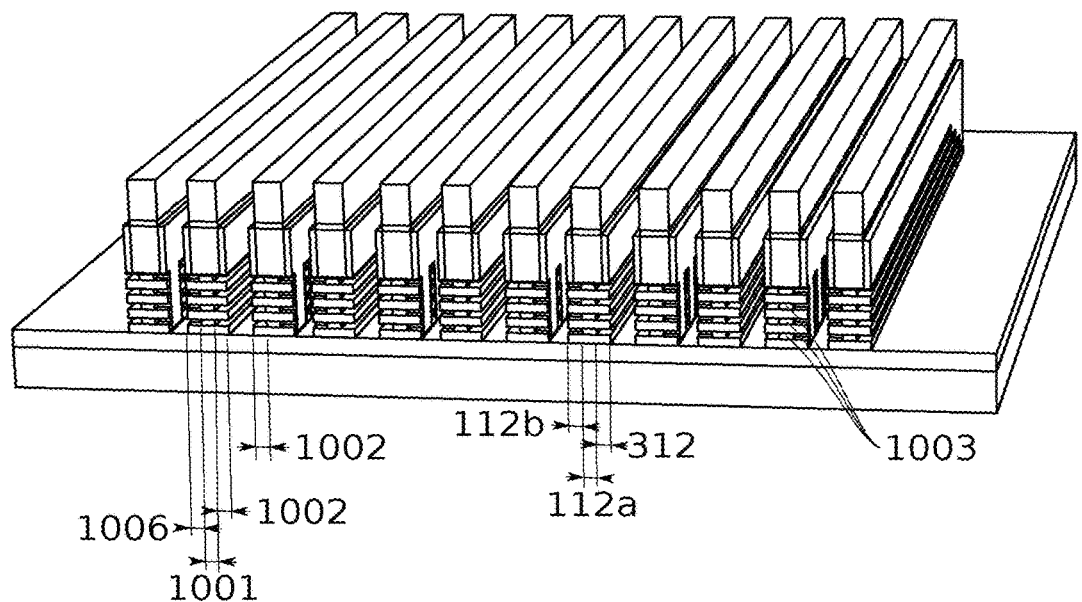

As illustrated in FIG. 37, the sources 1002 of the transistors correspond to the Si layers of the peripheral portions 312 of the source patterns 301S. In order to insulate these sources 1002 from each other, portions of the SiGe layers of the stack are etched as from the opening 401, 301c, as before.

The etching is configured so that the SiGe layers of the peripheral portions 312 are etched through the openings 401. The stopping of the etching front can be controlled in time, preferably substantially vertically in line with the sacrificial gates 150. The sources 1002 are consequently suspended.

The SiGe layers are also preferably etched through the openings 301c. The selective etching of the SiGe layers is thus done on either side of the stack, at the transistor patterns, as illustrated in FIG. 37. Parts 1006 of the Si layers of the peripheral portions 112b of the transistor patterns 101M are consequently suspended. These parts 1006 are in the form of wires and correspond substantially to the drains of the transistors.

The etching is preferably stopped before the SiGe layers are completely removed. Portions 1003 of SiGe are thus preserved between the Si layers of the peripheral portions 112a of the transistor patterns 101M. This makes it possible both to define the channels 1001 and/or the drains 1006 made from Si, and to prevent a risk of collapse of the Si layers. These portions 1003 are subsequently removed so as to form the all-around gates of the GAA transistors.

The polySi sacrificial gates make it possible in particular to maintain the Si layers during the SiGe etching. They form a structure of attachment pillars for the Si layers.

Figure 38:
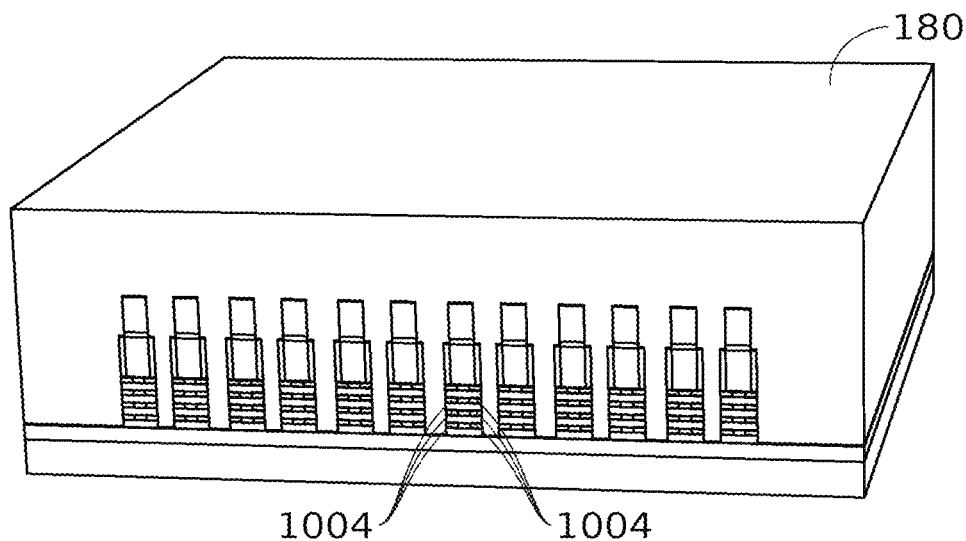

FIG. 38 illustrates the formation of dielectric plugs 1004, for example made from SiN, at the cavities formed by the removal of the SiGe, as before. The sources 1002 are thus electrically insulated from each other. The drains 1006 are also electrically insulated from each other.

Figure 39:
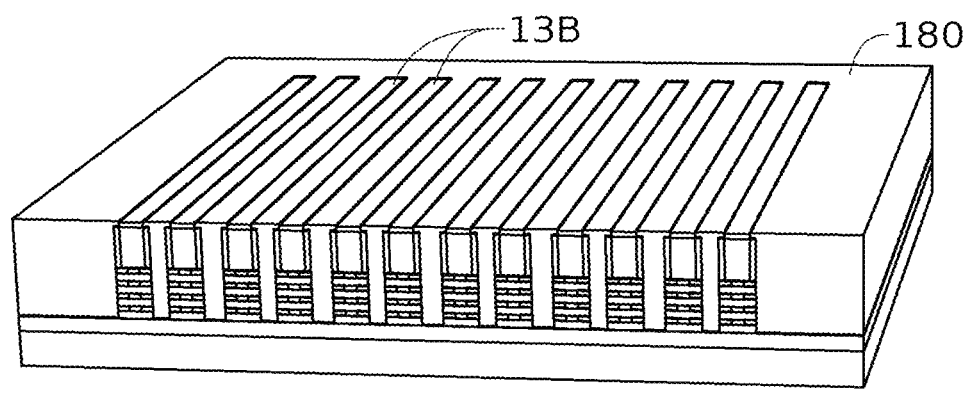

A layer of oxide 180 is next deposited so as to fill the openings 401, 301c (FIG. 38). This layer of oxide 180 is next flattened by CMP with stoppage on the parts 13B of the SiN hard mask, as illustrated in FIG. 39.

Figure 40:
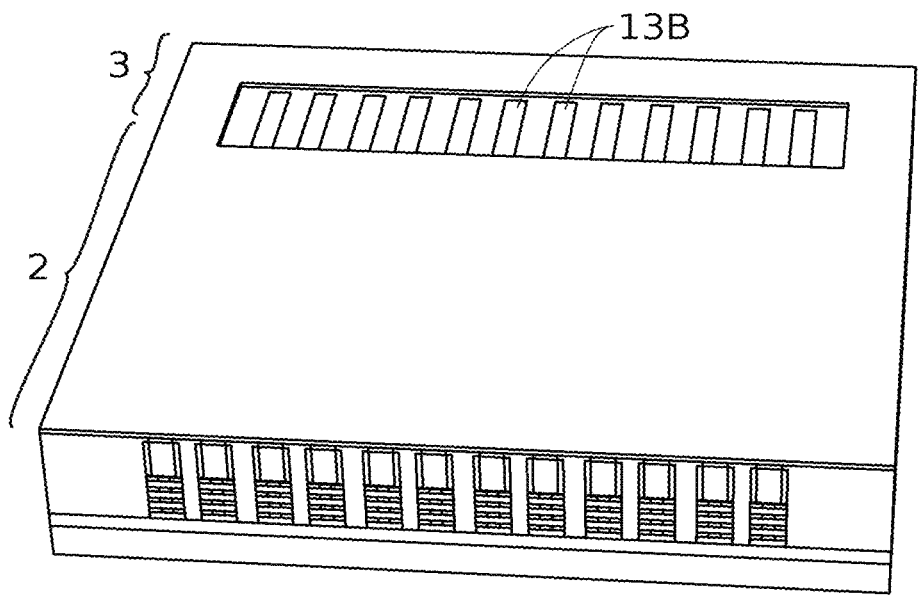
FIGS. 40 to 45 illustrate schematically steps of a method for manufacturing the zone of the sourcelines of a microelectronic system according to a second embodiment of the present invention.
Figure 41:
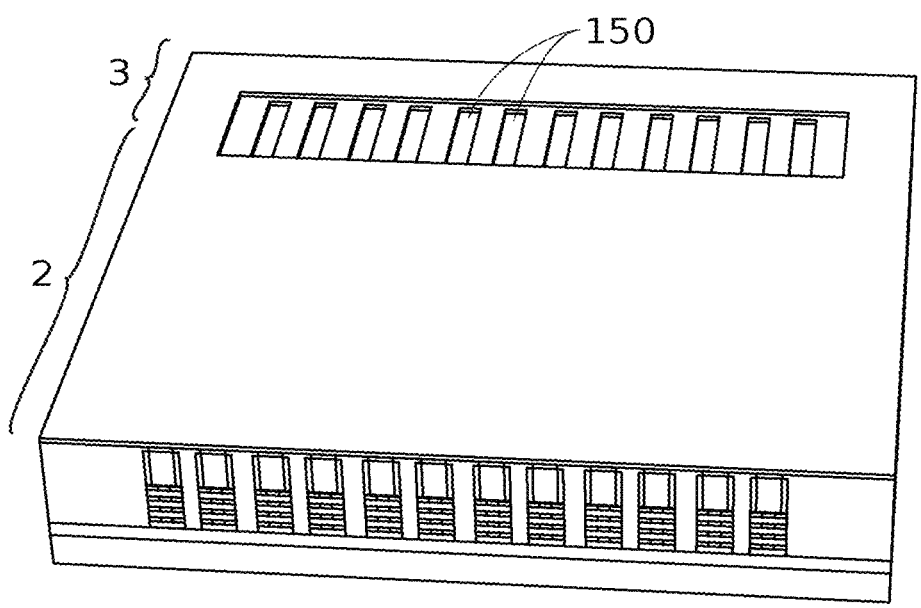

A lithography step is performed so as to protect the bitlines zone 2 and to expose the sourcelines zone 3 (FIG. 40). The hard mask 13b is removed in this sourcelines zone 3, so as to expose the sacrificial gates 150 at the sourcelines zone 3 (FIG. 41).

Figure 42:
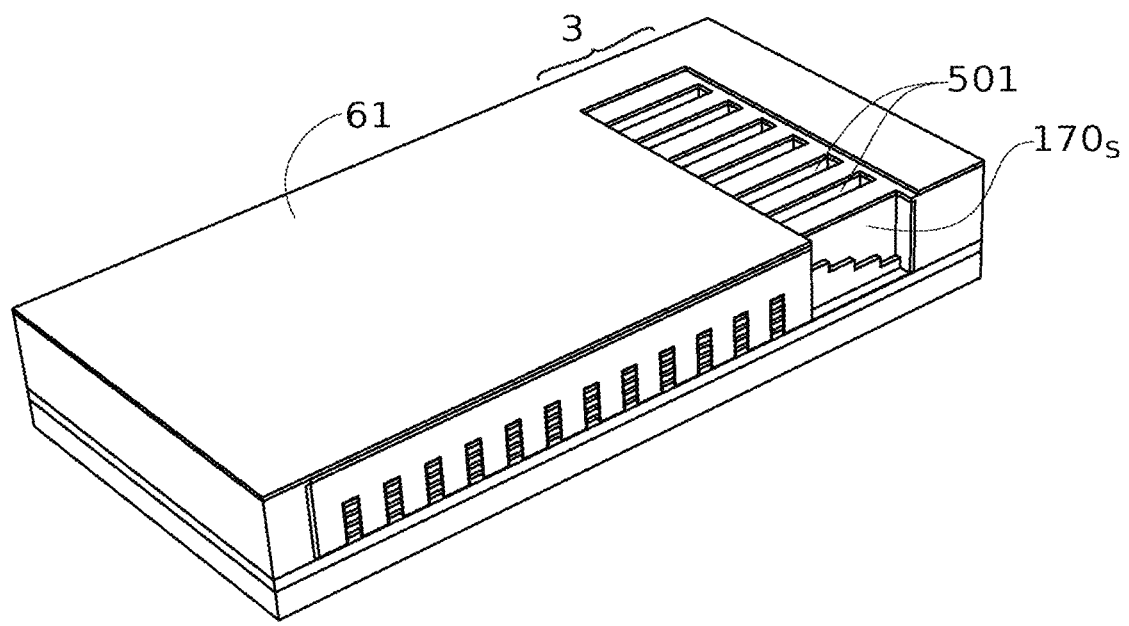

The sacrificial gates 150 of the sourceline zone 3 are next removed, as illustrated in FIG. 42. The polySi of the sacrificial gates can be etched by means of a TMAH or TEAH solution, or by anisotropic plasma etching, for example based on $CH_2F_2/SF_6/N_2/He$ and $HBr/O_2/He$ chemistries. In the example illustrated in FIG. 42, removing the sacrificial gates 150 forms openings 501. These openings 501 emerge on the ladder contacts connected to the sources 1002 (not visible). The openings 501 are bordered by the spacers 170c, 170s.

Figure 43:
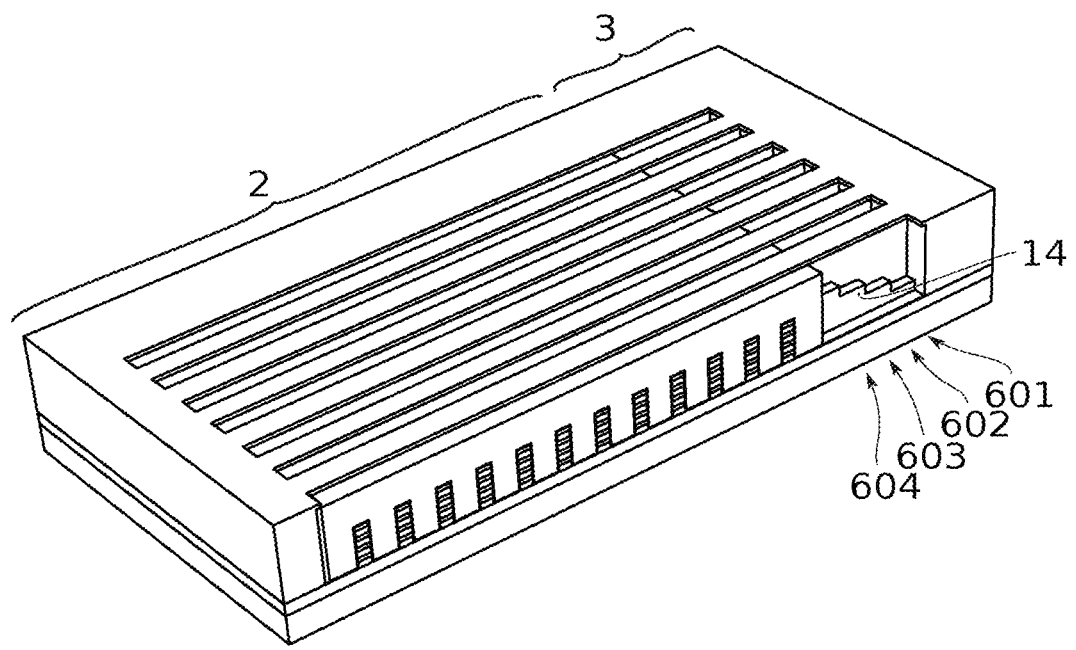
Figure 44:
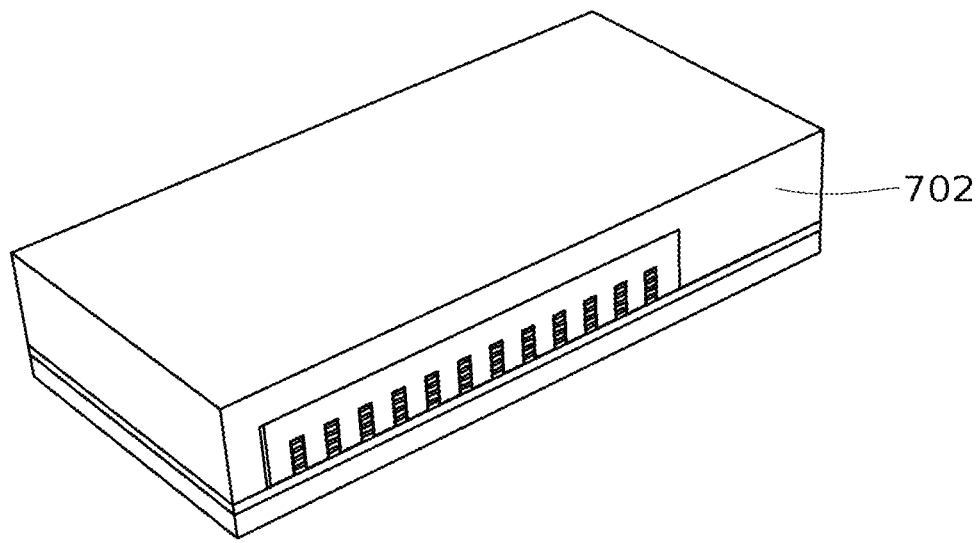

The resin 61 is next removed so as to expose the bitline zone 2. The nitride of the hard mask 13b in the bitlines zone 2 and spacers 170c, 170s in the sourceline zone 3 is next etched, as illustrated in FIG. 43. This makes it possible to leave clear the sources 1002 structured in a ladder and covered with the oxide 14 in the sourcelines zone 2. The lines 604, 603, 602, 601 of contact patterns, each corresponding to a step of the ladder contacts, are also shown in FIG. 43.

Figure 45:
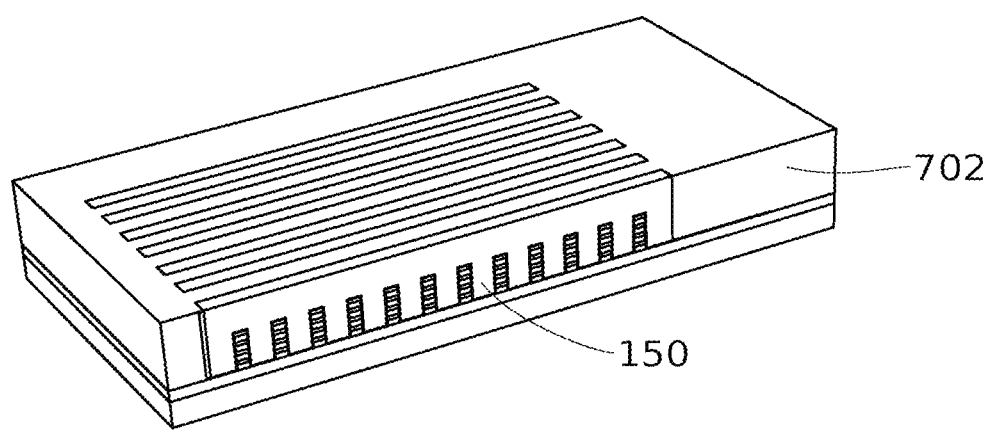

A thick layer of oxide $SiO_2$ 702 is next deposited on the whole of the structure (FIG. 44) and flattened by CMP with stoppage on the tops of the sacrificial gates 150 (FIG. 45).

Structuring of the Wordlines Zone

Figure 46:
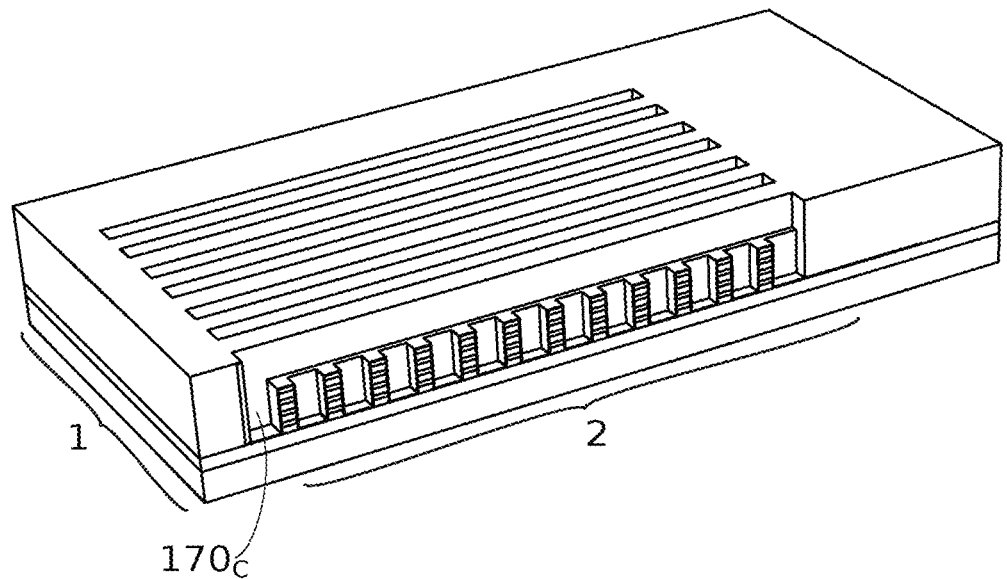
FIGS. 46 to 49 illustrate schematically steps of a method for manufacturing the zone of the wordlines of a microelectronic system according to a second embodiment of the present invention.
Figure 47:
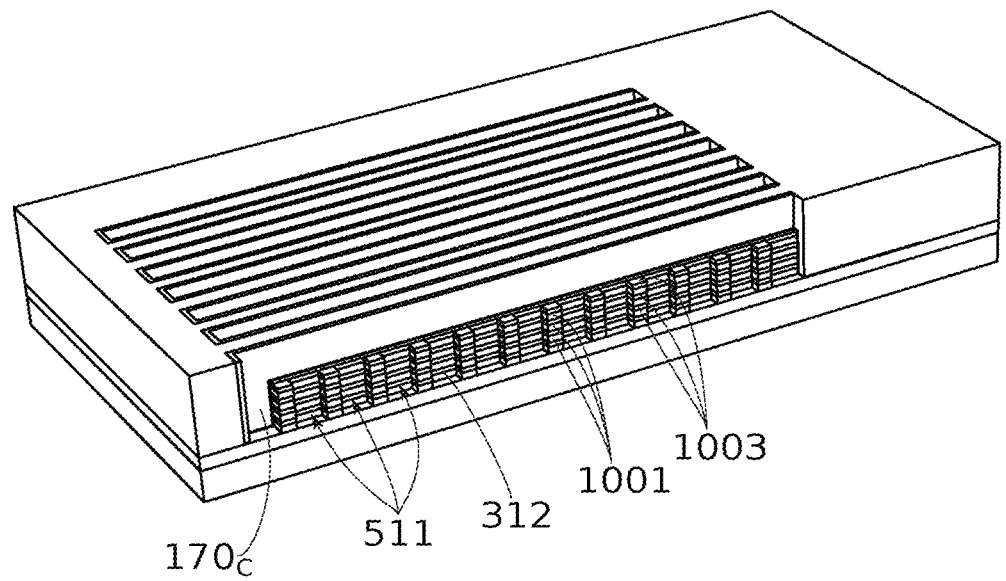

FIGS. 46 and 47 illustrate the removal of the sacrificial gates 150 from the wordlines zone 1, as before. The polySi (FIG. 46) and then the TEOS (FIG. 47) are successively removed.

In the example illustrated in FIG. 47, removing the sacrificial gates 150 forms openings 511. These openings 511 are bordered along XZ by stacks formed by the Si channels 1001 and the SiGe portions 1003. These openings 511 are bordered along YZ by the peripheral portions 312 comprising the stack of the sources 1002 insulated from each other, and by the spacers 170c (not visible) opposite said peripheral portions 312.

Figure 48:
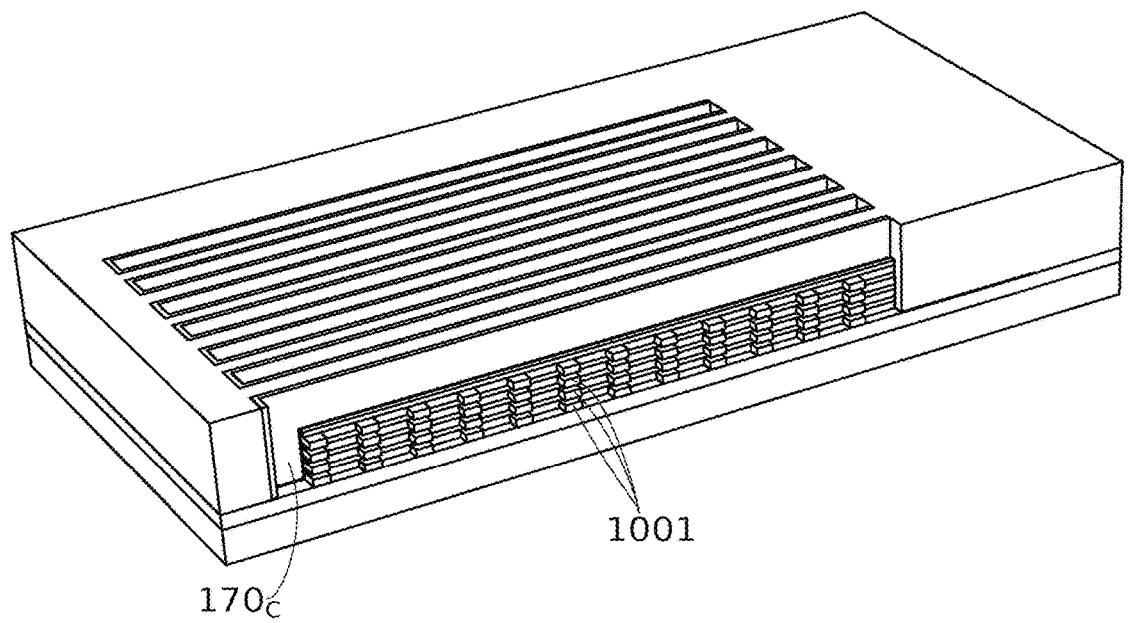

FIG. 48 illustrates the selective etching of the portions 1003 of SiGe, as before. This etching makes it possible to etch the SiGe while preserving the channels 1001 in the form of Si nanowires and the parts of the sources 1002 exposed at the peripheral portions 312. At the end of the etching, the channels 1001 of the transistors made from Si are suspended between the openings 511 of the same wordline $WL_x$.

Figure 49:
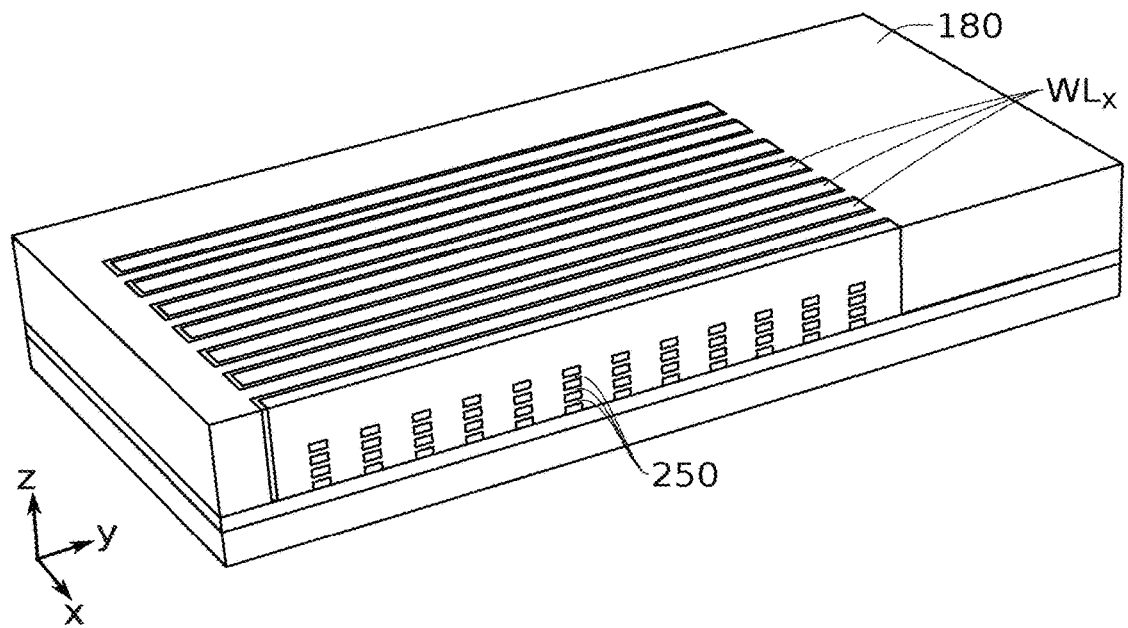

FIG. 49 illustrates the formation of the functional gates in place of the sacrificial gates. Successive depositions of materials used for forming functional gates make it possible to form the functional gates 250 around each channel 1001, as before. These functional gates may be formed from a deposition of material with a high dielectric constant, referred to as high-k, for example $HfO_2$, over a thickness of 2 nm, followed by a deposition of TiN over a thickness of 3 nm, followed by a deposition of tungsten W aimed at filling the openings 511 and the wordlines $WL_x$ delimited by the TEOS oxide 180. A flattening by CMP with stoppage on the TEOS oxide 180 makes it possible as required to remove the excess metal layers. The wordlines $WL_x$ are thus defined. The transistors of the 3D matrix are gate-all-around MOS transistors based on stacked Si nanowires.

Figure 50:
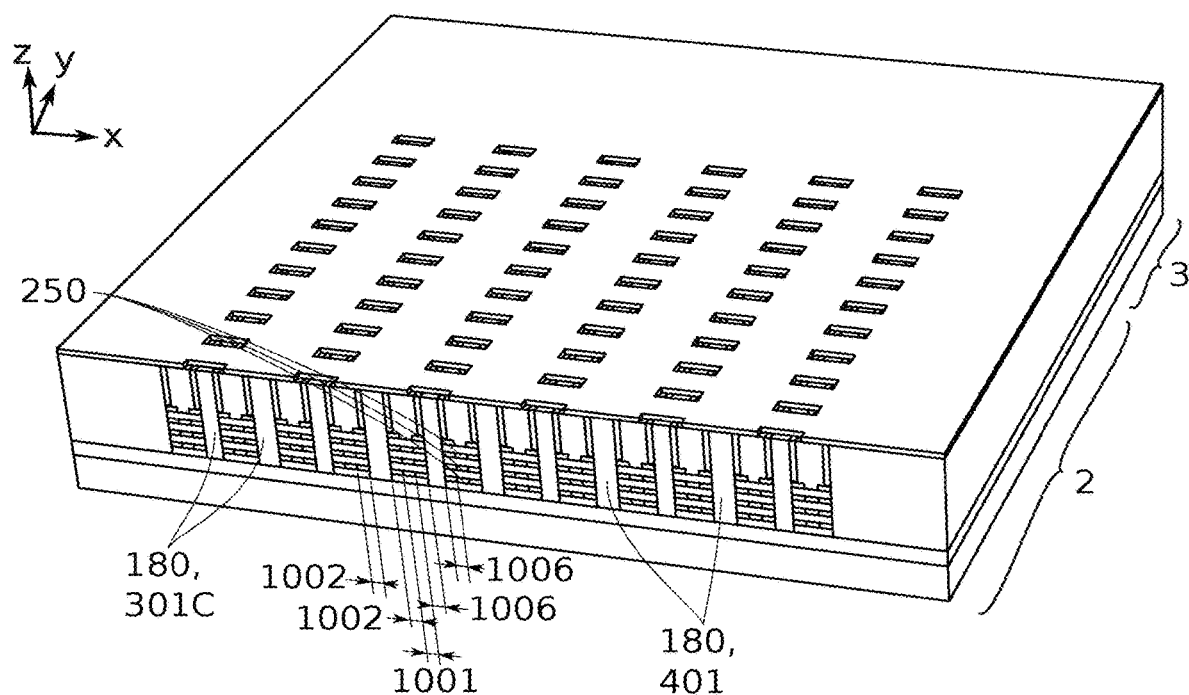
FIGS. 50 to 55 illustrate schematically steps of a method for manufacturing the zone of the data lines of a microelectronic system according to a second embodiment of the present invention.

FIG. 50 makes it possible to distinguish, in cross section alone XZ, the sources 1002 of the transistors, the channels 1001 surrounded by the all-around gates 250, and nanowire parts forming the drains 1006 of the transistors. The sources 1002 extend along Y into the sourceline zone 3. The drains 1006 extend along X as far as the zones of openings 301c filled with oxide 180.

Structuring of the Bitlines Zone

The following step consists of partly removing the oxide 180 from the zones of openings 301c, so as to access the drains 1006 of the transistors in the bitlines zone 2.

Figure 51:
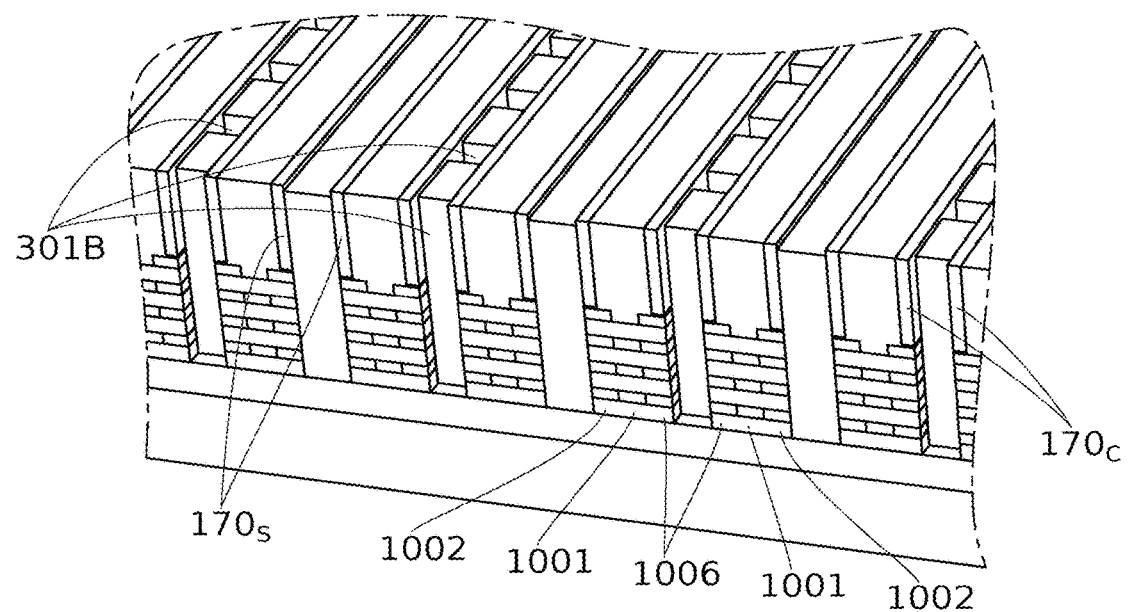

FIG. 50 illustrates a lithography step prior to the etching of the oxide 180 at the zones of openings 301c. The selective etching of the oxide 180 makes it possible to form openings 301B exposing one end of the Si drains 1006, as illustrated in FIG. 51.

Figure 52:
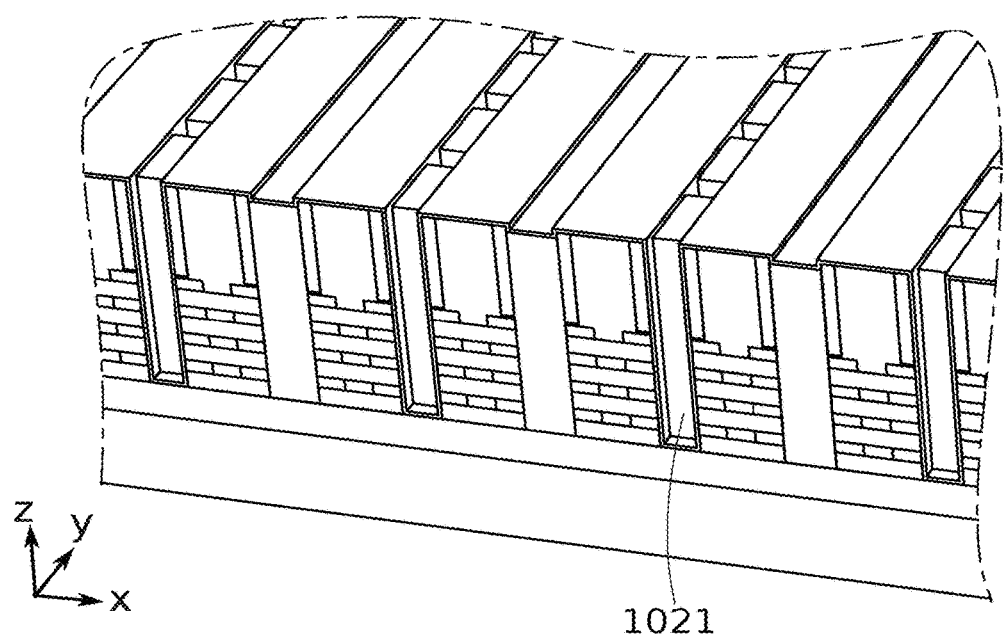
Figure 53:
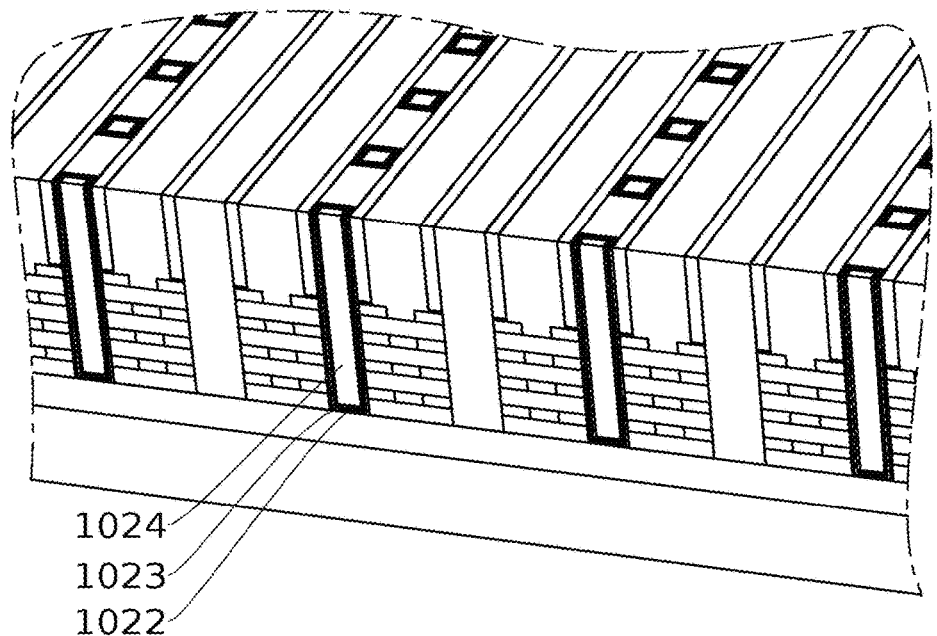

These openings 301B are filled by successive depositions so as to form the memory points, as illustrated in FIGS. 52 and 53. The memory points thus formed are directly in contact with the drains 1006 of the selection transistors. The drains 1006 may be silicided in advance. In the case of a resistive memory of the OxRAM type, these memory points may be based on $HfO_2$. For example, these memory points may be produced by deposition of an $HfO_2$ layer 1021 with a thickness of 5 nm, followed by a deposition of a layer of Ti 1022 with a thickness of 5 nm, followed by a deposition of a layer of TiN 1023 with a thickness greater than 5 nm, followed by a deposition of a layer of W 1024 with a thickness of 300 nm. The layer of W 1024 may typically extend outside the openings 301c. It is then flattened by CMP with stoppage on the oxide layer 180.

Figure 54:
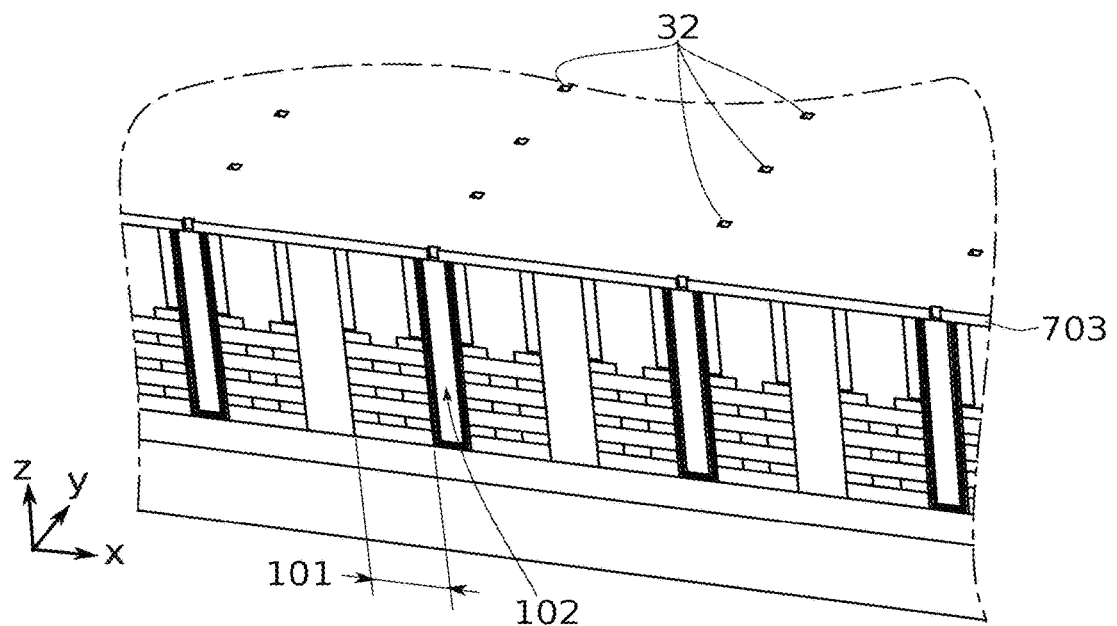
Figure 55:
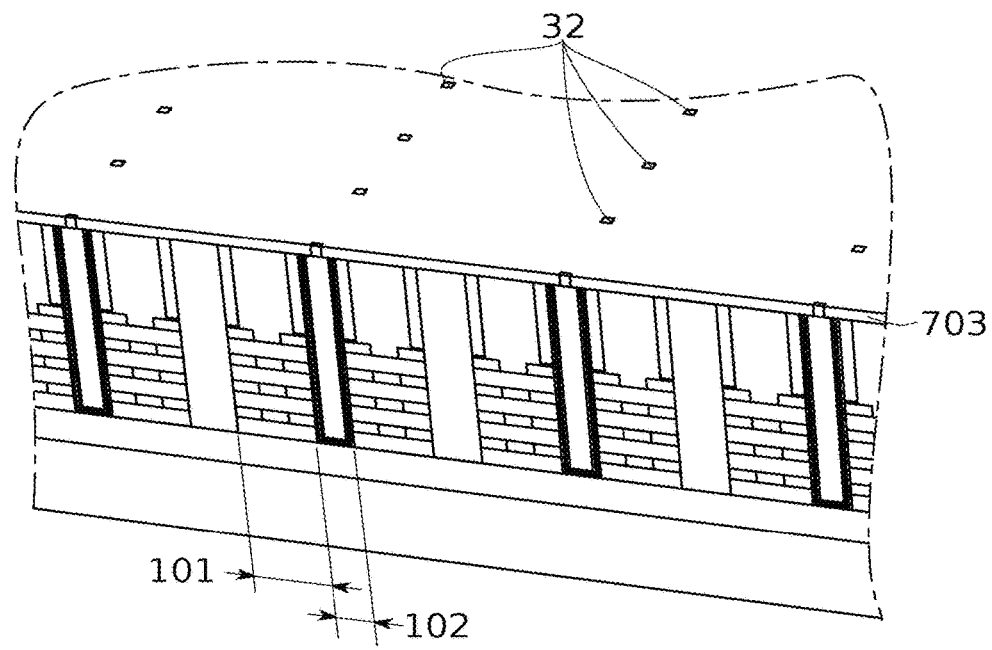

An oxide layer 703 is preferably deposited on the 3D matrix thus formed. The holes of contacts 32 are next formed by lithography/etching through the oxide layer 703, as illustrated in FIGS. 54 and 55. The contact holes 32 are dedicated to the connection of the bitlines with the memory points. The contact holes dedicated to connecting the wordlines with the gates of the selection transistors and the contact holes 33 dedicated to connecting the source lines with the sources of the selection transistors are also formed by lithography/etching through the oxide layers 703, 702.

Figure 56:
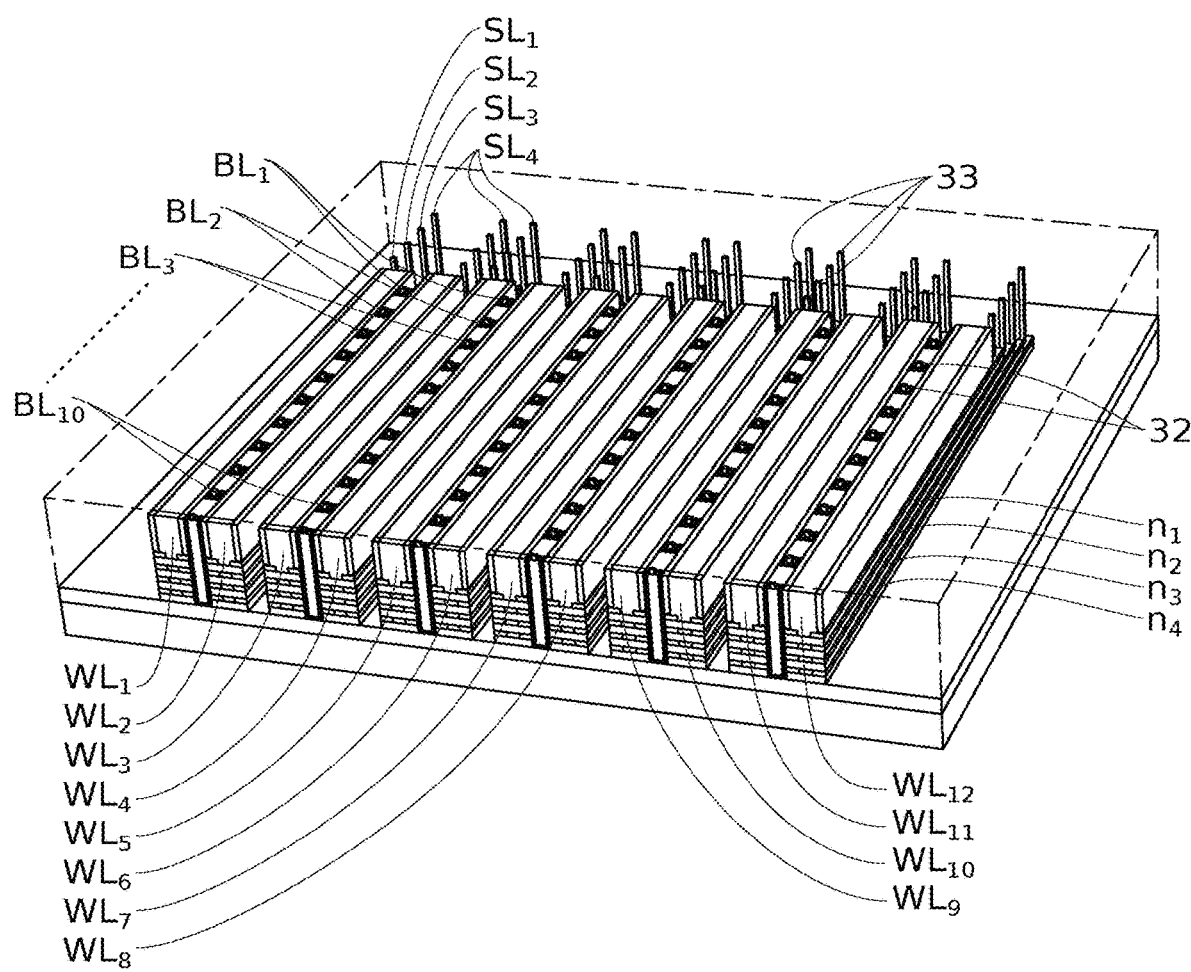
FIGS. 56 and 57 illustrate schematically a microelectronic system according to a second embodiment of the present invention, respectively in a cross section XZ and in a longitudinal section YZ.
Figure 57:
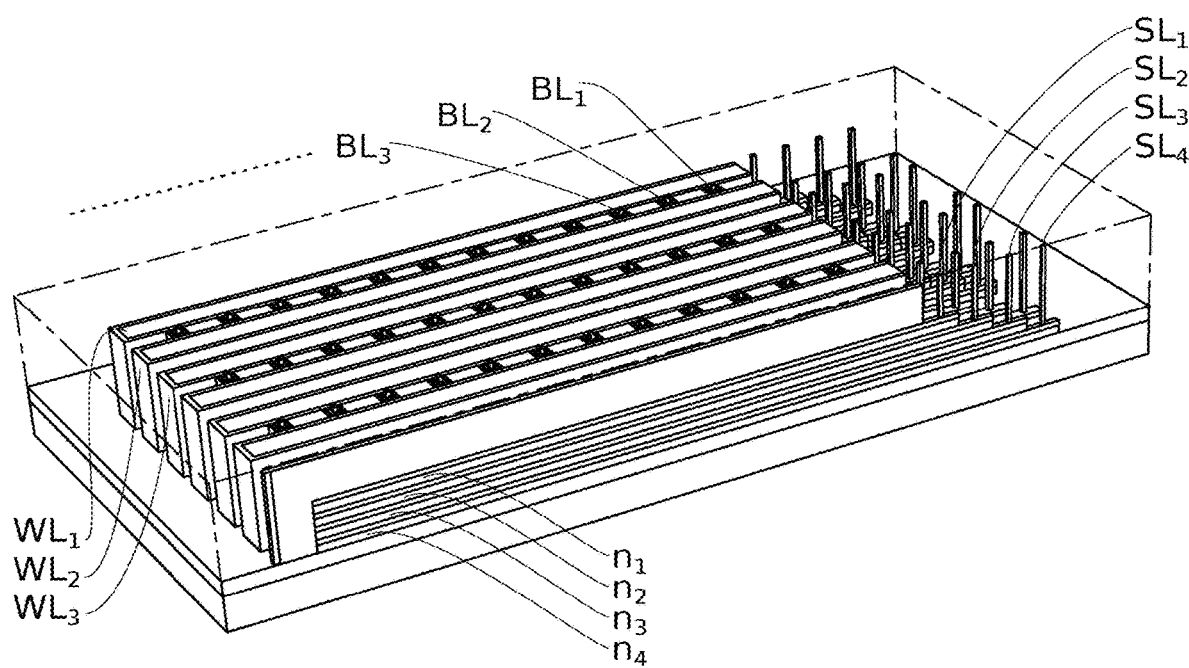

FIGS. 56 and 57 present a 3D resistive memory obtained by this second embodiment, respectively on a cross section along XZ and on a longitudinal section along YZ.

The sourceline contact lines SL1, SL2, SL3, SL4 independently connecting each of the levels n1, n2, n3, n4 of the matrix, the wordlines WL1, WL2, WL3, WL4, WL5, WL6, WL7, WL8, WL9, WL10, WL11, WL12 and the bitlines BL10, BL2, BL3, BL4, BL5, BL6, BL7, BL8, BL9, BL10 are visible in transparency in these FIGS. 56 and 57. The contacts 32, 33 are also illustrated in these FIGS. 56 and 57.

In general terms, the invention is not limited to the embodiments described but extends to any embodiment falling within the scope of claim 1. The invention advantageously makes it possible to form a resistive-memory 3D architecture comprising an improved density of memory cells.

The project giving rise to this application received financing from the European Research Council (ERC) in the context of the Horizon 2020 Research and Innovation Programme of the European Union (Grant Agreement No. 820048).

The invention claimed is:

1. A microelectronic device comprising at least two memory cells each comprising a selection transistor and a memory element associated with said selection transistor, each transistor comprising a channel in the form of a wire extending mainly in a first direction, a gate bordering said channel and extending longitudinally in a second direction, a first region corresponding to one from a source or a drain, and a second region corresponding to the other one from the source or the drain, the second region being connected to the memory element, said transistors being stacked mainly in a third direction and each occupying a level with a given altitude in the third direction, the microelectronic device wherein the first and second regions are entirely covered by spacers projecting in the third direction in a plane.

2. The device according to claim 1, wherein at least one of the selection transistors has an all-around gate, completely surrounding the channel of said selection transistor.

3. The device according to claim 1, wherein the memory element has variable resistivity, so as to form resistive memory cells, of the OxRAM type.

4. The device according to claim 1, wherein the gates of the transistors are electrically connected to each other and the first regions of the transistors are electrically insulated from each other.

5. The device according to claim 1, wherein the first regions of the transistors extend mainly in the second direction normal to the first direction.

6. A microelectronic system comprising a plurality of microelectronic devices according to claim 1, connected to each other, the transistors of two adjacent microelectronic devices having a first common region for the same level and being associated with two distinct memory elements, so as to form a 3D matrix of memory cells.

7. The system according to claim 6, wherein the gates of the transistors are electrically connected together in a wordlines zone, and wherein the first regions of the transistors of two different levels are electrically insulated from each other.

8. The system according to claim 7, wherein the first regions are sources, wherein the sources occupying various levels are connected in a ladder to contacts, independently of each other, in a sourcelines zone.

9. A method for manufacturing a microelectronic device comprising at least two memory cells each comprising a selection transistor and a memory element associated with said selection transistor, each transistor comprising a channel in the form of a wire extending longitudinally in a first direction, a gate bordering said channel and extending mainly in a second direction, a first region corresponding to one from a source or a drain and a second region corresponding to the other one from the source or the drain connected to the memory element, said transistors being stacked mainly in a third direction and each occupying a given altitude level in the third direction, the method comprising the following steps:
forming a stack, in the third direction, of alternating layers of a first semiconductor material and a second dielectric material,
forming, from this stack, openings defining transistor patterns each comprising a central part extending mainly in the first direction and first and second peripheral parts, extending on either side of the central part, said central part forming the channel of the transistor and said first and second peripheral parts forming respectively first and second regions of the transistor,
forming gate patterns partly in the openings, straddling the central parts of the transistor patterns and extending mainly in a second direction at the border of the first peripheral parts,
forming longitudinal spacers on either side of the gate patterns, said longitudinal spacers covering the first and second peripheral parts of the transistor patterns projecting in the third direction in a plane,
forming the memory elements so that each memory element has an edge in alignment in the third direction with an edge of a longitudinal spacer,
forming the gates of the transistors from the gate patterns.

10. The method according to claim 9 wherein forming the stack comprises the following steps:
forming a temporary stack by epitaxy in the third direction comprising at least two semiconductor layers of the first semiconductor material separated by at least one sacrificial layer made from a second semiconductor material,
after forming the gate patterns removing the at least one sacrificial layer from the openings,
filling with the second dielectric material a space left by removing the at least one sacrificial layer, so as to form at least one dielectric layer.

11. The method according to claim 10, wherein the first semiconductor material is silicon and the second semiconductor material is a silicon-germanium alloy.

12. The method according to claim 10, wherein forming the gates comprises the following steps:
- removing the gate patterns so as to entirely leave clear the channels formed in the central parts of the transistor patterns,
- depositing a gate dielectric material and then a gate metal material around said channels so as to form all-ground gates completely surrounding at least one channel among said channels.

13. The method according to claim 12, wherein the at least one dielectric layer comprises remaining portions of the at least one sacrificial layer at the central parts of the transistor patterns between the channels of the transistors and wherein these remaining portions are removed after removal of the gate patterns and before formation of the gates.

14. The method according to any one of claim 9, further comprising ladder etchings in a sourcelines zone, so as to reach the first regions of the various levels, and the formation of ladder contacts on the first regions of the various levels.

15. The method according to claim 9, wherein the formation of the memory elements at the second regions is guided by transverse spacers extending mainly in a plane normal to the main extension direction of the longitudinal spacers.

\* \* \* \* \*